(12) United States Patent
Shin et al.

(10) Patent No.: US 10,454,614 B2
(45) Date of Patent: Oct. 22, 2019

(54) TRANSMITTING/RECEIVING SYSTEM AND BROADCAST SIGNAL PROCESSING METHOD

(71) Applicant: LG Electronics Inc., Seoul (KR)

(72) Inventors: Pilsup Shin, Seoul (KR); Jeongwoo Kim, Seoul (KR); Minsung Kwak, Seoul (KR)

(73) Assignee: LG Electronics Inc., Seoul (KR)

( * ) Notice: Subject to any disclaimer, the term of this patent is extended or adjusted under 35 U.S.C. 154(b) by 175 days.

(21) Appl. No.: 15/719,396

(22) Filed: Sep. 28, 2017

(65) Prior Publication Data

US 2018/0115391 A1    Apr. 26, 2018

Related U.S. Application Data

(63) Continuation of application No. 14/005,765, filed as application No. PCT/KR2012/001960 on Mar. 19, 2012, now Pat. No. 9,806,851.
(Continued)

(51) Int. Cl.
*H04L 1/00*    (2006.01)
*H03M 13/27*   (2006.01)
(Continued)

(52) U.S. Cl.
CPC ...... *H04L 1/0041* (2013.01); *H03M 13/2721* (2013.01); *H03M 13/2915* (2013.01);
(Continued)

(58) Field of Classification Search
CPC ... H03M 13/6538; H04L 1/004; H04L 1/0041
See application file for complete search history.

(56) References Cited

U.S. PATENT DOCUMENTS 7,646,828 B2 *  1/2010  Song ............... H04L 27/0012
                                                    375/316
7,839,950 B2 * 11/2010  Choi .................... H04N 7/173
                                                    375/265
(Continued)

FOREIGN PATENT DOCUMENTS

KR   10-2009-0064293   6/2009
KR     1020100006134   1/2010
(Continued)

OTHER PUBLICATIONS

PCT International Application No. PCT/KR2012/001960, Written Opinion of the International Searching Authority dated Oct. 8, 2012, 14 pages.

*Primary Examiner* — Steve N Nguyen
(74) *Attorney, Agent, or Firm* — Lee, Hong, Degerman, Kang & Waimey

(57) ABSTRACT

The invention relates to a transmitting system, comprising an SNS client that receives SNS messages from at least one SNS server, and a transmitter which transmits a broadcast signal, including the SNS messages and mobile service data, for a mobile broadcast. The transmitter includes: an RS frame encoder, which performs RS encoding and CRC encoding on the mobile service data for the mobile broadcast so as to build RS frames, and divides each RS frame into a plurality of portions; a group-forming unit, which forms data groups that contain each of the plurality of portions, and which adds known data sequences and signaling data to each data group; an inter-leaver for interleaving data of the data groups; and a trellis encoding unit for trellis-encoding the interleaved data.

6 Claims, 45 Drawing Sheets

Related U.S. Application Data

(60) Provisional application No. 61/453,550, filed on Mar. 17, 2011, provisional application No. 61/453,549, filed on Mar. 17, 2011.

(51) Int. Cl.
| | |
|---|---|
| *H03M 13/29* | (2006.01) |
| *H03M 13/35* | (2006.01) |
| *H04N 19/70* | (2014.01) |
| *H04N 19/89* | (2014.01) |
| *H04N 21/2362* | (2011.01) |
| *H04N 21/2383* | (2011.01) |
| *H04N 21/434* | (2011.01) |
| *H04N 21/438* | (2011.01) |
| *H03M 13/09* | (2006.01) |
| *H03M 13/15* | (2006.01) |

(52) U.S. Cl.
CPC ..... *H03M 13/2936* (2013.01); *H03M 13/356* (2013.01); *H04N 19/70* (2014.11); *H04N 19/89* (2014.11); *H04N 21/2362* (2013.01); *H04N 21/2383* (2013.01); *H04N 21/4345* (2013.01); *H04N 21/4382* (2013.01); *H03M 13/09* (2013.01); *H03M 13/1515* (2013.01)

(56) References Cited

U.S. PATENT DOCUMENTS

| | | | | |
|---|---|---|---|---|
| 2002/0181599 | A1* | 12/2002 | Choi | H03M 13/253 375/240.27 |
| 2008/0313692 | A1* | 12/2008 | Yun | H04N 21/235 725/131 |
| 2009/0030985 | A1* | 1/2009 | Yuan | G06Q 10/10 709/204 |
| 2009/0052587 | A1* | 2/2009 | Song | H04L 27/0012 375/340 |
| 2009/0265751 | A1* | 10/2009 | Limberg | H04N 21/2381 725/118 |
| 2010/0017680 | A1* | 1/2010 | Choi | H03M 13/258 714/758 |
| 2014/0047297 | A1 | 2/2014 | Shin et al. | |

FOREIGN PATENT DOCUMENTS

| | | |
|---|---|---|
| KR | 10-2010-0035680 | 4/2010 |
| KR | 10-2011-0004182 | 1/2011 |

\* cited by examiner

FIG. 9

M/H Frame

| Sub-Frame #0 | Sub-Frame #1 | Sub-Frame #2 | Sub-Frame #3 | Sub-Frame #4 |
|---|---|---|---|---|

Group number (Group assignment order):
0 | 8 | 4 | 12 | 1 | 9 | 5 | 13 | 2 | 10 | 2 | 14 | 3 | 11 | 7 | 15

Slot number:
Slot #0 | Slot #1 | Slot #2 | Slot #3 | Slot #4 | Slot #5 | Slot #6 | Slot #7 | Slot #8 | Slot #9 | Slot #10 | Slot #11 | Slot #12 | Slot #13 | Slot #14 | Slot #15

FIG. 21
FIG. 21A
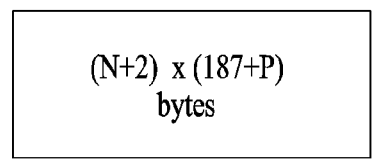
FIG. 21B
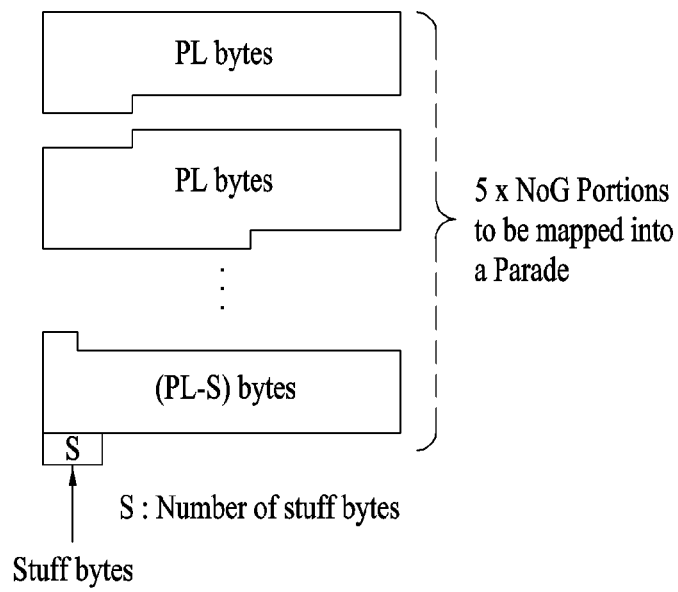

FIG. 24

| i | 0 | 1 | 2 | 3 | 4 | 5 | 6 | 7 | 8 | 9 | 10 | 11 | 12 | 13 | 14 | 15 | ... | 2110 | 2111 |
|---|---|---|---|---|---|---|---|---|---|---|----|----|----|----|----|----|-----|------|------|
| P(i) | 0 | 89 | 267 | 534 | 890 | 1335 | 1869 | 2492 | 3204 | 4005 | 799 | 1778 | 2846 | 4003 | 1153 | 2488 | ... | 2809 | 2272 |
| P(i) | 0 | 89 | 267 | 534 | 890 | 1335 | 1869 | 799 | 1778 | 1153 | 1329 | 526 | 79 | 2037 | 253 | 874 | ... | 444 | 2048 |

N : Normal mode, I : Initialization mode

FIG. 31

| Syntax | No. of bits | Format |
| --- | --- | --- |
| TPC_data { | | |
|   Sub-Frame_number | 3 | uimsbf |
|   Slot_number | 4 | uimsbf |
|   Parade_id | 7 | uimsbf |
|   starting_Group_number | 4 | uimsbf |
|   number_of_Groups | 3 | uimsbf |
|   Parade_repetition_cycle | 3 | uimsbf |
|   RS_Frame_mode | 2 | bslbf |
|   RS_code_mode_primary | 2 | bslbf |
|   RS_code_mode_secondary | 2 | bslbf |
|   SCCC_Block_mode | 2 | bslbf |
|   SCCC_outer_code_mode_A | 2 | bslbf |
|   SCCC_outer_code_mode_B | 2 | bslbf |
|   SCCC_outer_code_mode_C | 2 | bslbf |
|   SCCC_outer_code_mode_D | 2 | bslbf |
|   FIC_version | 5 | uimsbf |
|   Parade_continuity_counter | 4 | uimsbf |
|   TNoG | 5 | uimsbf |
|   reserved | 26 | bslbf |
| } | | |

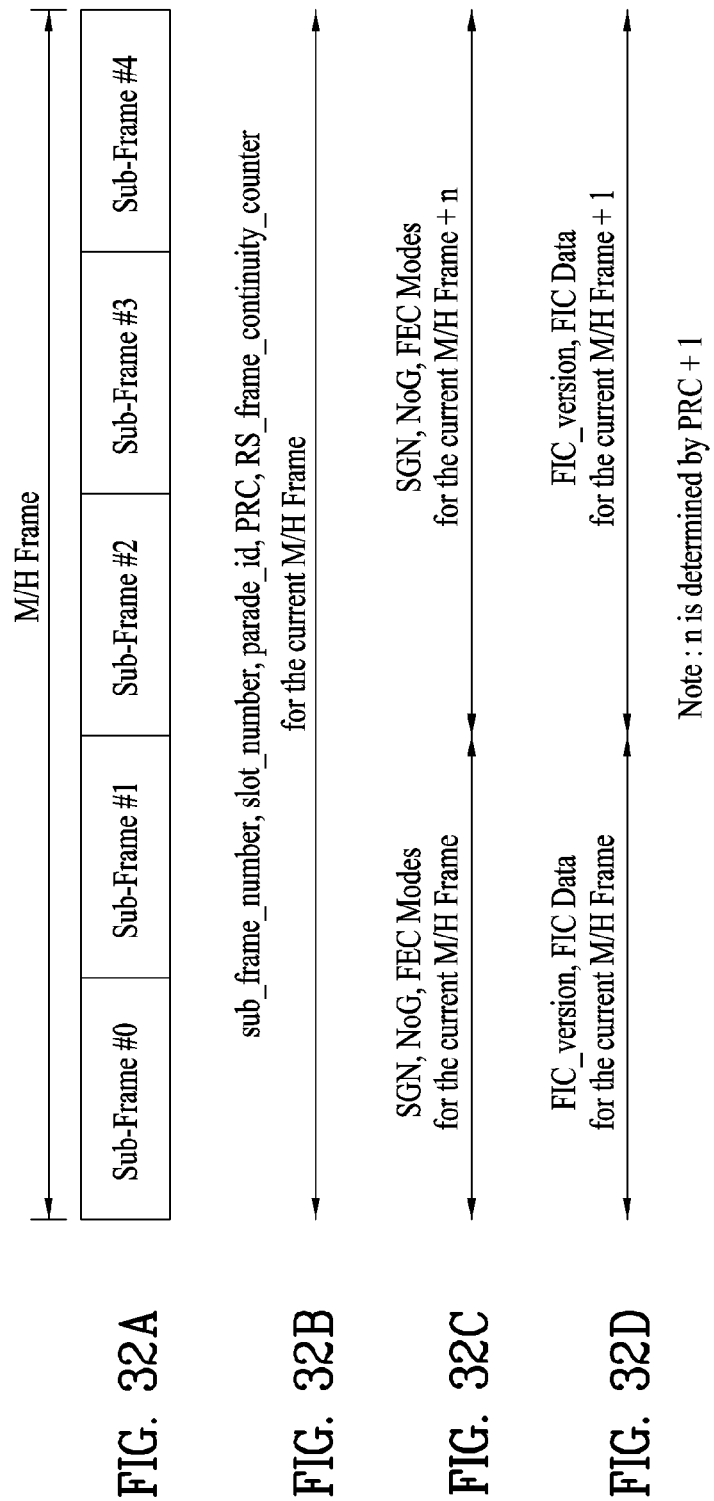

FIG. 33

| Syntax | No. of Bits |
|---|---|
| FIC_chunk() {<br>  FIC_chunk_header()<br>  FIC_chunk_payload()<br>} | <br>5*8<br>var |

FIG. 34

| Syntax | No. of Bits | Format |
|---|---|---|
| FIC_chunk_header() {<br>  FIC_major_protocol_version<br>  FIC_minor_protocol_version<br>  FIC_chunk_header_extension_length<br>  ensemble_loop_header_extension_length<br>  MH_service_loop_extension_length<br>  reserved<br>  current_next_indicator<br>  transport_stream_id<br>  num_ensembles<br>} | <br>2<br>3<br>3<br>3<br>3<br>1<br>1<br>16<br>8 | <br>uimsbf<br>uimsbf<br>uimsbf<br>uimsbf<br>uimsbf<br>'1'<br>bsblf<br>uimsbf<br>uimsbf |

FIG. 35

| Syntax | No. of Bits | Format |
|---|---|---|
| FIC_chunk_payload() { | | |
|    for (i=0; i<num_ensembles; i++) { | | |
|       ensemble_id | 8 | uimsbf |
|       reserved | 3 | '111' |
|       ensemble_protocol_version | 5 | uimsbf |
|       SLT_ensemble_indicator | 1 | bslbf |
|       GAT_ensemble_indicator | 1 | bslbf |
|       reserved | 1 | '1' |
|       MH_service_signaling_channel_version | 5 | uimsbf |
|       num_MH_services | 8 | uimsbf |
|       for(j=0;j<num_MH_services;j++){ | | |
|          MH_service_id | 16 | uimsbf |
|          reserved | 3 | '111' |
|          multi_ensemble_service | 2 | uimsbf |
|          MH_service_status | 2 | uimsbf |
|          SP_indicator | 1 | bslbf |
|       } | | |
|    } | | |
|    FIC_chunk_stuffing() | var | |
| } | | |

FIG. 36

| Syntax | No. of Bits | Format |
|---|---|---|
| FIC_segment_header() { | | |
|    FIC_segment_type | 2 | uimsbf |
|    reserved | 2 | '11' |
|    FIC_chunk_major_protocol_version | 2 | uimsbf |
|    current_next_indicator | 1 | bslbf |
|    error_indicator | 1 | bslbf |
|    FIC_segment_num | 4 | uimsbf |
|    FIC_last_segment_num | 4 | uimsbf |
| } | | |

FIG. 37

| Syntax | No. of Bits | Format |
|---|---|---|
| service_map_table_section() { | | |
|   table_id | 8 | 0xDB |
|   section_syntax_indicator | 1 | '0' |
|   private_indicator | 1 | '1' |
|   reserved | 2 | '11' |
|   section_length | 12 | uimsbf |
|   table_id_extension { | | |
|     SMT_protocol_version | 8 | uimsbf |
|     ensemble_id | 8 | uimsbf |
|   } | | |
|   reserved | 2 | '11' |
|   version_number | 5 | uimsbf |
|   current_next_indicator | 1 | bslbf |
|   section_number | 8 | uimsbf |
|   last_section_number | 8 | uimsbf |
|   num_MH_services | 8 | uimsbf |
|   for (i=0;i< num_MH_services; i++) { | | |
|     MH_service_id | 16 | uimsbf |
|     multi_ensemble_service | 2 | uimsbf |
|     MH_service_status | 2 | uimsbf |
|     SP_indicator | 1 | bslbf |
|     short_MH_service_name_length (*m*) | 3 | uimsbf |
|     short_MH_service_name | 16*m | |
|     reserved | 2 | '11' |
|     MH_service_category | 6 | uimsbf |
|     num_components | 5 | uimsbf |
|     IP_version_flag | 1 | bslbf |
|     service_source_IP_address_flag | 1 | bslbf |
|     service_destination_IP_address_flag | 1 | bslbf |
|     if (service_source_IP_address_flag) | | |
|       service_source_IP_address | 32 or 128 | uimsbf |
|     if (service_destination_IP_address_flag) | | |
|       service_destination_IP_address | 32 or 128 | uimsbf |
|     for (j=0;j< num_components; j++) | | |
|     { | | |
|       component_source_IP_address_flag | 1 | bslbf |
|       essential_component_indicator | 1 | bslbf |
|       component_destination_IP_address_flag | 1 | bslbf |
|       port_num_count | 5 | uimsbf |
|       component_destination_UDP_port_num | 16 | uimsbf |
|       if (component_source_IP_address_flag) | | |
|         component_source_IP_address | 32 or 128 | uimsbf |
|       if (component_destination_IP_address_flag) | | |
|         component_destination_IP_address | 32 or 128 | uimsbf |
|       reserved | 4 | '1111' |
|       num_component_level_descriptors | 4 | uimsbf |
|       for (k=0;k< num_components_level_descriptors; k++) | | |
|       { | | |
|         component_level_descriptor() | var | |
|       } | | |
|     } | | |
|     reserved | 4 | '1111' |
|     num_MH_service_level_descriptors | 4 | uimsbf |
|     for (m=0; m<num_MH_service_level_descriptors; m++) { | | |
|       MH_service_level_descriptor() | var | |
|     } | | |
|   } | | |
|   reserved | 4 | '1111' |
|   num_ensemble_level_descriptors | 4 | uimsbf |
|   for (n=0; n<num_ensemble_level_descriptors; n++) { | | |
|     ensemble_level_descriptor() | var | |
|   } | | |
| } | | |

FIG. 38

| Syntax | No. of Bits | Format |
|---|---|---|
| MH_component_descriptor() { | | |
|   descriptor_tag | 8 | 0 x CB |
|   descriptor_length | 8 | uimsbf |
|   component_type | 7 | uimsbf |
|   component_encryption_flag | 1 | |
|   if (component_encryption_flag == '1') { | | |
|     num_STKM_streams | 8 | uimsbf |
|     for (i=0; i<num_STKM_streams; i++) { | | |
|       STKM_stream_id | 8 | uimsbf |
|     } | | |
|   transport_parameters_text_length | 8 | |
|   transport_parameters_text() | var | |
|   MH_component_data(component_type) | var | |
|   } | | |
| } | | |

FIG. 39

| Syntax | No. of Bits | Format |
|---|---|---|
| FIC_chunk_payload() { | | |
|   for (i=0; i<num_ensembles; i++) { | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for(j=0;j<num_MH_services;j++){ | | |
|       MH_service_id | 16 | uimsbf |
|       multi_ensemble_service | 2 | uimsbf |
|       MH_service_status | 2 | uimsbf |
|       SP_indicator | 1 | bslbf |
|       ES_indicator | 1 | bslbf |
|       ES_type | 2 | uimsbf |
|     } | | |
|   } | | |
|   FIC_chunk_stuffing() | var | |
| } | | |

| Syntax | No. of Bits | Format |
|---|---|---|
| Enhancement_service_descriptor() { | | |
| descriptor_tag | 8 | "0xXX" |
| descriptor_length | 8 | uimsbf |
| reserved | 4 | '1111' |
| ES_type | 4 | uimsbf |
| } | | |

FIG. 42

| Syntax | No.of Bits | Format |
|---|---|---|
| service_map_table_section() { | | |
|   table_id | 8 | 0xDB |
|   section_syntax_indicator | 1 | '0' |
|   private_indicator | 1 | '1' |
|   reserved | 2 | '11' |
|   section_length | 12 | uimsbf |
|   table_id_extension { | | |
|     SMT_protocol_version | 8 | uimsbf |
|     ensemble_id | 8 | uimsbf |
|   } | | |
|   reserved | 2 | '11' |
|   version_number | 5 | uimsbf |
|   current_next_indicator | 1 | bslbf |
|   section_number | 8 | uimsbf |
|   last_section_number | 8 | uimsbf |
|   num_MH_services | 8 | uimsbf |
|   for (i=0;i< num_MH_services; i++) { | | |
|     MH_service_id | 16 | uimsbf |
|     multi_ensemble_service | 2 | uimsbf |
|     MH_service_status | 2 | uimsbf |
|     SP_indicator | 1 | bslbf |
|     short_MH_service_name_length /*m*/ | 3 | uimsbf |
|     short_MH_service_name | 16*m | |
|     ES_type | 2 | uimsbf |
|     MH_service_category | 6 | uimsbf |
|     num_components | 5 | uimsbf |
|     IP_version_flag | 1 | bslbf |
|     service_source_IP_address_flag | 1 | bslbf |
|     service_destination_IP_address_flag | 1 | bslbf |
|     if (service_source_IP_address_flag) | | |
|       service_source_IP_address | 32 or 128 | uimsbf |
|     if (service_destination_IP_address_flag) | | |
|       service_destination_IP_address | 32 or 128 | uimsbf |
|     for (j=0;j< num_components; j++) | | |
|     { | | |
|       component_source_IP_address_flag | 1 | bslbf |
|       essential_component_indicator | 1 | bslbf |
|       component_destination_IP_address_flag | 1 | bslbf |
|       port_num_count | 5 | uimsbf |
|       component_destination_UDP_port_num | 16 | uimsbf |
|       if (component_source_IP_address_flag) | | |
|         component_source_IP_address | 32 or 128 | uimsbf |
|       if (component_destination_IP_address_flag) | | |
|         component_destination_IP_address | 32 or 128 | uimsbf |
|       reserved | 4 | '1111' |
|       num_component_level_descriptors | 4 | uimsbf |
|       for (k=0;k< num_components_level_descriptors; k++) | | |
|       { | | |
|         component_level_descriptor() | var | |
|       } | | |
|     } | | |
|     reserved | 4 | '1111' |
|     num_MH_service_level_descriptors | 4 | uimsbf |
|     for (m=0; m<num_MH_service_level_descriptors; m++) | | |
|     { | | |
|       MH_service_level_descriptor() | var | |
|     } | | |
|   } | | |
|   reserved | 4 | '1111' |
|   num_ensemble_level_descriptors | 4 | uimsbf |
|   for (n=0; n<num_ensemble_level_descriptors; n++) { | | |
|     ensemble_level_descriptor() | var | |
|   } | | |
| } | | |

FIG. 45

| | | |
|---|---|---|
| SNS Message | CreationTime | 4 x 8bit |
| | MessageID | 64bit |
| | reserved | 5bit ('11111') |
| | UserDetailPresentFlag | 1bit |
| | UploadImageExistFlag | 1bit |
| | MessageTextExtensionFlag | 1bit |
| | MessageTextLength | 8bit |
| | MessageText() | MessageTextLength x 8bit |
| Upload Image | if(UploadImageExistFlag == 1) { | |
| | UploadImageLength | 24bit |
| | UploadImageData() | UploadImageLength x 8bit |
| | } | |
| MessageText Extension | if(MessageTextExtensionFlag == 1) { | |
| | MessageTextExtensionLength | 16bit |
| | MessageTextExtension() | MessageTextExtensionLength x 8bit |
| | } | |
| | UserNameLength | 4bit |
| | UserNickNameLength | 4bit |
| | UserName() | UserNameLength x 8bit |
| | UserNickName() | UserNickNameLength x 8bit |
| UserDetail | if(UserDetailPresentFlag == 1) { | |
| | UserID | 64bit |
| | UserLocation | 3 x 8bit |
| | UserDescriptionLength | 8bit |
| | UserDescription() | UserDescriptionLength x 8bit |
| | UserProfileImageURLLength | 8bit |
| | UserProfileImageURL() | UserProfileImageURLLength x 8bit |
| | UserProfileImageLength | 24bit |
| | UserProfileImageData() | UserProfileImageLength x 8bit |
| | UserURLLength | 8bit |
| | UserURL() | UserURLLength x 8bit |
| | IsProtected | 1bit |
| | UtcOffset | 15bit |
| | TimeZoneLength | 8bit |
| | TimeZone() | TimeZoneLength x 8bit |
| | LanguageCode | 3 x 8bit |
| | } | |

FIG. 46

| Syntax | No.of Bits | Format |
|---|---|---|
| MH_component_data() { | | |
|   reserved | 1 | '1' |
|   content_type_flag | 1 | bslbf |
|   SNS_type | 6 | uimsbf |
|   update_duration | 8 | uimsbf |
|   if(content_type_flag) | | |
|   { | | |
|     num_SNS_message | 8 | uimsbf |
|     for(i=0;i<num_SNS_message;i++) | | |
|     { | | |
|       CreationTime | 32 | uimsbf |
|       MessageID | 64 | uimsbf |
|       reserved | 5 | '11111' |
|       UserDetailPresentFlag | 1 | bslbf |
|       MessageTextExtensionFlag | 1 | bslbf |
|       UploadImageExistFlag | 1 | bslbf |
|       MessageTextLength | 8 | uimsbf |
|       MessageText() | var | |
|       if(UploadImageExistFlag) | | |
|       { | | |
|         UploadImageLength | 24 | |
|         UploadImageData() | var | |
|       } | | |
|       if(MessageTextExtensionFlag) | | |
|       { | | |
|         MessageTextExtensionLength | 16bit | uimsbf |
|         MessageTextExtension() | var | |
|       } | | |
|       UserNameLength | 4 | uimsbf |
|       UserNickNameLength | 4 | uimsbf |
|       if (UserNameLength > 0) | | |
|         UserName() | var | |
|       if (UserNickNameLength > 0) | | |
|         UserNickName() | var | |
|       if (UserDetailPresentFlag) | | |
|       { | | |
|         UserID | 64 | uimsbf |
|         UserLocation | 24 | |
|         UserDescriptionLength | 8 | uimsbf |
|         UserDescription() | var | |
|         UserProfileImageURLLength | 8 | uimsbf |
|         UserProfileImageURL() | var | |
|         UserProfileImageLength | 24 | uimsbf |
|         UserProfileImageData() | var | |
|         UserURLLength | 8 | uimsbf |
|         UserURL() | var | |
|         IsProtected | 1 | bslbf |
|         UtcOffset | 15 | imsbf |
|         TimeZoneLength | 8 | uimsbf |
|         TimeZone() | var | |
|         LanguageCode | 24 | |
|       } | | |
|     } | | |
|   } | | |
| } | | |

FIG. 47

| Syntax | No.of Bits | Format |
|---|---|---|
| MH_component_data() { | | |
|   content_type_flag | 1 | bslbf |
|   if(content_type_flag) | | |
|   { | | |
|     num_SNS_message | 8 | uimsbf |
|     for(i=0;i<num_SNS_message;i++) | | |
|     { | | |
|       CreationTime | 32 | uimsbf |
|       MessageID | 64 | uimsbf |
|       reserved | 5 | '11111' |
|       UserDetailPresentFlag | 1 | bslbf |
|       MessageTextExtensionFlag | 1 | bslbf |
|       UploadImageExistFlag | 1 | bslbf |
|       MessageTextLength | 8 | uimsbf |
|       MessageText() | var | |
|       if(UploadImageExistFlag) | | |
|       { | | |
|         UploadImageLength | 24 | |
|         UploadImageData() | var | |
|       } | | |
|       if(MessageTextExtensionFlag) | | |
|       { | | |
|         MessageTextExtensionLength | 16bit | uimsbf |
|         MessageTextExtension() | var | |
|       } | | |
|       UserNameLength | 4 | uimsbf |
|       UserNickNameLength | 4 | uimsbf |
|       if (UserNameLength > 0) | | |
|         UserName() | var | |
|       if (UserNickNameLength > 0) | | |
|         UserNickName() | var | |
|       if (UserDetailPresentFlag) | | |
|       { | | |
|         UserID | 64 | uimsbf |
|         UserLocation | 24 | |
|         UserDescriptionLength | 8 | uimsbf |
|         UserDescription() | var | |
|         UserProfileImageURLLength | 8 | uimsbf |
|         UserProfileImageURL() | var | |
|         UserProfileImageLength | 24 | uimsbf |
|         UserProfileImageData() | var | |
|         UserURLLength | 8 | uimsbf |
|         UserURL() | var | |
|         IsProtected | 1 | bslbf |
|         UtcOffset | 15 | imsbf |
|         TimeZoneLength | 8 | uimsbf |
|         TimeZone() | var | |
|         LanguageCode | 24 | |
|       } | | |
|     } | | |
|   } | | |
| } | | |

FIG. 48

| | | | |
|---|---|---|---|
| Count | | num_SNS_message | 8bit |
| SNS Message | | CreationTime | 4 x 8bit |
| | | MessageID | 64bit |
| | | reserved | 5bit ('11111') |
| | | UserDetailPresentFlag | 1bit |
| | | UploadImageExistFlag | 1bit |
| | | MessageTextExtensionFlag | 1bit |
| | | MessageTextLength | 8bit |
| | | MessageText() | MessageTextLength x 8bit |
| | Upload Image | if(UploadImageExistFlag == 1) { | |
| | |    UploadImageLength | 24bit |
| | |    UploadImageData() | UploadImageLength x 8bit |
| | | } | |
| | MessageText Extension | if(MessageTextExtensionFlag == 1) { | |
| | |    MessageTextExtensionLength | 16bit |
| | |    MessageTextExtension() | MessageTextExtensionLength x 8bit |
| | | } | |
| | | UserNameLength | 4bit |
| | | UserNickNameLength | 4bit |
| | | UserName() | UserNameLength x 8bit |
| | | UserNickName() | UserNickNameLength x 8bit |
| | UserDetail | if(UserDetailPresentFlag == 1) { | |
| | |    UserID | 64bit |
| | |    UserLocation | 3 x 8bit |
| | |    UserDescriptionLength | 8bit |
| | |    UserDescription() | UserDescriptionLength x 8bit |
| | |    UserProfileImageURLLength | 8bit |
| | |    UserProfileImageURL() | UserProfileImageURLLength x 8bit |
| | |    UserProfileImageLength | 24bit |
| | |    UserProfileImageData() | UserProfileImageLength x 8bit |
| | |    UserURLLength | 8bit |
| | |    UserURL() | UserURLLength x 8bit |
| | |    IsProtected | 1bit |
| | |    UtcOffset | 15bit |
| | |    TimeZoneLength | 8bit |
| | |    TimeZone() | TimeZoneLength x 8bit |
| | |    LanguageCode | 3 x 8bit |
| | | } | |

FIG. 49

| Syntax | No.of Bits | Format |
|---|---|---|
| MH_component_data( ) { | | |
| reserved | 2 | '11' |
| Content_type_flag | 1 | bslbf |
| SNS_type | 6 | uimsbf |
| update_duration | 8 | uimsbf |
| } | | |

FIG. 50

| Service | Service_category | Service Level Descriptor | Component |
|---|---|---|---|
| Fox_sports | TV | MH_SNS_Message_descriptor | Audio Component |
| | | | Video Component |
| Fox_animation | TV | MH_SNS_Message_descriptor | Audio Component |
| | | | Video Component |

FIG. 51

| Syntax | No.of Bits | Format |
|---|---|---|
| MH_SNS_Message_descriptor() { | | |
|   descriptor_tag | 8 | uimsbf |
|   descriptor_Length | 8 | uimsbf |
|   reserved | 2 | '11' |
|   SNS_type | 6 | uimsbf |
|   update_duration | 8 | uimsbf |
|   num_SNS_message | 8 | uimsbf |
|   for(i=0;i<num_SNS_message;i++) | | |
|   { | | |
|     CreationTime | 32 | uimsbf |
|     MessageID | 64 | uimsbf |
|     reserved | 5 | '11111' |
|     UserDetailPresentFlag | 1 | bslbf |
|     MessageTextExtensionFlag | 1 | bslbf |
|     UploadImageExistFlag | 1 | bslbf |
|     MessageTextLength | 8 | uimsbf |
|     MessageText() | var | |
|     if(UploadImageExistFlag) | | |
|     { | | |
|       UploadImageLength | 24 | |
|       UploadImageData() | var | |
|     } | | |
|     if(MessageTextExtensionFlag) | | |
|     { | | |
|       MessageTextExtensionLength | 16bit | uimsbf |
|       MessageTextExtension() | var | |
|     } | | |
|     UserNameLength | 4 | uimsbf |
|     UserNickNameLength | 4 | uimsbf |
|     if (UserNameLength > 0) | | |
|       UserName() | var | |
|     if (UserNickNameLength > 0) | | |
|       UserNickName() | var | |
|     if (UserDetailPresentFlag) | | |
|     { | | |
|       UserID | 64 | uimsbf |
|       UserLocation | 24 | |
|       UserDescriptionLength | 8 | uimsbf |
|       UserDescription() | var | |
|       UserProfileImageURLLength | 8 | uimsbf |
|       UserProfileImageURL() | var | |
|       UserProfileImageLength | 24 | uimsbf |
|       UserProfileImageData() | var | |
|       UserURLLength | 8 | uimsbf |
|       UserURL() | var | |
|       IsProtected | 1 | bslbf |
|       UtcOffset | 15 | imsbf |
|       TimeZoneLength | 8 | uimsbf |
|       TimeZone() | var | |
|       LanguageCode | 24 | |
|     } | | |
|   } | | |
| } | | |

FIG. 52

| Service | Service_category | Service Level Descriptor | Component |
|---|---|---|---|
| Fox_sports | TV | MH_SNS_associated_descriptor | Audio Component |
| | | | Video Component |
| Fox_animation | TV | MH_SNS_associated_descriptor | Audio Component |
| | | | Video Component |
| Fox_SNS | SNS | MH_SNS_Message_descriptor or SNS Component | |

FIG. 53

| Syntax | No.of Bits | Format |
|---|---|---|
| MH_SNS_associated_descriptor() { | | |
|   descriptor_tag | 8 | 0xTBD |
|   descriptor_length | 8 | uimsbf |
|   num_SNS_associated_services | 8 | uimsbf |
|   for(i=0; i<num_SNS_associated_services;i++) | | |
|   { | | |
|     SNS_associated_services | 16 | uimsbf |
|   } | | |
| } | | |

FIG. 54

| Service | Service_category | Service Level Descriptor | Component |
|---|---|---|---|
| Fox_sports | TV | MH_SNS_associated_descriptor (Fox_SNS_sports) | Audio Component |
| | | | Video Component |
| Fox_animation | TV | | Audio Component |
| | | | Video Component |
| Fox_society | TV | MH_SNS_associated_descriptor (Fox_SNS_politics, Fox_SNS_economics) | Audio Component |
| | | | Video Component |
| Fox_SNS_sports | SNS | | |
| Fox_SNS_politics | SNS | | |
| Fox_SNS_economics | SNS | | |

TRANSMITTING/RECEIVING SYSTEM AND BROADCAST SIGNAL PROCESSING METHOD

CROSS-REFERENCE TO RELATED APPLICATIONS

This application is a continuation of U.S. patent application Ser. No. 14/005,765, filed on Oct. 23, 2013, which is the National Stage filing under 35 U.S.C. 371 of International Application No. PCT/KR2012/001960, filed on Mar. 19, 2012, which claims the benefit of U.S. Provisional Application No. 61/453,550, filed on Mar. 17, 2011, and 61/453,549, filed on Mar. 17, 2011, the contents of which are all hereby incorporated by reference herein in their entirety.

TECHNICAL FIELD

The present invention relates to a digital broadcasting system for transmitting and receiving digital broadcast signal, and more particularly, to a transmitting system for processing and transmitting digital broadcast signal, and a receiving system for receiving and processing digital broadcast signal and, a method of processing digital broadcast signal in the transmitting system and the receiving system.

BACKGROUND ART

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

DISCLOSURE

Technical Problem

An object of the present invention is to provide a transmitting system and a receiving system and a method of processing broadcast signal that are highly resistant to channel changes and noise.

Another object of the present invention is to provide a transmitting system and a receiving system and a method of processing broadcast signal that can enhance the receiving performance of the receiving system by performing additional encoding on mobile service data and by transmitting the processed data to the receiving system.

A further object of the present invention is to provide a transmitting system and a receiving system and a method of processing broadcast signal that can also enhance the receiving performance of the receiving system by inserting known data already known in accordance with a pre-agreement between the receiving system and the transmitting system in a predetermined region within a data region.

Yet another object of the present invention is to provide a transmitting system, a receiving system, and a method of processing a broadcast signal that may allow the transmitting system to signal and transmit information identifying an enhancement service, and that may then allow the receiving system to use the transmitted information so as to support to the enhancement service.

A further object of the present invention is to provide a transmitting system, a receiving system, and a method of processing a broadcast signal that can allow the receiving system, which may receive mobile broadcasting, to service Social Networking Service (hereinafter referred to as SNS) messages, by transmitting SNS messages using a mobile broadcast network.

Technical Solution

In order to achieve the technical objects of the present invention, a transmitting system according to an embodiment of the present invention includes an SNS client for being provided with an SNS message from at least one SNS (Social Networking Service) server, and a transmitter for transmitting a broadcast signal through a broadcasting network, the broadcast signal including the SNS message and mobile service data for mobile broadcasting. The transmitter includes an RS frame encoder for performing RS (Reed-Solomon) encoding and CRC (Cyclic Redundancy Check) encoding on the mobile service data for mobile broadcasting, building RS frames, and dividing each RS frame into multiple portions, a group formatter for forming data groups including each of the multiple portions and adding known data sequences and signaling data to each data group, an interleaver for interleaving data of the data groups, and a trellis encoding unit for trellis-encoding the interleaved data. Herein, the RS frames belong to an ensemble, and the ensemble includes a signaling table signaling access information of the mobile service data.

The SNS message may be included and transmitted in at least one of a service level descriptor and a component level descriptor of the signaling table.

The SNS message may be configured as an IP datagram, thereby being included and transmitted in at least one of the RS frames.

The signaling table may include access information of an IP datagram including the SNS message.

If the SNS message has been provided from an SNS server of multiple SNSs, the signaling table may further include type information identifying each SNS.

The signaling data includes one FIC (Fast Information Channel) segment and TPC (Transmission Parameter Channel) data, the TPC data including information related to each RS frame and information related to each data group. At this point, one FIC chunk is divided into multiple FIC segment payloads, and the FIC segment is configured of one of the multiple FIC segment payloads and an FIC segment header.

At least one of the signaling table and the FIC chunk may further include enhancement service identification information for identifying an enhancement service, wherein the enhancement service may be differentiated from a normal service serviced by the mobile service data. According to the embodiment of the present invention, the SNS is included in the enhancement service.

A method for processing a broadcast signal according to an embodiment of the present invention includes the steps of being provided with an SNS message from at least one SNS server, and transmitting a broadcast signal through a broadcasting network, the broadcast signal including the SNS message and mobile service data for mobile broadcasting, and the step of transmitting a broadcast signal includes performing RS encoding and CRC encoding on the mobile service data for mobile broadcasting, building RS frames, and dividing each RS frame into multiple portions, forming data groups including each of the multiple portions and adding known data sequences and signaling data to each data group, interleaving data of the data groups, and trellis-encoding the interleaved data. The RS frames belong to an ensemble, and the ensemble includes a signaling table signaling access information of the mobile service data.

It is to be understood that both the foregoing general description and the following detailed description of the present invention are exemplary and explanatory and are intended to provide further explanation of the invention as claimed.

Advantageous Effects

As described above, the transmitting system and the receiving system and the broadcast signal processing method of the same according to the present invention have the following advantages. When transmitting mobile service data through a channel, the present invention may be robust against errors and backward compatible with the conventional digital broadcast receiving system.

Moreover, the present invention may also receive the mobile service data without any error even in channels having severe ghost effect and noise.

Furthermore, by inserting known data in a particular position (or place) within a data region and transmitting the processed data, the receiving performance of the receiving system may be enhanced even in a channel environment that is liable to frequent changes.

In addition, by signaling and transmitting information for identifying an enhancement service by a transmitting system, a receiving system can recognize the enhancement service and can provide the enhancement service to a user.

Also, the present invention transmits an SNS message posted by a viewer using mobile broadcast network so that a receiving system, which can receive a mobile broadcast, can view the mobile broadcast and check an SNS message posted on an SNS website associated with the mobile broadcast at the same time.

Finally, the present invention is even more effective when applied to mobile and portable receivers, which are also liable to a frequent change in channel and which require protection (or resistance) against intense noise.

DESCRIPTION OF DRAWINGS

FIG. 9 illustrates an exemplary assignment order of data groups being assigned to one of 5 sub-frames according to the present invention;

FIG. 21A and FIG. 21B illustrate an exemplary process of dividing an RS frame for configuring a data group according to the present invention;

FIG. 24 illustrates a symbol interleaver of the block processor;

FIG. 31 illustrates an example of a syntax structure of TPC data according to the present invention;

FIG. 32A to FIG. 32D illustrate an example of a transmission scenario of the TPC data and the FIC data level according to the present invention;

FIG. 33 illustrates a syntax structure of an FIC chunk according to an embodiment of the present invention;

FIG. 34 illustrates a syntax structure of an FIC chunk header according to an embodiment of the present invention;

FIG. 35 illustrates a syntax structure of an FIC chunk payload according to an embodiment of the present invention;

FIG. 36 illustrates a syntax structure of an FIC segment header according to an embodiment of the present invention;

FIG. 37 illustrates a syntax structure of a service map table (SMT) according to an embodiment of the present invention;

FIG. 38 illustrates a bitstream syntax structure of component_descriptor( ) according to an embodiment of the present invention;

FIG. 39 illustrates a bitstream syntax structure of component_data( ) providing data for FLUTE file delivery according to an embodiment of the present invention;

FIG. 42 illustrates a syntax structure of a service map table (SMT) according to another exemplary embodiment of the present invention;

FIG. 45 illustrates a bit stream syntax structure of an SNS message according to an exemplary embodiment of the present invention;

FIG. 46 illustrates a bit stream syntax structure of MH_component_data( ) according to an exemplary embodiment of the present invention, when an SNS message subsidiary (or subordinate) to a mobile broadcast service according to the present invention is included in a component level descriptor and then transmitted;

FIG. 47 illustrates a bit stream syntax structure of MH_component_data( ) according to another exemplary embodiment of the present invention, when an SNS message subsidiary (or subordinate) to a mobile broadcast service according to the present invention is included in a component level descriptor and then transmitted;

FIG. 48 illustrates a bit stream syntax structure of an SNS message according to an exemplary embodiment of the present invention, the SNS message being included in the payload of an IP packet, when the SNS message according to the present invention is transmitted in an IP datagram format;

FIG. 49 illustrates a bit stream syntax structure of MH_component_data( ) according to an exemplary embodiment of the present invention, when an SNS message according to the present invention is transmitted in an IP datagram format;

FIG. 50 illustrates an example of transmitting an SNS message subsidiary to a mobile broadcast service at a service level according to an exemplary embodiment of the present invention;

FIG. 51 illustrates a bit stream syntax structure of MS_SNS_Message_descriptor( ) according to an exemplary embodiment of the present invention;

FIG. 52 illustrates a table for transmitting an SNS message independent from a mobile broadcast service through a mobile broadcast network according to an exemplary embodiment of the present invention;

FIG. 53 illustrates a bit stream syntax structure of MS_SNS_associated_descriptor( ) according to an exemplary embodiment of the present invention;

FIG. 54 illustrates a table for transmitting an SNS message independent from a mobile broadcast service through a mobile broadcast network according to another exemplary embodiment of the present invention;

BEST MODE

Figure 1:
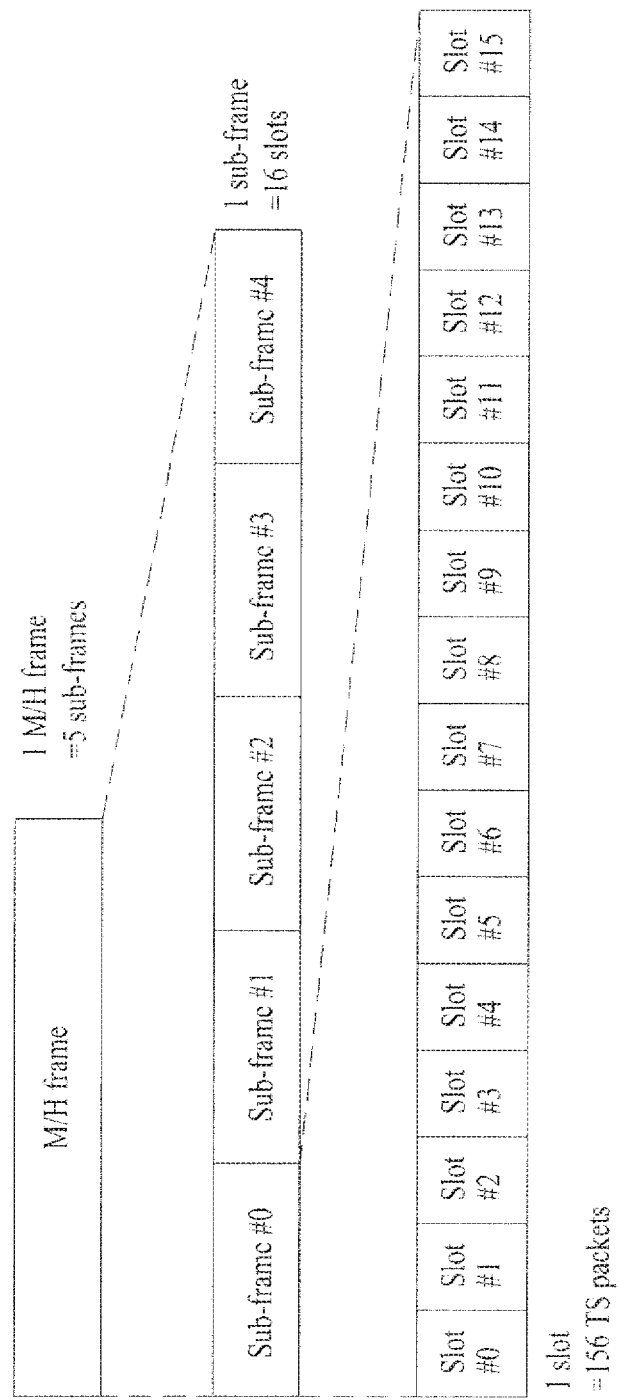
FIG. 1 illustrates a structure of a M/H frame for transmitting and receiving mobile service data according to the present invention.

Reference will now be made in detail to the preferred embodiments of the present invention, examples of which are illustrated in the accompanying drawings. Wherever possible, the same reference numbers will be used throughout the drawings to refer to the same or like parts.

Definition of Terms Used in the Present Invention

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

M/H Frame Structure

In the embodiment of the present invention, the mobile service data are first multiplexed with main service data in M/H frame units and, then, modulated in a VSB mode and transmitted to the receiving system.

At this point, one M/H frame configures of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

FIG. 1 illustrates a structure of an M/H frame for transmitting and receiving mobile service data according to the present invention. In the example shown in FIG. 1, one M/H frame consists of 5 sub-frames, wherein each sub-frame includes 16 slots. In this case, the M/H frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment.

At this point, two VSB fields are grouped to form a VSB frame.

Figure 2:
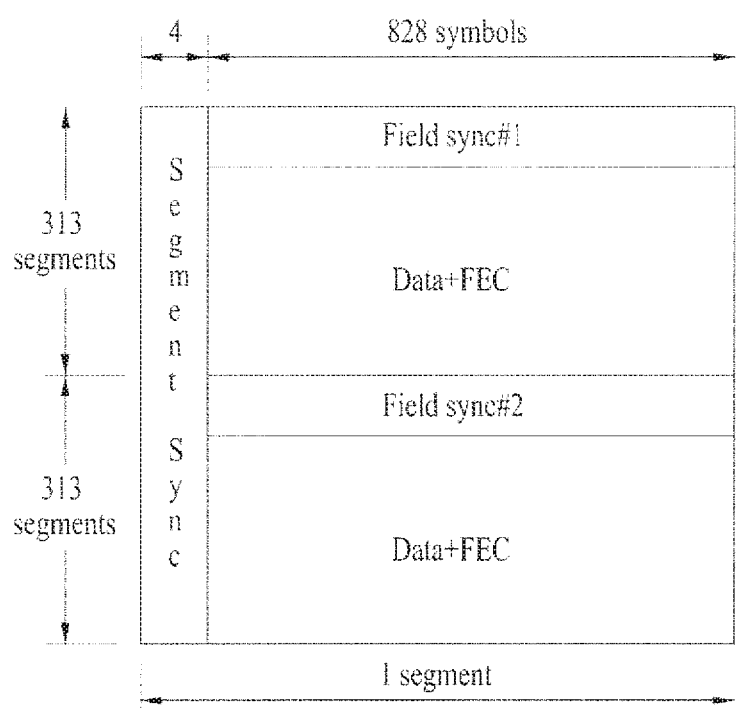
FIG. 2 illustrates an exemplary structure of a VSB frame.

FIG. 2 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time period for multiplexing the mobile service data and the main service data. Herein, one slot may either include the mobile service data or be configured only of the main service data.

If one M/H frame is transmitted during one slot, the first 118 data packets within the slot correspond to a data group. And, the remaining 38 data packets become the main service data packets. In another example, when no data group exists in a slot, the corresponding slot is configured of 156 main service data packets.

Meanwhile, when the slots are assigned to a VSB frame, an offset exists for each assigned position.

Figure 3:
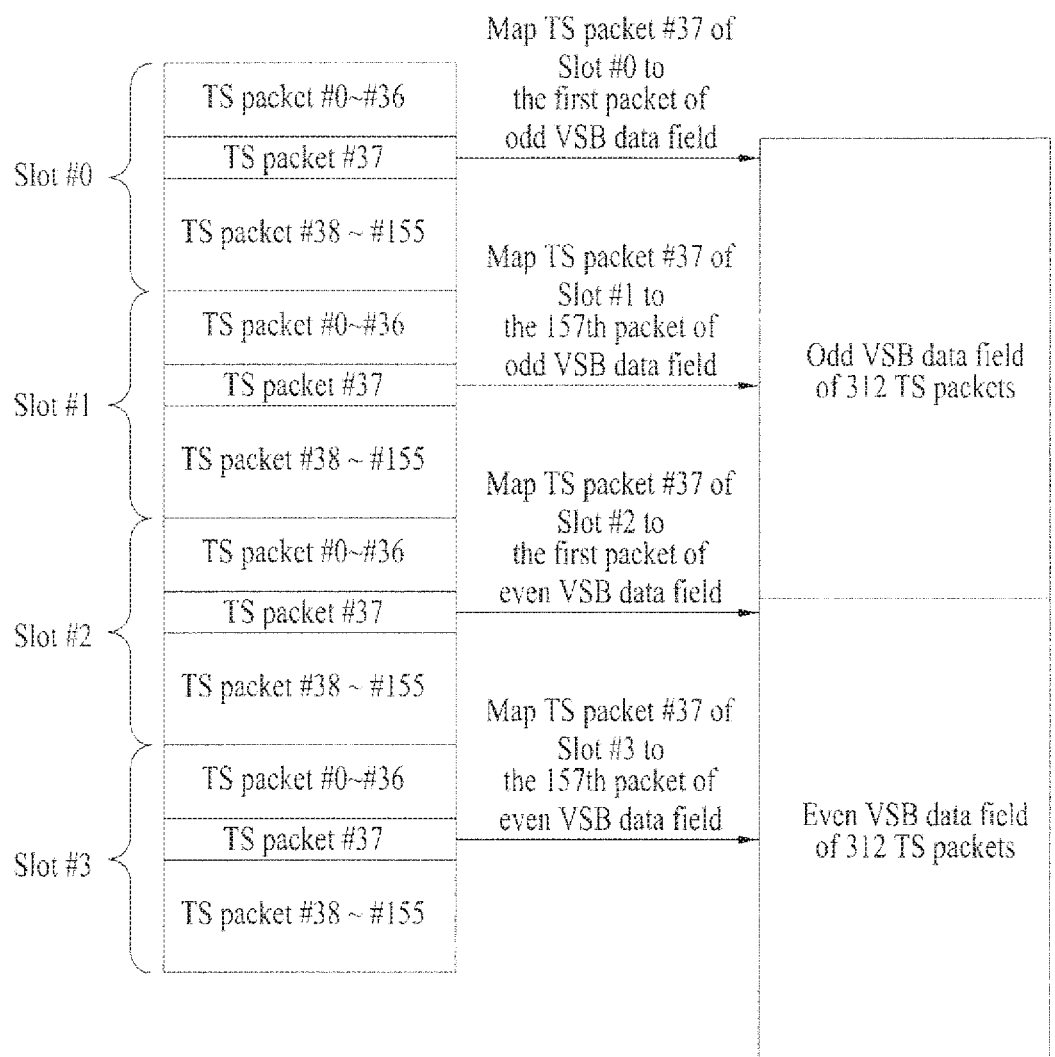
FIG. 3 illustrates a mapping example of the positions to which the first 4 slots of a sub-frame are assigned with respect to a VSB frame in a space region.

FIG. 3 illustrates a mapping example of the positions to which the first 4 slots of a sub-frame are assigned with respect to a VSB frame in a space region. And, FIG. 4 illustrates a mapping example of the positions to which the first 4 slots of a sub-frame are assigned with respect to a VSB frame in a time region.

Figure 4:
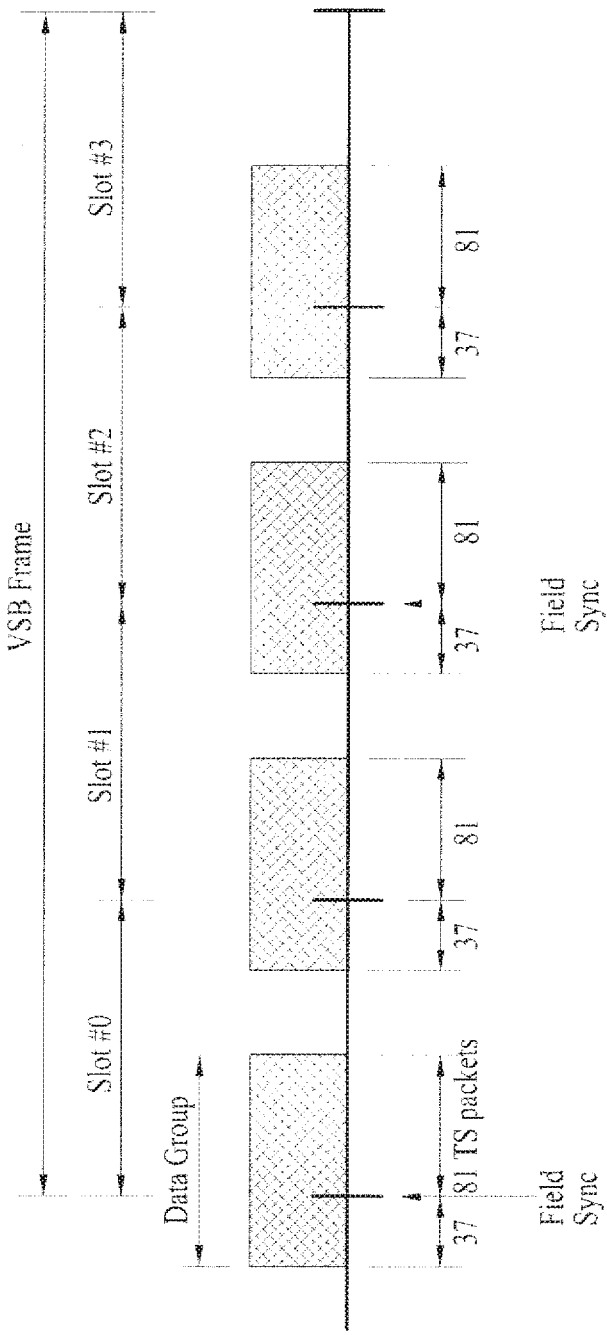
FIG. 4 illustrates a mapping example of the positions to which the first 4 slots of a sub-frame are assigned with respect to a VSB frame in a time region.

Referring to FIG. 3 and FIG. 4, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance.

In an example given in the present invention, a data group is divided into regions A, B, C, and D in a data configuration after data interleaving.

Figure 5:
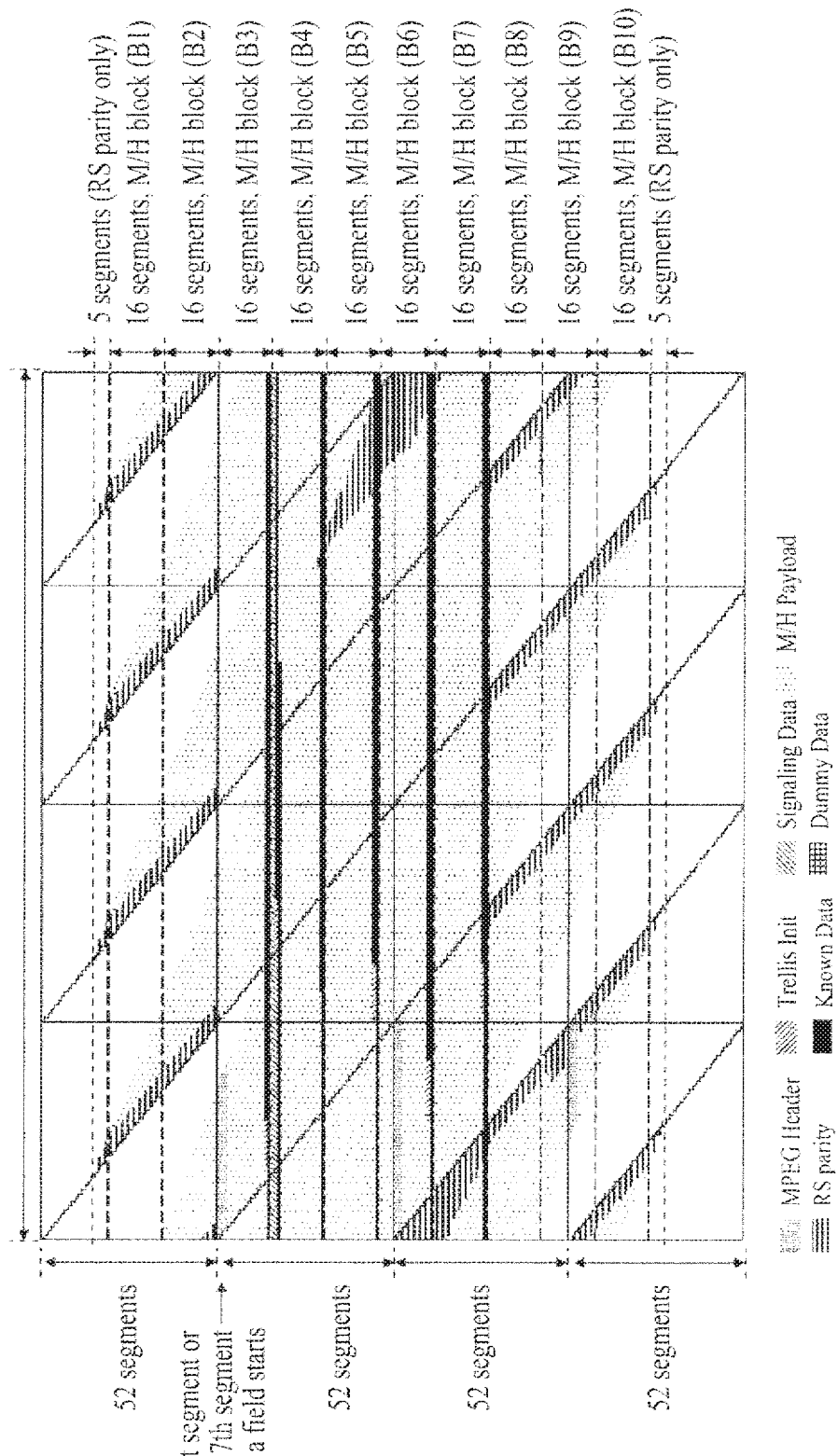
FIG. 5 illustrates an alignment of data after being data interleaved and identified.
Figure 6:
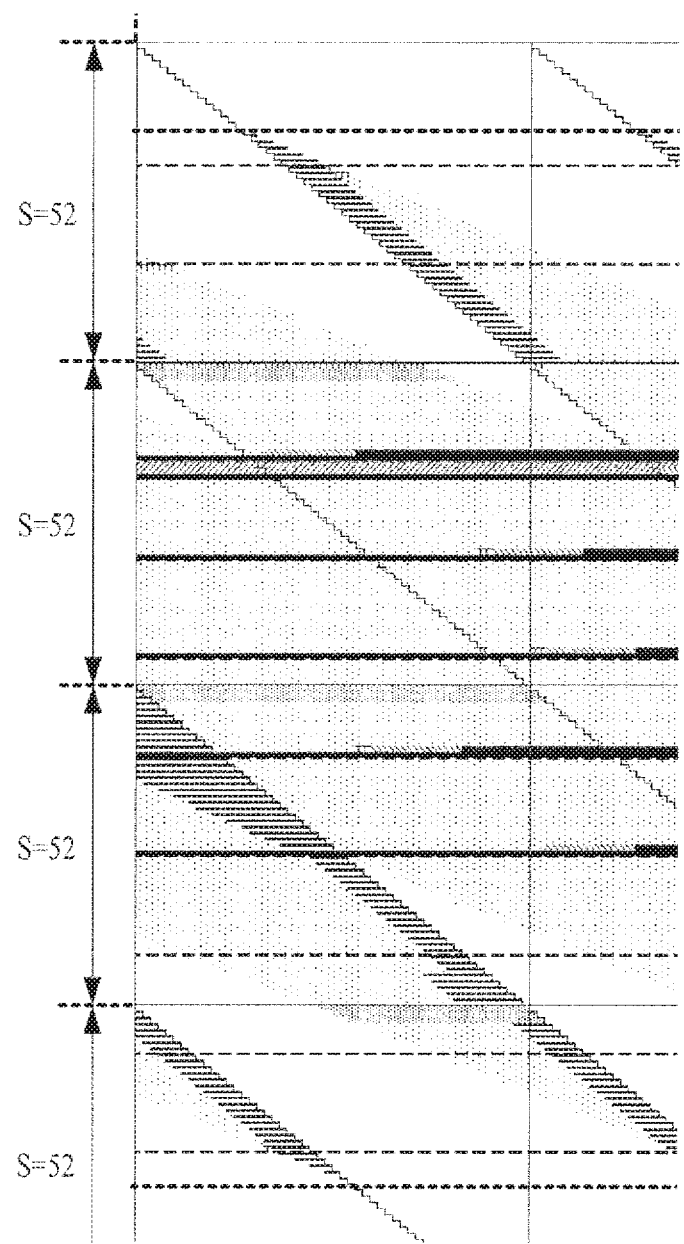
FIG. 6 illustrates an enlarged portion of the data group shown in FIG. 5 for a better understanding of the present invention.
Figure 7:
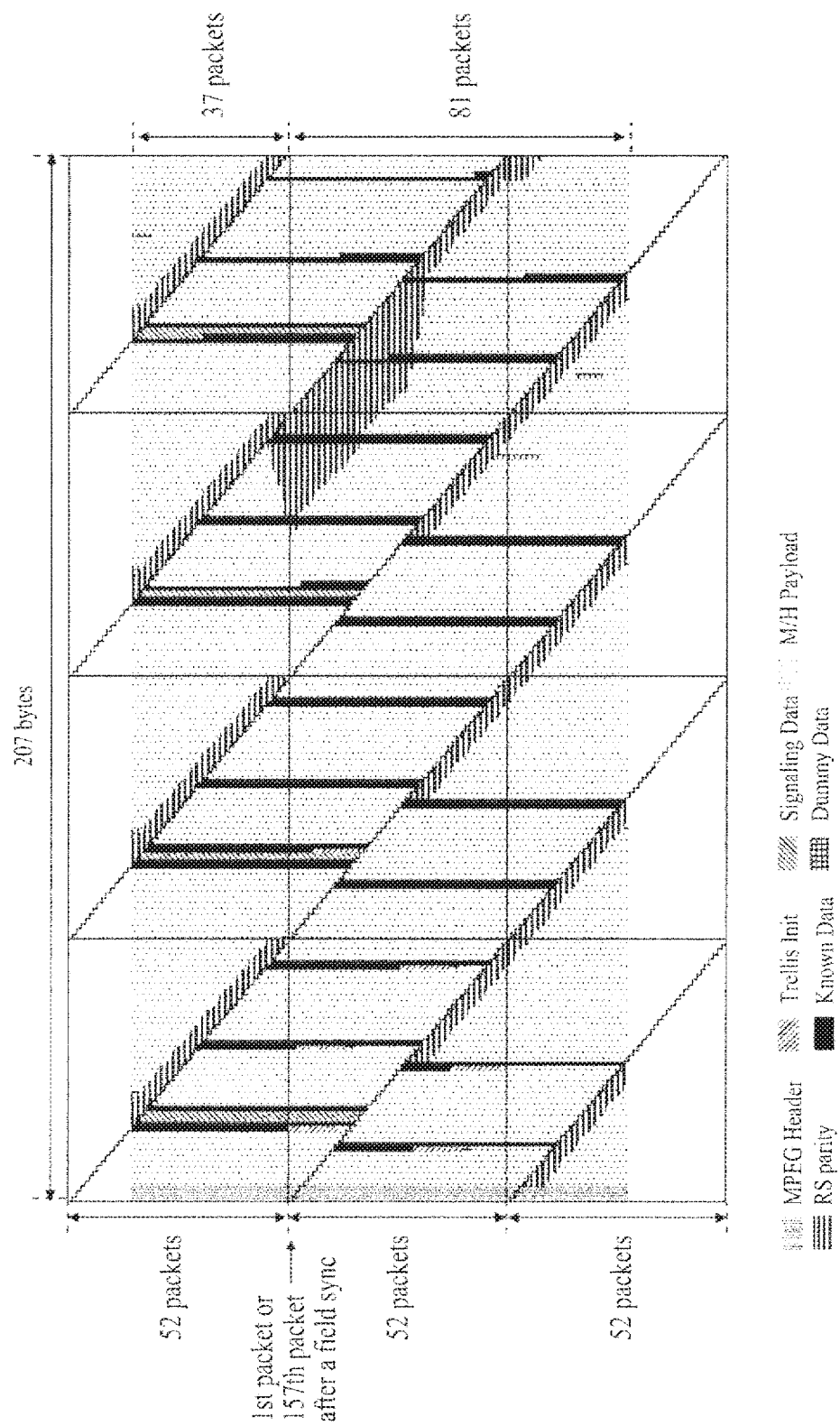
FIG. 7 illustrates an alignment of data before being data interleaved and identified.
Figure 8:
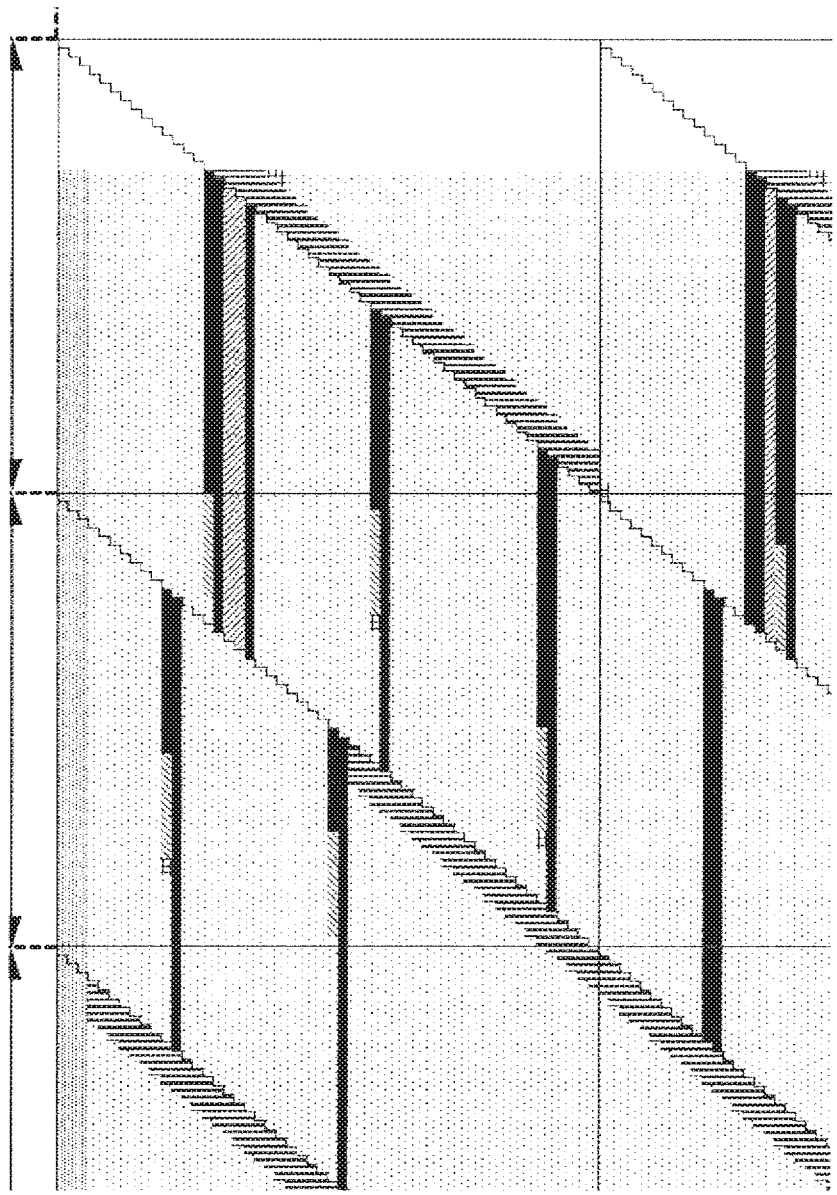
FIG. 8 illustrates an enlarged portion of the data group shown in FIG. 7 for a better understanding of the present invention.

FIG. 5 illustrates an alignment of data after being data interleaved and identified. FIG. 6 illustrates an enlarged portion of the data group shown in FIG. 5 for a better understanding of the present invention. FIG. 7 illustrates an alignment of data before being data interleaved and identified. And, FIG. 8 illustrates an enlarged portion of the data group shown in FIG. 7 for a better understanding of the present invention. More specifically, a data structure identical to that shown in FIG. 5 is transmitted to a receiving system. In other words, one data packet is data-interleaved so as to be scattered to a plurality of data segments, thereby being transmitted to the receiving system. FIG. 5 illustrates an example of one data group being scattered to 170 data segments. At this point, since one 207-byte packet has the same amount of data as one data segment, the packet that is not yet processed with data-interleaving may be used as the data segment.

FIG. 5 shows an example of dividing a data group prior to being data-interleaved into 10 M/H blocks (i.e., M/H block 1 (B1) to M/H block 10 (B10)). In this example, each M/H block has the length of 16 segments. Referring to FIG. 5, only the RS parity data are allocated to a portion of 5 segments before the M/H block 1 (B1) and 5 segments behind the M/H block 10 (B10). The RS parity data are excluded in regions A to D of the data group.

More specifically, when it is assumed that one data group is divided into regions A, B, C, and D, each M/H block may be included in any one of region A to region D depending upon the characteristic of each M/H block within the data group. At this point, according to an embodiment of the present invention, each M/H block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 5, M/H block 4 (B4) to M/H block 7 (B7) correspond to regions without interference of the main service data. M/H block 4 (B4) to M/H block 7 (B7) within the data group shown in FIG. 5 correspond to a region where no interference from the main service data occurs. In this example, a long known data sequence is inserted at both the beginning and end of each M/H block. In the description of the present invention, the region including M/H block 4 (B4) to M/H block 7 (B7) will be referred to as "region A (=B4+B5+B6+B7)". As described above, when the data group includes region A having a long known data sequence inserted at both the beginning and end of each M/H block, the receiving system is capable of performing equalization by using the channel information that can be obtained from the known data. Therefore, the strongest equalizing performance may be yielded (or obtained) from one of region A to region D.

In the example of the data group shown in FIG. 5, M/H block 3 (B3) and M/H block 8 (B8) correspond to a region having little interference from the main service data. Herein, a long known data sequence is inserted in only one side of each M/H block B3 and B8. More specifically, due to the interference from the main service data, a long known data sequence is inserted at the end of M/H block 3 (B3), and another long known data sequence is inserted at the beginning of M/H block 8 (B8). In the present invention, the region including M/H block 3 (B3) and M/H block 8 (B8) will be referred to as "region B(=B3+B8)". As described above, when the data group includes region B having a long known data sequence inserted at only one side (beginning or end) of each M/H block, the receiving system is capable of performing equalization by using the channel information that can be obtained from the known data. Therefore, a stronger equalizing performance as compared to region C/D may be yielded (or obtained).

Referring to FIG. 5, M/H block 2 (B2) and M/H block (B9) correspond to a region having more interference from the main service data as compared to region B. A long known data sequence cannot be inserted in any side of M/H block 2 (B2) and M/H block 9 (B9). Herein, the region including M/H block 2 (B2) and M/H block 9 (B9) will be referred to as "region C(=B2+B9)". Finally, in the example shown in FIG. 5, M/H block 1 (B1) and M/H block 10 (B10) correspond to a region having more interference from the main service data as compared to region C. Similarly, a long known data sequence cannot be inserted in any side of M/H block 1 (B1) and M/H block 10 (B10).

Herein, the region including M/H block 1 (B1) and M/H block 10 (B10) will be referred to as "region D (=B1+B10)". Since region C/D is spaced further apart from the known data sequence, when the channel environment undergoes frequent and abrupt changes, the receiving performance of region C/D may be deteriorated.

FIG. 7 illustrates a data structure prior to data interleaving. More specifically, FIG. 7 illustrates an example of 118 data packets being allocated to a data group. FIG. 7 shows an example of a data group consisting of 118 data packets, wherein, based upon a reference packet (e.g., a $1^{st}$ packet (or data segment) or $157^{th}$ packet (or data segment) after a field synchronization signal), when allocating data packets to a VSB frame, 37 packets are included before the reference packet and 81 packets (including the reference packet) are included afterwards.

In other words, with reference to FIG. 5, a field synchronization signal is placed (or assigned) between M/H block 2 (B2) and M/H block 3 (B3). Accordingly, this indicates that the slot has an off-set of 37 data packets with respect to the corresponding VSB field.

The size of the data groups, number of hierarchical regions within the data group, the size of each region, the number of M/H blocks included in each region, the size of each M/H block, and so on described above are merely exemplary. Therefore, the present invention will not be limited to the examples described above.

FIG. 9 illustrates an exemplary assignment order of data groups being assigned to one of 5 sub-frames, wherein the 5 sub-frames configure an M/H frame. For example, the method of assigning data groups may be identically applied to all M/H frames or differently applied to each M/H frame. Furthermore, the method of assigning data groups may be identically applied to all sub-frames or differently applied to each sub-frame. At this point, when it is assumed that the data groups are assigned using the same method in all sub-frames of the corresponding M/H frame, the total number of data groups being assigned to an M/H frame is equal to a multiple of '5'.

According to the embodiment of the present invention, a plurality of consecutive data groups is assigned to be spaced as far apart from one another as possible within the M/H frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 9 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15.

Equation 1 below shows the above-described rule (or pattern) for assigning data groups in a sub-frame.

$$j=(4i+O)\bmod 16 \quad\quad\quad \text{Equation 1}$$

O=0 if i<4,
O=2 else if i<8,
Herein,
O=1 else if i<12,
O=3 else.

Herein, j indicates the slot number within a sub-frame. The value of j may range from 0 to 15 (i.e., 0≤j≤15). Also, value of i indicates the data group number. The value of i may range from 0 to 15 (i.e., 0≤i≤15).

In the present invention, a collection of data groups included in an M/H frame will be referred to as a "parade". Based upon the RS frame mode, the parade transmits data of one or two RS frames.

The mobile service data within one RS frame may be assigned (or mapped) either to all of regions A/B/C/D within the corresponding data group, or to at least one of regions A/B/C/D. In the embodiment of the present invention, the mobile service data within one RS frame may be assigned (or mapped) either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another. In the description of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. In this case, also the RS frame will be referred to as a "primary RS frame". Conversely, when the mobile service data within one RS frame are assigned either to at least one of regions A/B and regions C/D, one parade may transmit up to 2 RS frames.

More specifically, the RS frame mode indicates whether a parade transmits one RS frame, or whether the parade transmits two RS frames.

Table 1 below shows an example of the RS frame mode.

TABLE 1

| RS frame mode (2 bits) | Description |
| --- | --- |
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the system can be capable of responding promptly and effectively to any burst error that may occur within a sub-frame.

Furthermore, the method of assigning parades may be identically applied to all sub-frames or differently applied to each sub-frame. According to the embodiment of the present invention, the parades may be assigned differently for each M/H frame and identically for all sub-frames within an M/H frame. More specifically, the M/H frame structure may vary by M/H frame units. Thus, an ensemble rate may be adjusted on a more frequent and flexible basis.

Figure 10:
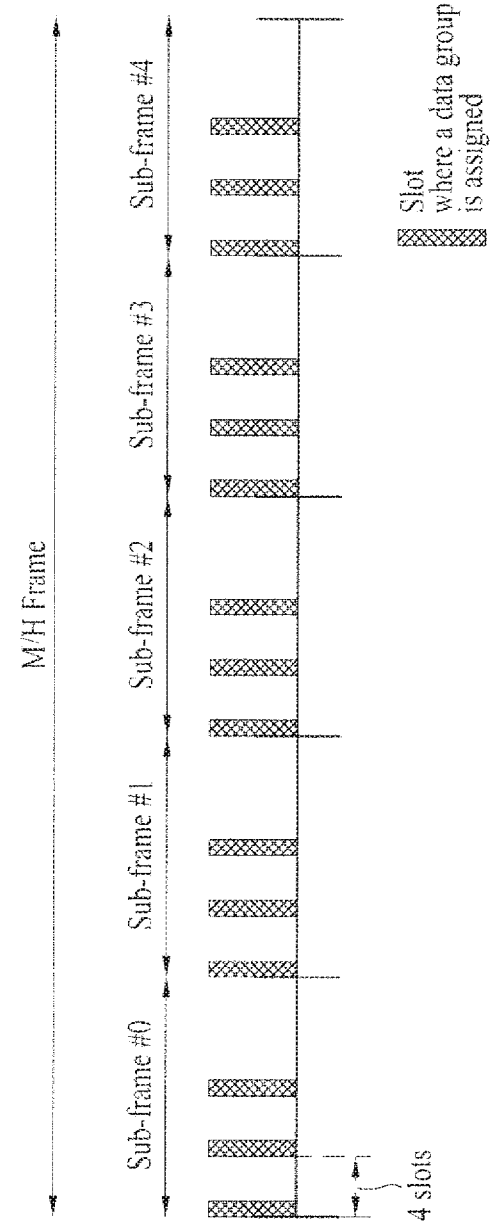
FIG. 10 illustrates an example of assigning a single parade to an M/H frame according to the present invention.

FIG. 10 illustrates an example of multiple data groups of a single parade being assigned (or allocated) to an M/H frame.

More specifically, FIG. 10 illustrates an example of a plurality of data groups included in a single parade, wherein the number of data groups included in a sub-frame is equal to '3', being allocated to an M/H frame. Referring to FIG. 10, 3 data groups are sequentially assigned to a sub-frame at a cycle period of 4 slots. Accordingly, when this process is equally performed in the 5 sub-frames included in the corresponding M/H frame, 15 data groups are assigned to a single M/H frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder located in a later block performs RS-encoding on a payload of the corresponding RS frame, thereby adding 24 bytes of parity data to the corresponding RS frame payload and transmitting the processed RS frame, the parity data occupy approximately 11.37% (=24/(187+24)×100) of the total code word length. Meanwhile, when one sub-frame includes 3 data groups, and when the data groups included in the parade are assigned, as shown in FIG. 10, a total of 15 data groups form an RS frame. Accordingly, even when an error occurs in an entire data group due to a burst noise within a channel, the percentile is merely 6.67% (=1/15×100). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups belonging to a parade are assigned as shown in FIG. 10, either main service data may be assigned between each data group, or data groups corresponding to different parades may be assigned between each data group. More specifically, data groups corresponding to multiple parades may be assigned to one M/H frame.

Basically, the method of assigning data groups corresponding to multiple parades is very similar to the method of assigning data groups corresponding to a single parade. In other words, data groups included in other parades that are to be assigned to an M/H frame are also respectively assigned according to a cycle period of 4 slots.

At this point, data groups of a different parade may be sequentially assigned to the respective slots in a circular method. Herein, the data groups are assigned to slots starting from the ones to which data groups of the previous parade have not yet been assigned.

For example, when it is assumed that data groups corresponding to a parade are assigned as shown in FIG. 10, data groups corresponding to the next parade may be assigned to a sub-frame starting either from the $12^{th}$ slot of a sub-frame.

However, this is merely exemplary. In another example, the data groups of the next parade may also be sequentially assigned to a different slot within a sub-frame at a cycle period of 4 slots starting from the $3^{rd}$ slot.

As described above, data groups of multiple parades may be assigned to a single M/H frame, and, in each sub-frame, the data groups are serially allocated to a group space having 4 slots from left to right.

Therefore, a number of groups of one parade per sub-frame (NOG) may correspond to any one integer from '1' to '8'. Herein, since one M/H frame includes 5 sub-frames, the total number of data groups within a parade that can be allocated to an M/H frame may correspond to any one multiple of '5' ranging from '5' to '40'.

As described above, an M/H frame is divided into 5 sub-frames. Data groups corresponding to a plurality of parades co-exist in each sub-frame. Herein, the data groups corresponding to each parade are grouped by M/H frame units, thereby configuring a single parade.

Meanwhile, an RS frame according to the present invention includes an RS frame payload, RS parity data added at bottom of each column of the RS frame payload, and CRC data added at left end of each row of the RS frame payload having the RS parity data.

Figure 11:
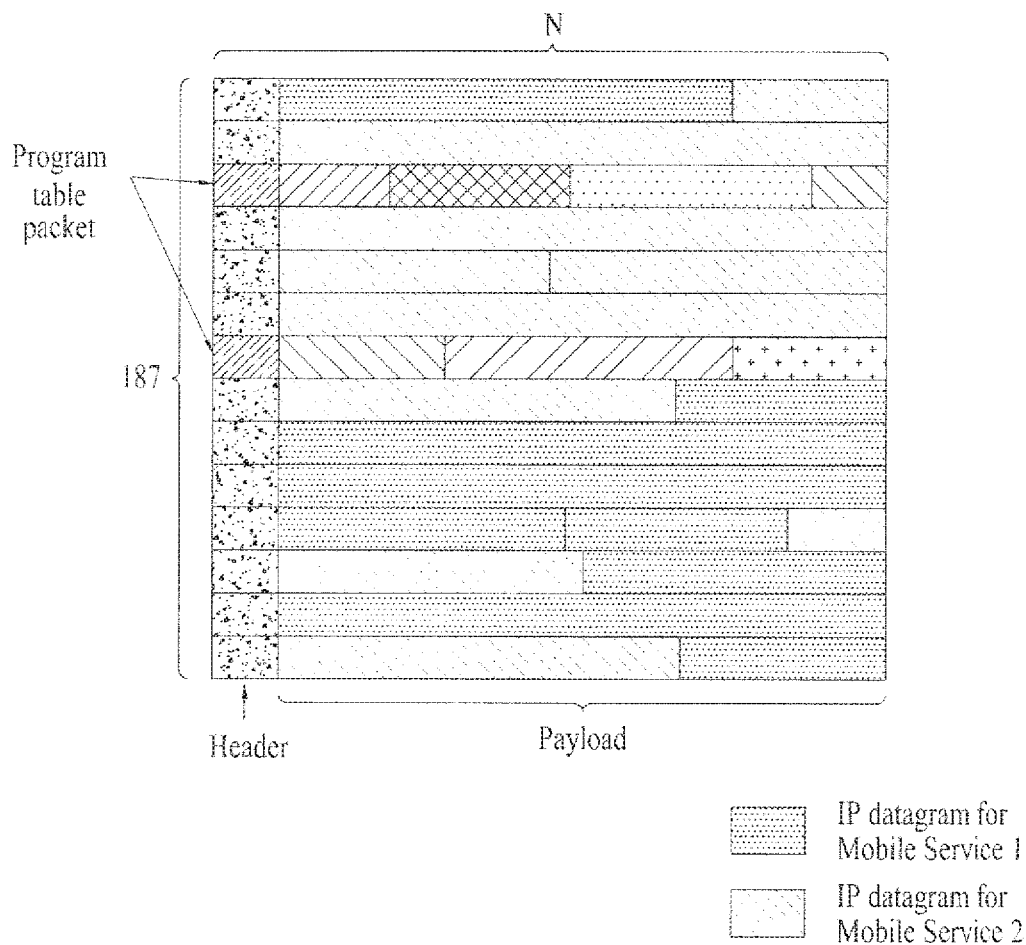
FIG. 11 illustrates an example of RS frame payload according to the present invention.

The RS frame payload has the size of N (row)×187 (column), as shown in FIG. 11. Herein, N represents the length of a row (i.e., number of columns), and 187 corresponds to the length of a column (i.e., number of rows.

In the present invention, for convenience of description, each row of the N bytes will be referred to as M/H service data packet (or M/H TP packet).

Figure 12:
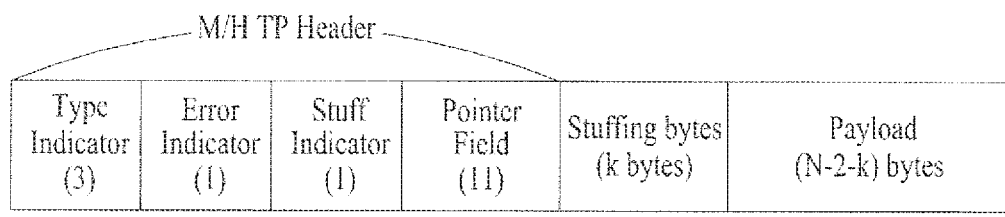
FIG. 12 is a diagram illustrating a structure of an M/H header within an M/H service data packet according to the present invention.

Each M/H service data packet within the RS frame payload includes M/H header (or MH TP header) of 2 bytes, a stuffing region of k bytes, and M/H payload of N-2-k bytes as shown in FIG. 12. At this time, k has a value of 0 or a value greater than 0. The M/H payload includes IP datagrams of signaling table information and/or mobile service data according to an embodiment of the present invention. In this case, the M/H header of 2 bytes is only one example, and corresponding bytes can be varied depending on a designer. Accordingly, the present invention will not be limited to such example.

At this time, as the M/H service data packet includes M/H header, the M/H header may not reach N bytes.

In this case, stuffing bytes can be assigned to the remaining payload part of the corresponding M/H service data packet. For example, after program table information is assigned to one M/H service data packet, if the length of the M/H service data packet is N-20 bytes including the M/H header, the stuffing bytes can be assigned to the remaining 20 bytes. In this case, the value k becomes 20, and the M/H payload region within the corresponding M/H service data packet includes N-2-20 bytes.

The RS frame payload is generated by collecting signaling table information corresponding to one or more mobile services and/or IP datagram of the mobile service data. For example, signaling table information for two kinds of mobile services called news (for example, IP datagram for mobile service 1) and the stocks (for example, IP datagram for mobile service 2) and IP datagram of mobile service data can be included in one RS frame payload.

More specifically, in the transmitting system (e.g., mobile broadcast station), the mobile service data (e.g., A/V steaming) are packetized based upon a real time protocol (RTP) method. The RTP packet is then packetized once again based upon a user datagram protocol (UDP) method. Thereafter, the RTP/UDP packet is in turn packetized based upon an IP method, thereby being packetized into RTP/UDP/IP packet data. In the description of the present invention, the packetized RTP/UDP/IP packet data will be referred to as an IP datagram for simplicity.

Furthermore, service information for receiving mobile services may be provided in the form of a signaling table. And, a service signaling channel transmitting such signaling table is packetized based upon a UDP method. And, the packetized UDP data are then packetized based upon an IP method, thereby being packetized into UDP/IP data. In the description of the present invention, the packetized UDP/IP packet data will also be referred to as an IP datagram for simplicity. According to an embodiment of the present invention, the service signaling channel is encapsulated into an IP datagram having a well-known destination IP address and a well-known destination UDP port number.

More specifically, one RS frame payload includes an IP datagram of mobile service data for at least one or more mobile services. Furthermore, the RS frame payload includes an IP datagram of a service signaling channel for receiving the mobile service data.

According to the embodiment of the present invention, among a service map table (SMT), a guide access table (GAT), a cell information table (CIT), a service labeling table (SLT), and a rating region table (RRT), the present invention transmits at least one signaling table through the service signaling channel. Herein, the signaling tables presented in the embodiment of the present invention are merely examples for facilitating the understanding of the present invention. Therefore, the present invention is not limited only to the exemplary signaling tables that can be transmitted through the service signaling channel.

The SMT provides signaling information on ensemble levels. Also, each SMT provides IP access information for each mobile service belonging to the corresponding ensemble including each SMT. Furthermore, the SMT provides IP stream component level information required for the corresponding mobile service. The RRT transmits information on region and program ratings. More specifically, the RRT provides content advisory rating information. The GAT provides information on SG providers, which transmit the service guides. Also, the GAT provides service guide bootstrapping information required for accessing the SG. The CIT provides channel information of each cell, which corresponds to the frequency domain of a broadcast signal. Herein, a cell refers to a scope affected (or influenced) by a transmitter based upon a physical frequency in a multi-frequency network (MFN) environment (or condition). More specifically, the CIT provides information on a carrier wave frequency of an adjacent cell in the current transmitter (or transmitting system). Therefore, based upon the CIT information, a receiver (or receiving system) can travel from one transmitter's (or exciter's) coverage area to another. The SLT provides minimum required information for an exclusive usage of a channel scan process. More specifically, according to the embodiment of the present invention, other than the SMT, by using the SLT for the exclusive usage of the channel scan process, so as to configure a set of minimum information for the channel scan process, the channel scanning speed may be increased.

According to an embodiment of the present invention, each signaling table is divided into at least one section. Then, each section is encapsulated to a UDP/IP header, thereby being transmitted through the service signaling channel. In this case, the number of UDP/IP packets being transmitted through the service signaling channel may vary based upon the number of signaling tables being transmitted through the service signaling channel and the number of sections in each signaling table.

At this point, all UDP/IP packets transmitted through the service signaling channel have the same number of well-known target IP addresses and well-known target UDP port numbers. For example, when it is assumed that the SMT, RRT, and GAT are transmitted through the service signaling channel, the target IP address and target UDP port number of all UDP/IP packets transmitting the SMT, RRT, and GAT are identical to one another. Furthermore, the target IP address and the target UDP port number respectively correspond to well-known values, i.e., values pre-known by the receiving system based upon an agreement between the receiving system and the transmitting system.

Therefore, the identification of each signaling table included in the service signaling data is performed by a table identifier. The table identifier may correspond to a table_id field existing in the corresponding signaling table or in the header of the corresponding signaling table section. And, when required, identification may be performed by further referring to a table_id_extension field.

FIG. 12 is a diagram illustrating examples of fields allocated to the M/H header region within the M/H service data packet according to the present invention. Examples of the fields include type_indicator field, error_indicator field, stuff_indicator field, and pointer field.

The type_indicator field can allocate 3 bits, for example, and represents a type of data allocated to payload within the corresponding M/H service data packet. In other words, the type_indicator field indicates whether data of the payload is IP datagram or program table information. At this time, each data type constitutes one logical channel. In the logical channel which transmits the IP datagram, several mobile services are multiplexed and then transmitted. Each mobile service undergoes demultiplexing in the IP layer.

The error_indicator field can allocate 1 bit, for example, and represents whether the corresponding M/H service data packet has an error. For example, if the error_indicator field has a value of 0, it means that there is no error in the corresponding M/H service data packet. If the error_indicator field has a value of 1, it means that there may be an error in the corresponding M/H service data packet. According to an embodiment of the present invention, a value of zero are indicated and transmitted on all error_indicator fields within the RS frame.

The stuff_indicator field can allocate 1 bit, for example, and represents whether stuffing byte exists in payload of the corresponding M/H service data packet. For example, if the stuff_indicator field has a value of 0, it means that there is no stuffing byte in the corresponding M/H service data packet. If the stuff_indicator field has a value of 1, it means that stuffing byte exists in the corresponding M/H service data packet.

The pointer field can allocate 11 bits, for example, and represents position information where new data (i.e., new signaling information or new IP datagram) starts in the corresponding M/H service data packet.

For example, if IP datagram for mobile service 1 and IP datagram for mobile service 2 are allocated to the first M/H service data packet within the RS frame payload as illustrated in FIG. 11, the pointer field value represents the start position of the IP datagram for mobile service 2 within the M/H service data packet.

Also, if there is no new data in the corresponding M/H service data packet, the corresponding field value is expressed as a maximum value exemplarily. According to the embodiment of the present invention, since 11 bits are allocated to the pointer field, if 2047 is expressed as the pointer field value, it means that there is no new data in the packet. The point where the pointer field value is 0 can be varied depending on the type_indicator field value and the stuff_indicator field value.

It is to be understood that the order, the position, and the meaning of the fields allocated to the header within the M/H service data packet illustrated in FIG. 12 are exemplarily illustrated for understanding of the present invention. Since the order, the position and the meaning of the fields allocated to the header within the M/H service data packet and the number of additionally allocated fields can easily be modified by those skilled in the art, the present invention will not be limited to the above example.

Figure 13A:
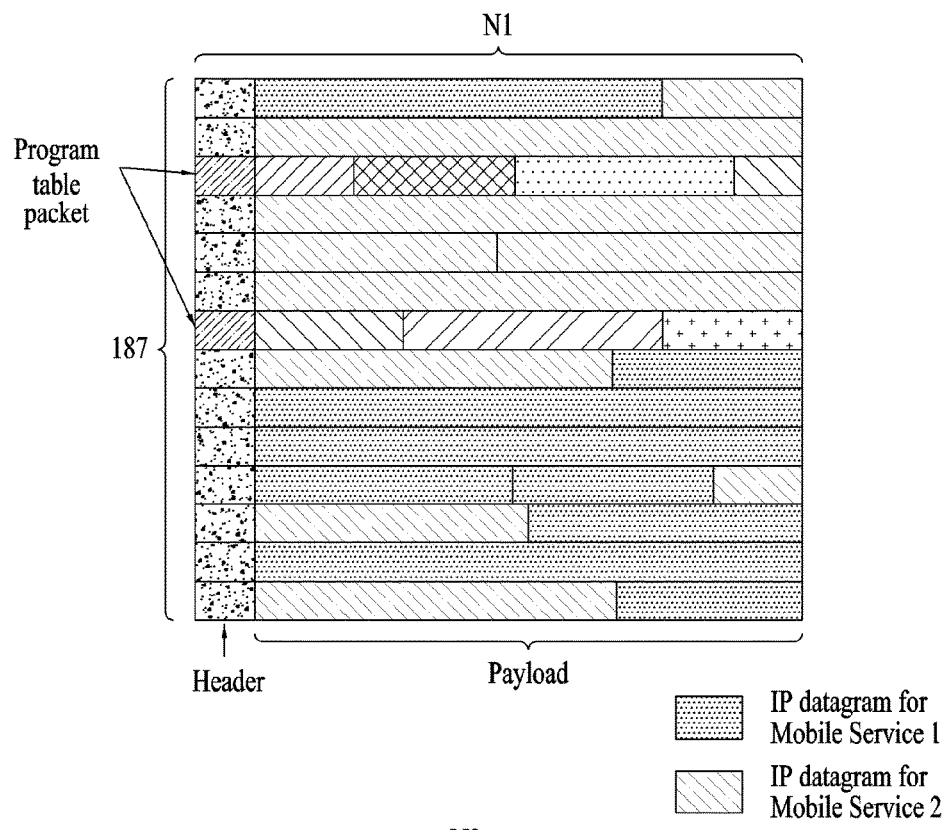
FIG. 13A and FIG. 13B are diagrams illustrating another example of RS frame payload according to the present invention.
Figure 13B:
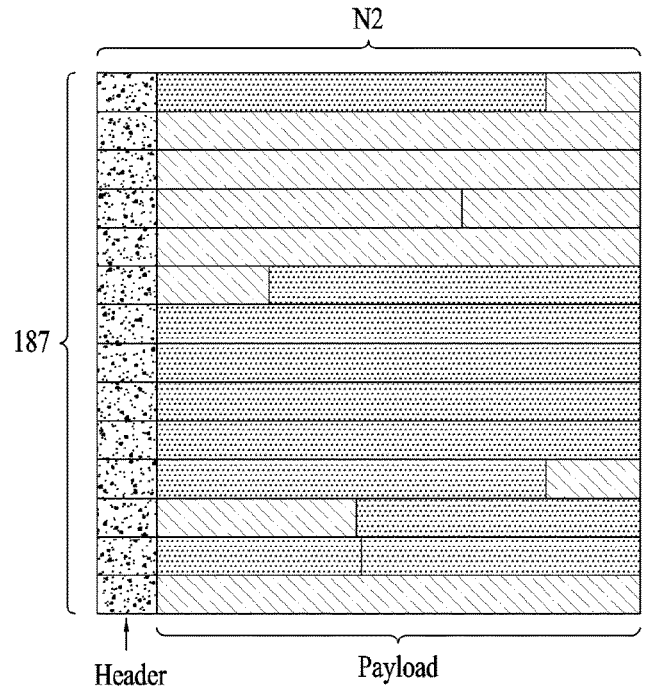

FIG. 13A and FIG. 13B illustrate another examples of RS frame payload according to the present invention. FIG. 13A illustrates an example of primary RS frame payload to be allocated to regions A/B within the data group, and FIG. 13B illustrates an example of secondary RS frame payload to be allocated to regions C/D within the data group.

In FIG. 13A and FIG. 13B, a column length (i.e., the number of rows) of the RS frame payload to be allocated to the regions A/B and a column length (i.e., the number of rows) of the RS frame payload to be allocated to the regions C/D are 187 equally. However, row lengths (i.e, the number of columns) may be different from each other.

According to the embodiment of the present invention, when the row length of the primary RS frame payload to be allocated to the regions A/B within the data group is N1 bytes and the row length of the secondary RS frame payload to be allocated to the regions C/D within the data group is N2 bytes, a condition of N1>N2 is satisfied.

In this case, N1 and N2 can be varied depending on the transmission parameter or a region of the data group, to which the corresponding RS frame payload will be transmitted.

For convenience of the description, each row of the N1 and N2 bytes will be referred to as the M/H service data packet. In the present invention, the primary RS frame payload for the regions A/B within the data group and the secondary RS frame payload for the regions C/D within the data group can include at least one of IP datagrams of signaling table information and mobile service data. Also, one RS frame payload can include IP datagram corresponding to one or more mobile services.

Corresponding parts of FIG. 11 can be applied to the other parts, which are not described in FIG. 13A and FIG. 13B.

Meanwhile, the value of N, which corresponds to the number of columns within an RS frame payload, can be decided according to Equation 2.

$$N = \left\lfloor \frac{5 \times NoG \times PL}{187 + P} \right\rfloor - 2 \quad \text{Equation 2}$$

Herein, NoG indicates the number of data groups assigned to a sub-frame. PL represents the number of SCCC payload data bytes assigned to a data group. And, P signifies the number of RS parity data bytes added to each column of the RS frame payload. Finally, $\lfloor X \rfloor$ is the greatest integer that is equal to or smaller than X.

More specifically, in Equation 2, PL corresponds to the length of an RS frame portion. The value of PL is equivalent to the number of SCCC payload data bytes that are assigned to the corresponding data group. Herein, the value of PL may vary depending upon the RS frame mode, SCCC block mode, and SCCC outer code mode. Table 2 to Table 5 below respectively show examples of PL values, which vary in accordance with the RS frame mode, SCCC block mode, and SCCC outer code mode. The SCCC block mode and the SCCC outer code mode will be described in detail in a later process.

TABLE 2

| SCCC outer code mode | | | | |
|---|---|---|---|---|
| for Region A | for Region B | for Region C | for Region D | PL |
| 00 | 00 | 00 | 00 | 9624 |
| 00 | 00 | 00 | 01 | 9372 |
| 00 | 00 | 01 | 00 | 8886 |
| 00 | 00 | 01 | 01 | 8634 |
| 00 | 01 | 00 | 00 | 8403 |
| 00 | 01 | 00 | 01 | 8151 |
| 00 | 01 | 01 | 00 | 7665 |
| 00 | 01 | 01 | 01 | 7413 |
| 01 | 00 | 00 | 00 | 7023 |
| 01 | 00 | 00 | 01 | 6771 |
| 01 | 00 | 01 | 00 | 6285 |
| 01 | 00 | 01 | 01 | 6033 |
| 01 | 01 | 00 | 00 | 5802 |
| 01 | 01 | 00 | 01 | 5550 |
| 01 | 01 | 01 | 00 | 5064 |
| 01 | 01 | 01 | 01 | 4812 |
| Others | | | | Reserved |

Table 2 shows an example of the PL values for each data group within an RS frame, wherein each PL value varies depending upon the SCCC outer code mode, when the RS frame mode value is equal to '00', and when the SCCC block mode value is equal to '00'.

For example, when it is assumed that each SCCC outer code mode value of regions A/B/C/D within the data group is equal to '00' (i.e., the block processor 302 of a later block performs encoding at a coding rate of 1/2), the PL value within each data group of the corresponding RS frame may be equal to 9624 bytes. More specifically, 9624 bytes of mobile service data within one RS frame may be assigned to regions A/B/C/D of the corresponding data group.

TABLE 3

| SCCC outer code mode | PL |
|---|---|
| 00 | 9624 |
| 01 | 4812 |
| Others | Reserved |

Table 3 shows an example of the PL values for each data group within an RS frame, wherein each PL value varies depending upon the SCCC outer code mode, when the RS frame mode value is equal to '00', and when the SCCC block mode value is equal to '01'.

TABLE 4

| SCCC outer code mode | | |
|---|---|---|
| For Region A | for Region B | PL |
| 00 | 00 | 7644 |
| 00 | 01 | 6423 |
| 01 | 00 | 5043 |
| 01 | 01 | 3822 |
| Others | | Reserved |

Table 4 shows an example of the PL values for each data group within a primary RS frame, wherein each PL value varies depending upon the SCCC outer code mode, when the RS frame mode value is equal to '01', and when the SCCC block mode value is equal to '00'. For example, when each SCCC outer code mode value of regions A/B is equal to '00', 7644 bytes of mobile service data within a primary RS frame may be assigned to regions A/B of the corresponding data group.

TABLE 5

| SCCC outer code mode | | |
|---|---|---|
| For Region C | for Region D | PL |
| 00 | 00 | 1980 |
| 00 | 01 | 1728 |
| 01 | 00 | 1242 |
| 01 | 01 | 990 |
| Others | | Reserved |

Table 5 shows an example of the PL values for each data group within a secondary RS frame, wherein each PL value varies depending upon the SCCC outer code mode, when the RS frame mode value is equal to '01', and when the SCCC block mode value is equal to '00'. For example, when each SCCC outer code mode value of regions C/D is equal to '00', 1980 bytes of mobile service data within a secondary RS frame may be assigned to regions C/D of the corresponding data group.

Meanwhile, a predetermined portion of each data group (i.e., 37 bytes/data group) is used for delivering (or sending) FIC information (i.e., one FIC segment), wherein the FIC information is separately encoded from the RS-encoding process on the mobile service data.

Also, the concept of an M/H ensemble is applied in the embodiment of the present invention, thereby defining a collection (or group) of services. Each M/H ensemble carries the same QoS and is coded with the same FEC code. Herein, the M/H ensemble is used as the same meaning of ensemble. Furthermore, each ensemble has a unique identifier (i.e., ensemble ID) and corresponds to consecutive RS frames.

A transmitting/receiving system according to an embodiment of the present invention operates (or manages) two data channels. One data channel is an RS frame data channel for transmitting contents and the other data channel is an FIC (Fast Information Channel) for service acquisition. The present invention is intended that mapping (binding) information between an ensemble and a mobile service is signaled using an FIC chunk and the FIC chunk is transmitted through the FIC by being segmented into an FIC segment unit, whereby the receiving system can perform fast service acquisition.

Transmitter

Figure 14:
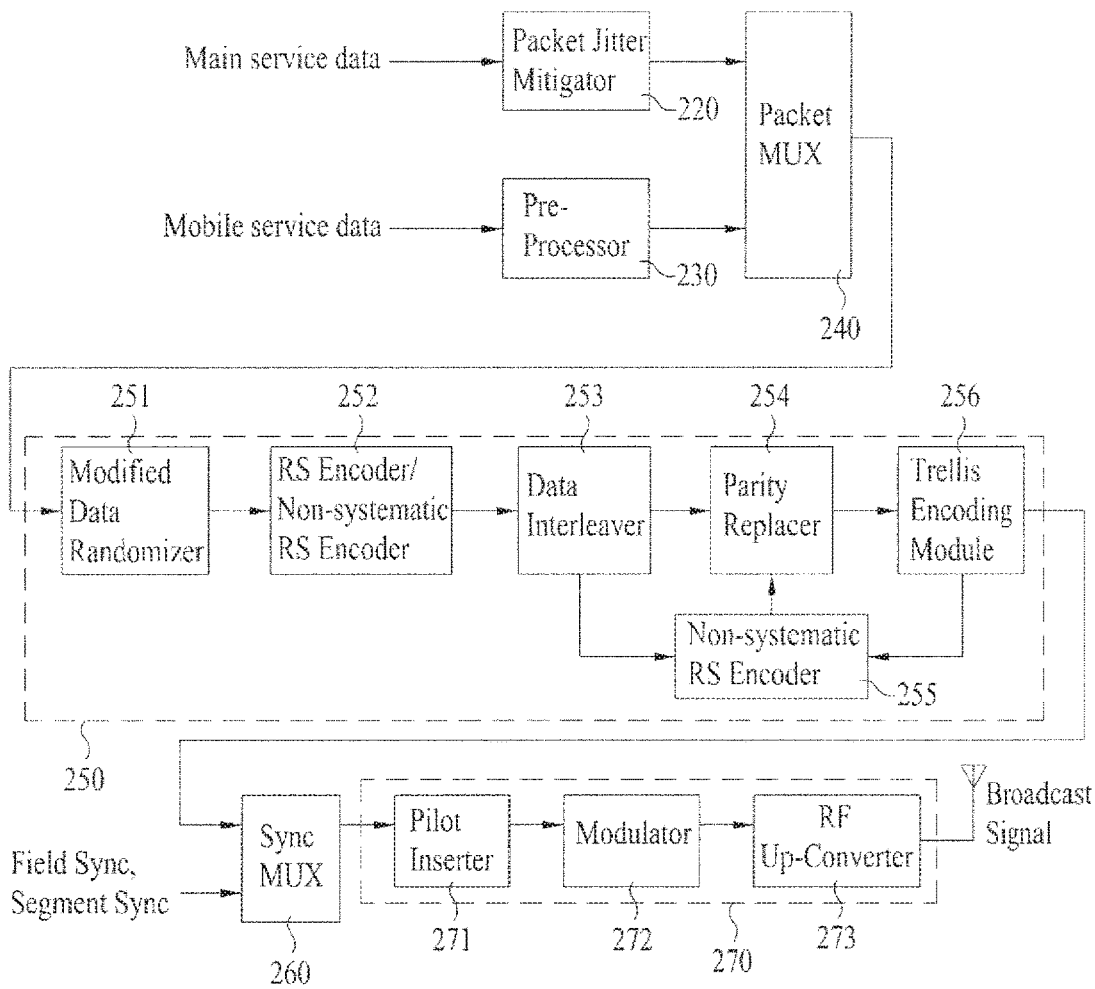
FIG. 14 illustrates a block diagram showing an embodiment of a transmitter according to the present invention.

FIG. 14 illustrates a block diagram showing an example of the transmitter according to an embodiment of the present invention. Herein, the transmitter includes a packet jitter mitigator 220, a pre-processor 230, a packet multiplexer 240, a post-processor 250, a synchronization (sync) multiplexer 260, and a transmission unit 270.

At this point, main service data are inputted to the packet jitter mitigator 220 and mobile service data are inputted to the pre-processor 230 according to an embodiment of the present invention. Furthermore, main service data packets including main service data can be inputted to the packet jitter mitigator 220 and mobile service data packets including mobile service data can be inputted to the pre-processor 230 according to another embodiment of the present invention.

Figure 15:
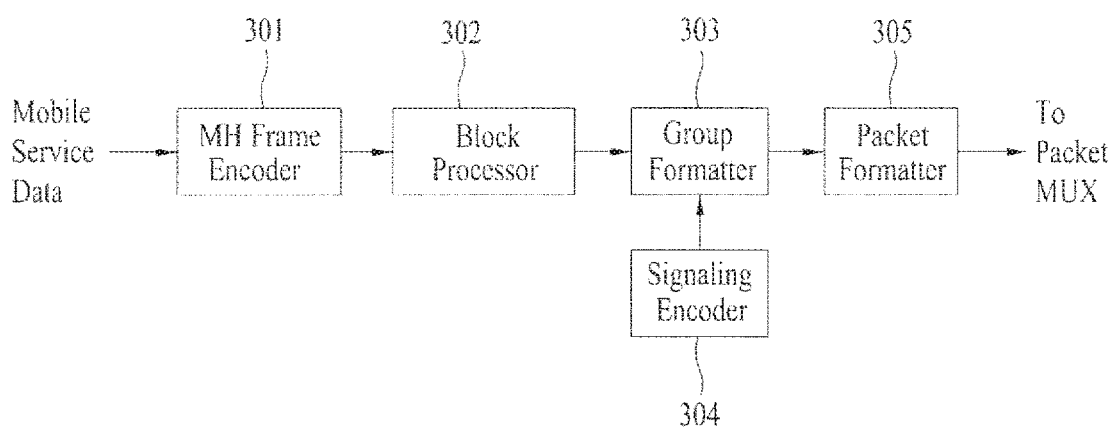
FIG. 15 illustrates a block diagram showing an example of a pre-processor according to the present invention.

The pre-processor 230 performs an additional encoding process of the mobile service data inputted. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. FIG. 15 illustrates a block diagram showing the structure of a pre-processor 230 according to the present invention. Herein, the pre-processor 230 includes an M/H frame encoder 301, a block processor 302, a group formatter 303, a signaling encoder 304, and a packet formatter 305.

The M/H frame encoder 301, which is included in the pre-processor 230 having the above-described structure, data-randomizes the mobile service data inputted, thereby forming at least one RS frame belonging to an ensemble. The M/H frame encoder 301 may include at least one RS frame encoder. More specifically, RS frame encoders may be provided in parallel, wherein the number of RS frame encoders is equal to the number of parades within the M/H frame. As described above, the M/H frame is a basic time cycle period for transmitting at least one parade. Also, each parade consists of one or two RS frames.

Figure 16:
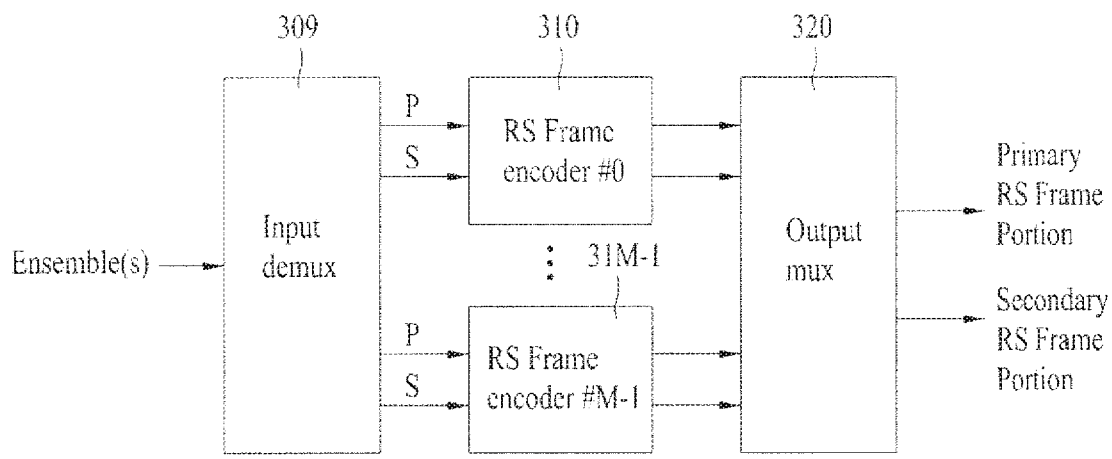
FIG. 16 illustrates a conceptual block diagram of the M/H frame encoder according to the present invention.

FIG. 16 illustrates a conceptual block diagram of the M/H frame encoder 301 according to an embodiment of the present invention. The M/H frame encoder 301 includes an input demultiplexer (DEMUX) 309, M number of RS frame encoders 310 to 31M−1, and an output multiplexer (MUX) 320. Herein, M represent the number of parades included in one M/H frame.

The demultiplexer 309 output the inputted mobile service data packet to a corresponding RS frame encoder among M number of RS frame encoders in ensemble units.

According to an embodiment of the present invention, each RS frame encoder forms an RS frame payload using mobile service data inputted and performs at least one of an error correction encoding process and an error detection encoding process in RS frame payload units, thereby forming an RS frame. Also, each RS frame encoder divides the RS frame into a plurality of portions, in order to assign the error-correction-encoded RS frame data to a plurality of data groups. Based upon the RS frame mode of Table 1, data within one RS frame may be assigned either to all of regions A/B/C/D within multiple data groups, or to at least one of regions A/B and regions C/D within multiple data groups.

When the RS frame mode value is equal to '01', i.e., when the data of the primary RS frame are assigned to regions A/B of the corresponding data group and data of the secondary RS frame are assigned to regions C/D of the corresponding data group, each RS frame encoder creates a primary RS frame and a secondary RS frame for each parade. Conversely, when the RS frame mode value is equal to '00', when the data of the primary RS frame are assigned to all of regions A/B/C/D, each RS frame encoder creates a RS frame (i.e., a primary RS frame) for each parade.

Also, each RS frame encoder divides each RS frame into several portions. Each portion of the RS frame is equivalent to a data amount that can be transmitted by a data group. The output multiplexer (MUX) 320 multiplexes portions within M number of RS frame encoders 310 to 310M−1 are multiplexed and then outputted to the block processor 302.

For example, if one parade transmits two RS frames, portions of primary RS frames within M number of RS frame encoders 310 to 310M−1 are multiplexed and outputted. Thereafter, portions of secondary RS frames within M number of RS frame encoders 310 to 310M−1 are multiplexed and transmitted.

Figure 17:
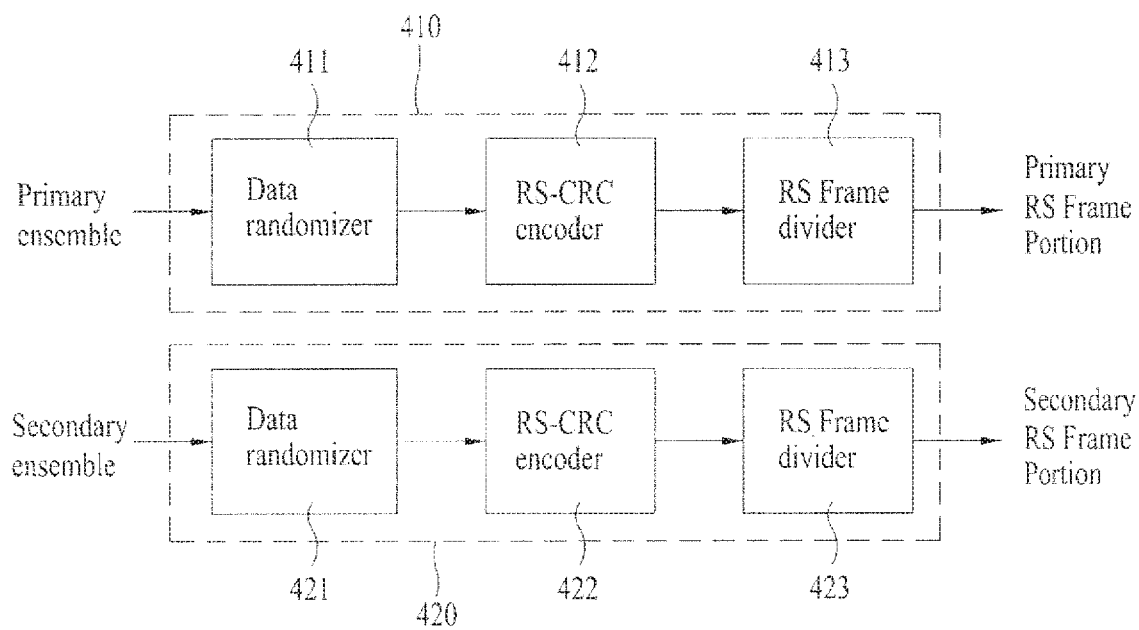
FIG. 17 illustrates a detailed block diagram of an RS frame encoder according to the present invention.

FIG. 17 illustrates a detailed block diagram of an RS frame encoder among a plurality of RS frame encoders within an M/H frame encoder.

One RS frame encoder may include a primary encoder 410 and a secondary encoder 420. Herein, the secondary encoder 420 may or may not operate based upon the RS frame mode. For example, when the RS frame mode value is equal to '00', as shown in Table 1, the secondary encoder 420 does not operate.

The primary encoder 410 may include a data randomizer 411, a Reed-Solomon-cyclic redundancy check (RS-CRC) encoder (412), and a RS frame divider 413. And, the secondary encoder 420 may also include a data randomizer 421, a RS-CRC encoder (422), and a RS frame divider 423.

More specifically, the data randomizer 411 of the primary encoder 410 receives mobile service data belonging to a primary ensemble outputted from the output demultiplexer (DEMUX) 309. Then, after randomizing the received mobile service data, the data randomizer 411 outputs the randomized data to the RS-CRC encoder 412.

The RS-CRC encoder 412 performs FEC (Forward Error Correction) encoding on the randomized mobile service data using at least one of a Reed-Solomon (RS) code and a cyclic redundancy check (CRC) code and outputs to the RS frame divider 413.

The RS-CRC encoder 412 groups a plurality of mobile service data that is randomized and inputted, so as to form a RS frame payload. Then, the RS-CRC encoder 412 performs at least one of an error correction encoding process and an error detection encoding process in RS frame payload units, thereby forming an RS frame. Accordingly, robustness may be provided to the mobile service data, thereby scattering group error that may occur during changes in a frequency environment, thereby enabling the mobile service data to respond to the frequency environment, which is extremely vulnerable and liable to frequent changes.

Also, the RS-CRC encoder 412 groups a plurality of RS frame so as to create a super frame, thereby performing a row permutation process in super frame units. The row permutation process may also be referred to as a "row interleaving process". Hereinafter, the process will be referred to as "row permutation" for simplicity. In the present invention, the row permutation process is optional.

More specifically, when the RS-CRC encoder 412 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process in the RS-CRC encoder 412. When performing the RS-encoding, parity data that are used for the error correction are generated. And, when performing the CRC encoding, CRC data that are used for the error detection are generated.

The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system.

Figure 18A:
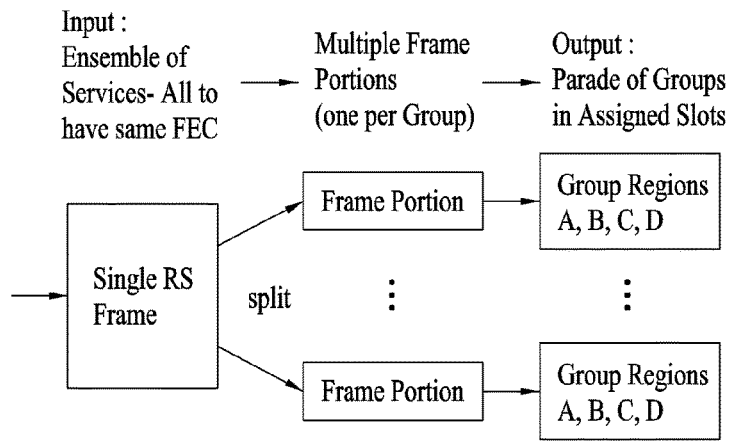
FIG. 18A and FIG. 18B illustrate a process of one or two RS frame being divided into several portions, based upon an RS frame mode value, and a process of each portion being assigned to a corresponding region within the respective data group.
Figure 18B:
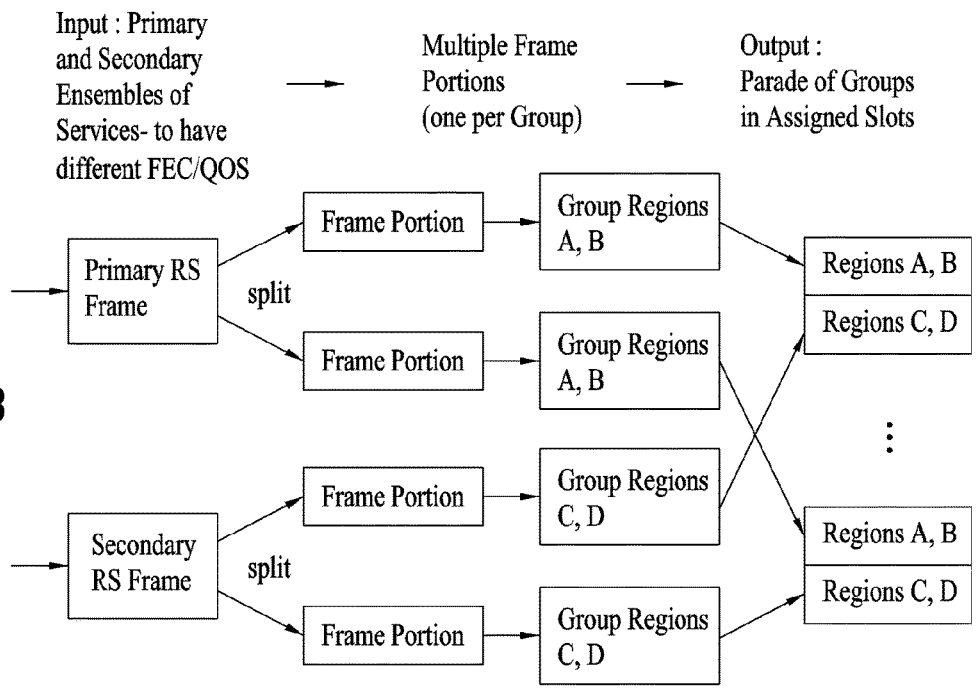

FIG. 18A and FIG. 18B illustrate a process of one or two RS frame being divided into several portions, based upon an RS frame mode value, and a process of each portion being assigned to a corresponding region within the respective data group. According to an embodiment of the present invention, the data assignment within the data group is performed by the group formatter 303.

More specifically, FIG. 18A shows an example of the RS frame mode value being equal to '00'. Herein, only the primary encoder 410 of FIG. 17 operates, thereby forming one RS frame for one parade. Then, the RS frame is divided into several portions, and the data of each portion are assigned to regions A/B/C/D within the respective data group.

FIG. 18B shows an example of the RS frame mode value being equal to '01'. Herein, both the primary encoder 410 and the secondary encoder 420 of FIG. 17 operate, thereby forming two RS frames for one parade, i.e., one primary RS frame and one secondary RS frame. Then, the primary RS frame is divided into several portions, and the secondary RS frame is divided into several portions. At this point, the data of each portion of the primary RS frame are assigned to regions A/B within the respective data group. And, the data of each portion of the secondary RS frame are assigned to regions C/D within the respective data group.

Detailed Description of the RS Frame

Figure 19A:
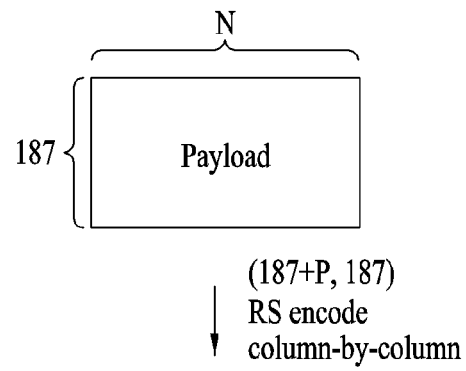
FIG. 19A to FIG. 19C illustrate error correction encoding and error detection encoding processes according to an embodiment of the present invention.

FIG. 19A illustrates an example of an RS frame being generated from the RS-CRC encoder 412 according to the present invention.

When the RS frame payload is formed, as shown in FIG. 19A, the RS-CRC encoder 412 performs a (Nc,Kc)–RS encoding process on each column, so as to generate Nc−Kc (=P) number of parity bytes. Then, the RS-CRC encoder 412 adds the newly generated P number of parity bytes after the very last byte of the corresponding column, thereby creating a column of (187+P) bytes.

Herein, as shown in FIG. 19A, Kc is equal to 187 (i.e., Kc=187), and Nc is equal to 187+P (i.e., Nc=187+P).

Herein, the value of P may vary depending upon the RS code mode. Table 6 below shows an example of an RS code mode, as one of the RS encoding information.

TABLE 6

| RS code mode | RS code | Number of Parity Bytes (P) |
|---|---|---|
| 00 | (211, 187) | 24 |
| 01 | (223, 187) | 36 |
| 10 | (235, 187) | 48 |
| 11 | Reserved | Reserved |

Table 6 shows an example of 2 bits being assigned in order to indicate the RS code mode. The RS code mode represents the number of parity bytes corresponding to the RS frame payload.

For example, when the RS code mode value is equal to '10', (235,187)-RS-encoding is performed on the RS frame payload of FIG. 19A, so as to generate 48 parity data bytes. Thereafter, the 48 parity bytes are added after the last data byte of the corresponding column, thereby creating a column of 235 data bytes.

When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

Figure 19B:
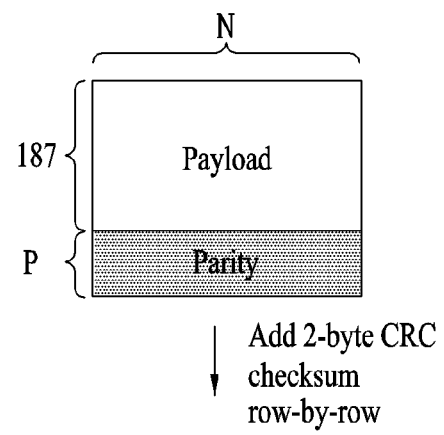

When such RS encoding process is performed on all N number of columns, a size of N(row)×(187+P)(column) bytes may be generated, as shown in FIG. 19B.

Each row of the RS frame payload is configured of N bytes. However, depending upon channel conditions between the transmitting system and the receiving system, error may be included in the RS frame payload. When errors occur as described above, CRC data (or CRC code or CRC checksum) may be used on each row unit in order to verify whether error exists in each row unit.

The RS-CRC encoder 412 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system.

Figure 19C:
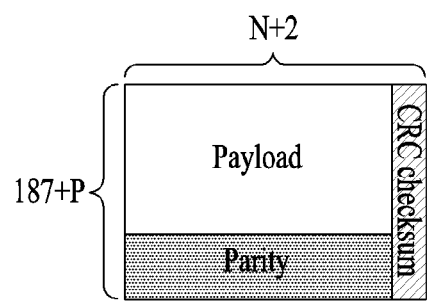

FIG. 19C illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes.

Equation 3 below corresponds to an exemplary equation for generating a 2-byte CRC checksum for each row being configured of N number of bytes.

$$g(x)=x^{16}+x^{12}+x^5+1 \qquad \text{Equation 3}$$

The process of adding a 2-byte checksum in each row is only exemplary. Therefore, the present invention is not limited only to the example proposed in the description set forth herein.

As described above, when the process of RS encoding and CRC encoding are completed, the (N×187)-byte RS frame payload is converted into a (N+2)×(187+P)-byte RS frame.

Based upon an error correction scenario of a RS frame formed as described above, the data bytes within the RS frame are transmitted through a channel in a row direction. At this point, when a large number of errors occur during a limited period of transmission time, errors also occur in a row direction within the RS frame being processed with a decoding process in the receiving system. However, in the perspective of RS encoding performed in a column direction, the errors are shown as being scattered. Therefore, error correction may be performed more effectively. At this point, a method of increasing the number of parity data bytes (P) may be used in order to perform a more intense error correction process. However, using this method may lead to a decrease in transmission efficiency. Therefore, a mutually advantageous method is required. Furthermore, when performing the decoding process, an erasure decoding process may be used to enhance the error correction performance.

The above description of the present invention corresponds to the processes of forming (or creating) and encoding an RS frame, when a data group is divided into regions A/B/C/D, and when data of an RS frame are assigned to all of regions A/B/C/D within a plurality of data groups. More specifically, the above description corresponds to an embodiment of the present invention, wherein one RS frame is transmitted using one parade. In this embodiment, the secondary encoder 420 does not operate (or is not active).

Meanwhile, 2 RS frames are transmitting using one parade, the data of the primary RS frame may be assigned to regions A/B within the data groups and be transmitted, and the data of the secondary RS frame may be assigned to regions C/D within the data groups and be transmitted. At this point, the primary encoder 410 receives the mobile service data that are to be assigned to regions A/B within the data groups, forms the primary RS frame payload, and then performs RS-encoding and CRC-encoding on the primary RS frame payload, thereby forming the primary RS frame. Similarly, the secondary encoder 420 receives the mobile service data that are to be assigned to regions C/D within the data groups, forms the secondary RS frame payload, and then performs RS-encoding and CRC-encoding on the secondary RS frame payload thereby forming the secondary RS frame. More specifically, the primary RS frame and the secondary RS frame are generated independently.

Figure 20A:
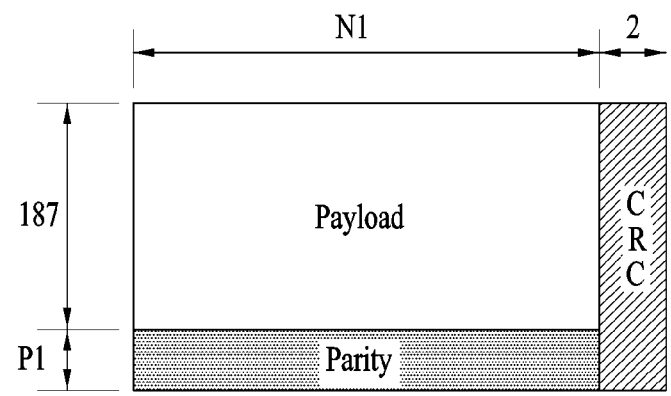
FIG. 20A and FIG. 20B illustrate an example which a parade configures of two RS frames
Figure 20B:
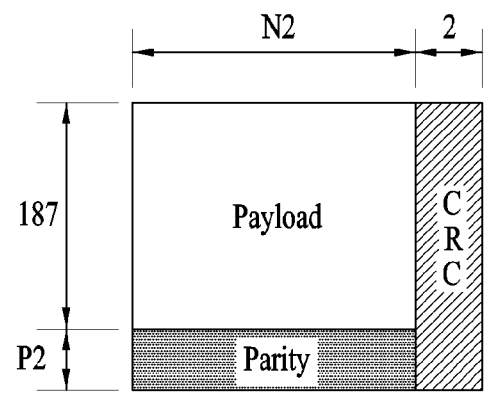

FIG. 20A and FIG. 20B illustrate examples of receiving the mobile service data that are to be assigned to regions A/B within the data group, so as to form the primary RS frame payload, and receives the mobile service data that are to be assigned to regions C/D within the data group, so as to form the secondary RS frame payload, thereby performing error correction encoding and error detection encoding on each of the first and secondary RS frame payloads.

More specifically, FIG. 20A illustrates an example of the RS-CRC encoder 412 of the primary encoder 410 receiving mobile service data of the primary ensemble that are to be assigned to regions A/B within the corresponding data group, so as to create an RS frame payload having the size of N1(row)×187(column). Then, in this example, the primary encoder 410 performs RS-encoding on each column of the RS frame payload created as described above, thereby adding P1 number of parity data bytes in each column. Finally, the primary encoder 410 performs CRC-encoding on each row, thereby adding a 2-byte checksum in each row, thereby forming a primary RS frame.

FIG. 20B illustrates an example of the RS-CRC encoder 422 of the secondary encoder 420 receiving mobile service data of the secondary ensemble that are to be assigned to regions C/D within the corresponding data group, so as to create an RS frame payload having the size of N2(row)×187(column). Then, in this example, the secondary encoder 420 performs RS-encoding on each column of the RS frame payload created as described above, thereby adding P2 number of parity data bytes in each column. Finally, the secondary encoder 420 performs CRC-encoding on each row, thereby adding a 2-byte checksum in each row, thereby forming an secondary RS frame.

At this point, each of the RS-CRC encoders 412 and 422 performs RS frame configuration, error correction encoding, error detection encoding by referring to a transmission parameter, for example, at least one of M/H frame information, FIC information, RS frame information (including RS frame mode information), RS encoding information (including RS code mode information), SCCC information (including SCCC block mode information and SCCC outer code mode information). Furthermore, the transmission parameters should also be transmitted to the receiving system so that the receiving system can perform a normal decoding process. At this point, as an example of the present invention, the transmission parameter is transmitted through transmission parameter channel (TPC) to a receiving system. The TPC will be described in detail in a later.

The data of the primary RS frame, which is encoded by RS frame units by the RS-CRC encoder 412 of the primary encoder 410, are outputted to the RS frame divider 413. If the secondary encoder 420 also operates in the embodiment of the present invention, the data of the secondary RS frame, which is encoded by RS frame units by the RS-CRC encoder 422 of the secondary encoder 420, are outputted to the RS frame divider 423.

The RS frame divider 413 of the primary encoder 410 divides the primary RS frame into several portions, which are then outputted to the output multiplexer (MUX) 320. Each portion of the primary RS frame is equivalent to a data amount that can be transmitted by one data group. Similarly, the RS frame divider 423 of the secondary encoder 420 divides the secondary RS frame into several portions, which are then outputted to the output multiplexer (MUX) 320.

Hereinafter, the RS frame divider 413 of the primary RS encoder 410 will now be described in detail. Also, in order to simplify the description of the present invention, it is assumed that an RS frame payload having the size of N(row)×187(column), as shown in FIG. 19A to FIG. 19C, that P number of parity data bytes are added to each column by RS-encoding the RS frame payload, and that a 2-byte checksum is added to each row by CRC-encoding the RS frame payload. As a result, an RS frame having the size of (N+2) (row)×187+P (column) is formed.

Accordingly, the RS frame divider 413 divides (or partitions) the RS frame having the size of (N+2) (row)×187+P (column) into several portions, each having the size of PL (wherein PL corresponds to the length of the RS frame portion).

At this point, as shown in Table 2 to Table 5, the value of PL may vary depending upon the RS frame mode, SCCC block mode, and SCCC outer coder mode. Also, the total number of data bytes of the RS-encoded and CRC-encoded RS frame is equal to or smaller than 5×NoG×PL. In this case, the RS frame is divided (or partitioned) into ((5× NoG)−1) number of portions each having the size of PL and one portion having a size equal to smaller than PL. More specifically, with the exception of the last portion of the RS frame, each of the remaining portions of the RS frame has an equal size of PL.

If the size of the last portion is smaller than PL, a stuffing byte (or dummy byte) may be inserted in order to fill (or replace) the lacking number of data bytes, thereby enabling the last portion of the RS frame to also be equal to PL.

Each portion of an RS frame corresponds to the amount of data that are to be SCCC-encoded and mapped into a single data group of a parade.

FIG. 21A and FIG. 21B respectively illustrate examples of adding S number of stuffing bytes, when an RS frame having the size of (N+2)(row)×(187+P)(column) is divided into 5×NoG number of portions, each having the size of PL.

More specifically, the RS-encoded and CRC-encoded RS frame, shown in FIG. 21A, is divided into several portions, as shown in FIG. 21B. The number of divided portions at the RS frame is equal to (5×NoG). Particularly, the first ((5× NoG)−1) number of portions each has the size of PL, and the last portion of the RS frame may be equal to or smaller than PL. If the size of the last portion is smaller than PL, a stuffing byte (or dummy byte) may be inserted in order to fill (or replace) the lacking number of data bytes, as shown in Equation 4 below, thereby enabling the last portion of the RS frame to also be equal to PL.

$$S=(5 \times NoG \times PL)-((N+2) \times (187+P)) \qquad \text{Equation 4}$$

Herein, each portion including data having the size of PL passes through the output multiplexer 320 of the M/H frame encoder 301, which is then outputted to the block processor 302.

At this point, the mapping order of the RS frame portions to a parade of data groups in not identical with the group assignment order defined in Equation 1. When given the group positions of a parade in an M/H frame, the SCCC-encoded RS frame portions will be mapped in a time order (i.e., in a left-to-right direction).

Block Processor

Meanwhile, the block processor 302 performs an SCCC outer encoding process on the output of the M/H frame encoder 301. More specifically, the block processor 302 receives the data of each error correction encoded portion. Then, the block processor 302 encodes the data once again at a coding rate of 1/H (wherein H is an integer equal to or greater than 2 (i.e., H≥2)), thereby outputting the 1/H-rate encoded data to the group formatter 303. According to the embodiment of the present invention, the input data are encoded either at a coding rate of 1/2 (also referred to as "1/2-rate encoding") or at a coding rate of 1/4 (also referred to as "1/4-rate encoding"). The data of each portion outputted from the M/H frame encoder 301 may include at least one of mobile service data, RS parity data, CRC data, and stuffing data. However, in a broader meaning, the data included in each portion may correspond to data for mobile services. Therefore, the data included in each portion will all be considered as mobile service data and described accordingly.

The group formatter 303 inserts the mobile service data SCCC-outer-encoded and outputted from the block processor 302 in the corresponding region within the data group, which is formed in accordance with a pre-defined rule. Also, in association with the data deinterleaving process, the group formatter 303 inserts various place holders (or known data place holders) in the corresponding region within the data group. Thereafter, the group formatter 303 deinterleaves the data within the data group and the place holders.

According to the present invention, with reference to data after being data-interleaved, as shown in FIG. 5, a data groups is configured of 10 M/H blocks (B1 to B10) and divided into 4 regions (A, B, C, and D).

Also, as shown in FIG. 5, when it is assumed that the data group is divided into a plurality of hierarchical regions, as described above, the block processor 302 may encode the mobile service data, which are to be inserted to each region based upon the characteristic of each hierarchical region, at different coding rates.

For example, the block processor 302 may encode the mobile service data, which are to be inserted in region A/B within the corresponding data group, at a coding rate of 1/2. Then, the group formatter 303 may insert the 1/2-rate encoded mobile service data to region A/B. Also, the block processor 302 may encode the mobile service data, which are to be inserted in region C/D within the corresponding data group, at a coding rate of 1/4 having higher (or stronger) error correction ability than the 1/2-coding rate. Thereafter, the group formatter 303 may insert the 1/2-rate encoded mobile service data to region C/D. In another example, the block processor 302 may encode the mobile service data, which are to be inserted in region C/D, at a coding rate having higher error correction ability than the 1/4-coding rate. Then, the group formatter 303 may either insert the encoded mobile service data to region C/D, as described above, or leave the data in a reserved region for future usage.

According to another embodiment of the present invention, the block processor 302 may perform a 1/H-rate encoding process in SCCC block units. Herein, the SCCC block includes at least one M/H block.

At this point, when 1/H-rate encoding is performed in M/H block units, the M/H blocks (B1 to B10) and the SCCC block (SCB1 to SCB10) become identical to one another (i.e., SCB1=B1, SCB2=B2, SCB3=B3, SCB4=B4, SCB5=B5, SCB6=B6, SCB7=B7, SCB8=B8, SCB9=B9, and SCB10=B10). For example, the M/H block (B1) may be encoded at the coding rate of 1/2, the M/H block 2 (B2) may be encoded at the coding rate of 1/4, and the M/H block 3 (B3) may be encoded at the coding rate of 1/2. The coding rates are applied respectively to the remaining M/H blocks.

Alternatively, a plurality of M/H blocks within regions A, B, C, and D may be grouped into one SCCC block, thereby being encoded at a coding rate of 1/H in SCCC block units. Accordingly, the receiving performance of region C/D may be enhanced. For example, M/H block 1 (B1) to M/H block 5 (B5) may be grouped into one SCCC block and then encoded at a coding rate of 1/2. Thereafter, the group formatter 303 may insert the 1/2-rate encoded mobile service data to a section starting from M/H block 1 (B1) to M/H block 5 (B5).

Furthermore, M/H block 6 (B6) to M/H block 10 (B10) may be grouped into one SCCC block and then encoded at a coding rate of 1/4. Thereafter, the group formatter 303 may insert the 1/4-rate encoded mobile service data to another section starting from M/H block 6 (B6) to M/H block 10 (B10). In this case, one data group may consist of two SCCC blocks.

According to another embodiment of the present invention, one SCCC block may be formed by grouping two M/H blocks. For example, M/H block 1 (B1) and M/H block 6 (B6) may be grouped into one SCCC block (SCB1). Similarly, M/H block 2 (B2) and M/H block 7 (B7) may be grouped into another SCCC block (SCB2). Also, M/H block 3 (B3) and M/H block 8 (B8) may be grouped into another SCCC block (SCB3). And, M/H block 4 (B4) and M/H block 9 (B9) may be grouped into another SCCC block (SCB4). Furthermore, M/H block 5 (B5) and M/H block 10 (B10) may be grouped into another SCCC block (SCB5). In the above-described example, the data group may consist of 10 M/H blocks and 5 SCCC blocks. Accordingly, in a data (or signal) receiving environment undergoing frequent and severe channel changes, the receiving performance of regions C and D, which is relatively more deteriorated than the receiving performance of region A, may be reinforced. Furthermore, since the number of mobile service data symbols increases more and more from region A to region D, the error correction encoding performance becomes more and more deteriorated. Therefore, when grouping a plurality of M/H block to form one SCCC block, such deterioration in the error correction encoding performance may be reduced.

As described-above, when the block processor 302 performs encoding at a 1/H-coding rate, information associated with SCCC should be transmitted to the receiving system in order to accurately recover the mobile service data.

Table 7 below shows an example of a SCCC block mode, which indicating the relation between an M/H block and an SCCC block, among diverse SCCC block information.

TABLE 7

| | SCCC Block Mode | | |
|---|---|---|---|
| 00 | 01 | 10 | 11 |
| | Description | | |
| One M/H Block per SCCC Block | Two M/H Blocks per SCCC Block SCB | Reserved | Reserved |
| | | | |
| | SCB input, M/H Block | SCB input, M/H Blocks | |
| SCB1 | B1 | B1 + B6 | |
| SCB2 | B2 | B2 + B7 | |
| SCB3 | B3 | B3 + B8 | |
| SCB4 | B4 | B4 + B9 | |
| SCB5 | B5 | B5 + B10 | |
| SCB6 | B6 | — | |
| SCB7 | B7 | — | |
| SCB8 | B8 | — | |
| SCB9 | B9 | — | |
| SCB10 | B10 | — | |

More specifically, Table 4 shows an example of 2 bits being allocated in order to indicate the SCCC block mode. For example, when the SCCC block mode value is equal to '00', this indicates that the SCCC block and the M/H block are identical to one another. Also, when the SCCC block mode value is equal to '01', this indicates that each SCCC block is configured of 2 M/H blocks.

As described above, if one data group is configured of 2 SCCC blocks, although it is not indicated in Table 7, this information may also be indicated as the SCCC block mode. For example, when the SCCC block mode value is equal to '10', this indicates that each SCCC block is configured of 5 M/H blocks and that one data group is configured of 2 SCCC blocks. Herein, the number of M/H blocks included in an SCCC block and the position of each M/H block may vary depending upon the settings made by the system designer. Therefore, the present invention will not be limited to the examples given herein. Accordingly, the SCCC mode information may also be expanded.

An example of a coding rate information of the SCCC block, i.e., SCCC outer code mode, is shown in Table 8 below.

TABLE 8

| SCCC outer code mode (2 bits) | Description |
|---|---|
| 00 | Outer code rate of SCCC block is ½ rate |
| 01 | Outer code rate of SCCC block is ¼ rate |
| 10 | Reserved |
| 11 | Reserved |

More specifically, Table 8 shows an example of 2 bits being allocated in order to indicate the coding rate information of the SCCC block. For example, when the SCCC outer code mode value is equal to '00', this indicates that the coding rate of the corresponding SCCC block is 1/2. And, when the SCCC outer code mode value is equal to '01', this indicates that the coding rate of the corresponding SCCC block is 1/4.

If the SCCC block mode value of Table 7 indicates '00', the SCCC outer code mode may indicate the coding rate of each M/H block with respect to each M/H block. In this case, since it is assumed that one data group includes 10 M/H blocks and that 2 bits are allocated for each SCCC block mode, a total of 20 bits are required for indicating the SCCC block modes of the 10 M/H modes.

In another example, when the SCCC block mode value of Table 7 indicates '00', the SCCC outer code mode may indicate the coding rate of each region with respect to each region within the data group. In this case, since it is assumed that one data group includes 4 regions (i.e., regions A, B, C, and D) and that 2 bits are allocated for each SCCC block mode, a total of 8 bits are required for indicating the SCCC block modes of the 4 regions.

In another example, when the SCCC block mode value of Table 7 is equal to '01', each of the regions A, B, C, and D within the data group has the same SCCC outer code mode.

Meanwhile, an example of an SCCC output block length (SOBL) for each SCCC block, when the SCCC block mode value is equal to '00', is shown in Table 9 below.

TABLE 9

| | | SIBL | |
|---|---|---|---|
| SCCC Block | SOBL | ½ rate | ¼ rate |
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

More specifically, when given the SCCC output block length (SOBL) for each SCCC block, an SCCC input block length (SIBL) for each corresponding SCCC block may be decided based upon the outer coding rate of each SCCC block. The SOBL is equivalent to the number of SCCC output (or outer-encoded) bytes for each SCCC block. And, the SIBL is equivalent to the number of SCCC input (or payload) bytes for each SCCC block.

Table 10 below shows an example of the SOBL and SIBL for each SCCC block, when the SCCC block mode value is equal to '01'.

TABLE 10

| | | SIBL | |
|---|---|---|---|
| SCCC Block | SOBL | ½ rate | ¼ rate |
| SCB1 (B1 + B6) | 528 | 264 | 132 |
| SCB2 (B2 + B7) | 1536 | 768 | 384 |
| SCB3 (B3 + B8) | 2376 | 1188 | 594 |
| SCB4 (B4 + B9) | 2388 | 1194 | 597 |
| SCB5 (B5 + B10) | 2772 | 1386 | 693 |

Figure 22:
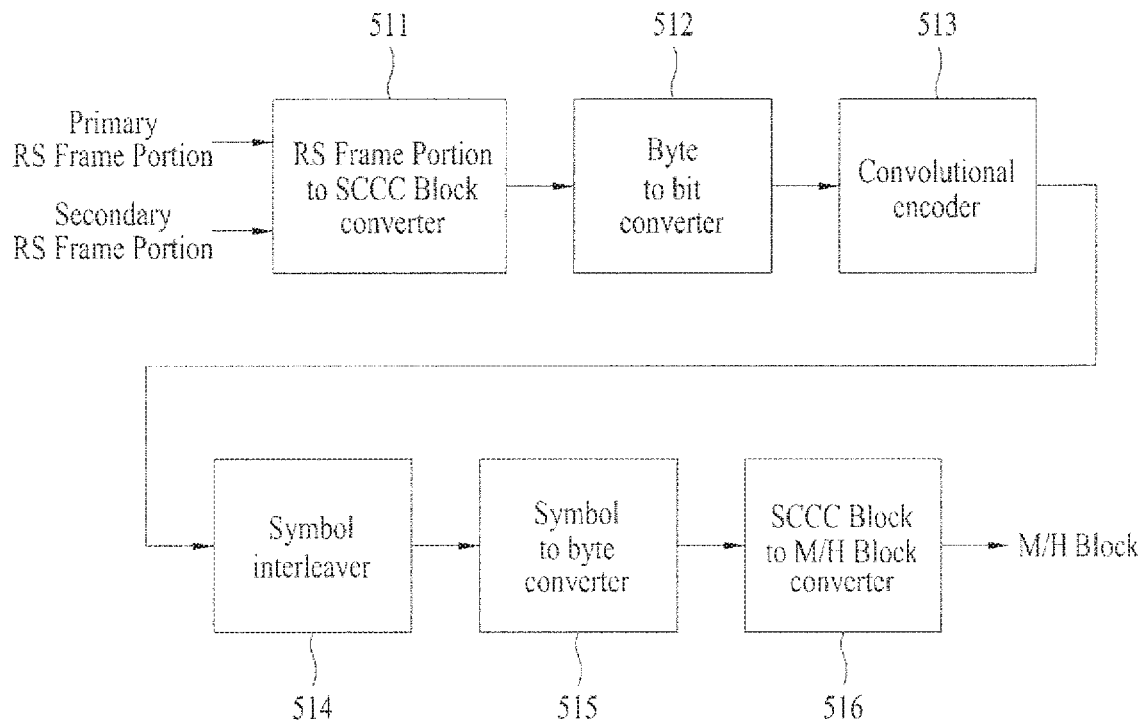
FIG. 22 illustrates a block diagram of a block processor according to an embodiment of the present invention.

In order to do so, as shown in FIG. 22, the block processor 302 includes a RS frame portion-SCCC block converter 511, a byte-bit converter 512, a convolution encoder 513, a symbol interleaver 514, a symbol-byte converter 515, and an SCCC block-M/H block converter 516.

The convolutional encoder 513 and the symbol interleaver 514 are virtually concatenated with the trellis encoding module in the post-processor in order to configure an SCCC block.

More specifically, the RS frame portion-SCCC block converter 511 divides the RS frame portions, which are being inputted, into multiple SCCC blocks using the SIBL of Table 9 and Table 10 based upon the RS code mode, SCCC block mode, and SCCC outer code mode. Herein, the M/H frame encoder 301 may output only primary RS frame portions or both primary RS frame portions and secondary RS frame portions in accordance with the RS frame mode.

When the RS Frame mode is set to '00', a portion of the primary RS Frame equal to the amount of data, which are to be SCCC outer encoded and mapped to 10 M/H blocks (B1 to B10) of a data group, will be provided to the block processor 302. When the SCCC block mode value is equal to '00', then the primary RS frame portion will be split into 10 SCCC Blocks according to Table 9. Alternatively, when the SCCC block mode value is equal to '01', then the primary RS frame will be split into 5 SCCC blocks according to Table 10. When the RS frame mode value is equal to '01', then the block processor 302 may receive two RS frame portions. The RS frame mode value of '01' will not be used with the SCCC block mode value of '01'. The first portion from the primary RS frame will be SCCC-outer-encoded as SCCC Blocks SCB3, SCB4, SCB5, SCB6, SCB7, and SCB8 by the block processor 302. The SCCC Blocks SCB3 and SCB8 will be mapped to region B and the SCCC blocks SCB4, SCB5, SCB6, and SCB7 shall be mapped to region A by the group formatter 303. The second portion from the secondary RS frame will also be SCCC-outer-encoded, as SCB1, SCB2, SCB9, and SCB10, by the block processor 302. The group formatter 303 will map the SCCC blocks SCB1 and SCB10 to region D as the M/H blocks B1 and B10, respectively. Similarly, the SCCC blocks SCB2 and SCB9 will be mapped to region C as the M/H blocks B2 and B9.

The byte-bit converter 512 identifies the mobile service data bytes of each SCCC block outputted from the RS frame portion-SCCC block converter 511 as data bits, which are then outputted to the convolution encoder 513.

The convolution encoder 513 performs one of 1/2-rate encoding and 1/4-rate encoding on the inputted mobile service data bits.

Figure 23:
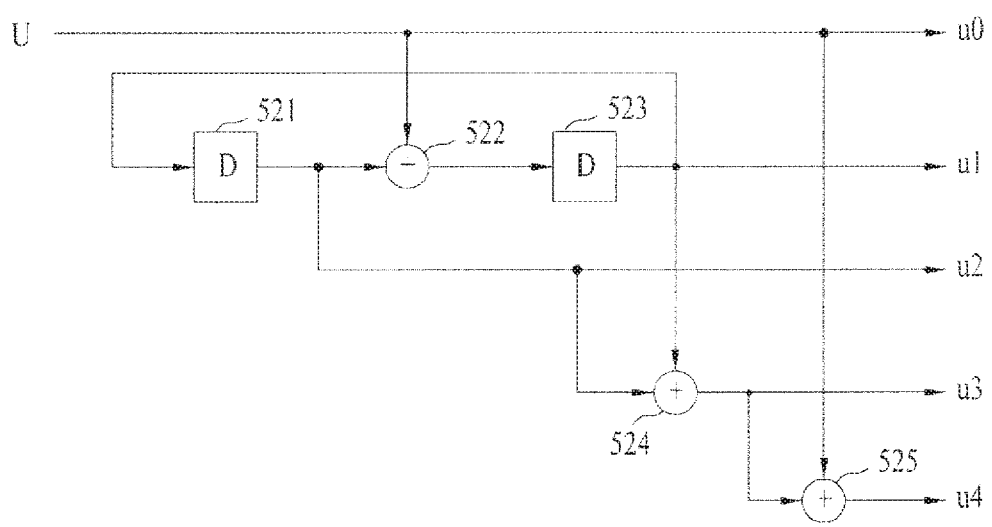
FIG. 23 illustrates a detailed block diagram of a convolution encoder of the block processor.

FIG. 23 illustrates a detailed block diagram of the convolution encoder 513. The convolution encoder 513 includes two delay units 521 and 523 and three exclusive-or gates 522, 524, and 525. Herein, the convolution encoder 513 encodes an input data bit U and outputs the coded bit U to 5 bits (u0 to u4).

At this point, the input data bit U is directly outputted as uppermost bit u0 and simultaneously encoded as lower bit u1u2u3u4 and then outputted. More specifically, the input data bit U is directly outputted as the uppermost bit u0 and simultaneously outputted to the first and third exclusive-or gates 522 and 525. The first exclusive-or gate 522 performs exclusive-or operation on the input data bit U and the output bit of the first delay unit 521 and, then, outputs to the second delay unit 523. Then, the data bit delayed by a pre-determined time (e.g., by 1 clock) in the second delay unit 523 is outputted as a lower bit u1 and simultaneously fed-back to the first delay unit 521. The first delay unit 521 delays the data bit fed-back from the second delay unit 523 by a pre-determined time (e.g., by 1 clock). Then, the first delay unit 521 outputs the delayed data bit as a lower bit u2 and, at the same time, outputs the fed-back data to the first exclusive-or gate 522 and the second exclusive-or gate 524.

The second exclusive-or gate 524 performs exclusive-or operation on the data bits outputted from the first and second delay units 521 and 523 and outputs as a lower bit u3. The third exclusive-or gate 525 performs on exclusive-or operation on the input data bit U and the output of the second delay unit 523 and outputs as a lower bit u4.

At this point, the first and second delay units 521 and 523 are reset to '0', at the starting point of each SCCC block. The convolution encoder 513 of FIG. 23 may be used as a 1/2-rate encoder or a 1/4-rate encoder.

More specifically, when a portion of the output bit of the convolution encoder 513, shown in FIG. 23, is selected and outputted, the convolution encoder 513 may be used as one of a 1/2-rate encoder and a 1/4-rate encoder.

Table 11 below shown an example of output symbols of the convolution encoder 513.

TABLE 11

| | | 1/4 rate | |
|---|---|---|---|
| Region | 1/2 rate | SCCC block mode = '00' | SCCC block mode = '01' |
| A, B | (u0, u1) | (u0, u2), (u1, u3) | (u0, u2), (u1, u4) |
| C, D | | (u0, u1), (u3, u4) | |

For example, at the 1/2-coding rate, 1 output symbol (i.e., u0 and u1 bits) may be selected and outputted. And, at the 1/4-coding rate, depending upon the SCCC block mode, 2 output symbols (i.e., 4 bits) may be selected and outputted. For example, when the SCCC block mode value is equal to '01', and when an output symbol configured of u0 and u2 and another output symbol configured of u1 and u4 are selected and outputted, a 1/4-rate coding result may be obtained.

The mobile service data encoded at the coding rate of 1/2 or 1/4 by the convolution encoder 513 are outputted to the symbol interleaver 514.

The symbol interleaver 514 performs block interleaving, in symbol units, on the output data symbol of the convolution encoder 513. More specifically, the symbol interleaver 514 is a type of block interleaver. Any interleaver performing structural rearrangement (or realignment) may be applied as the symbol interleaver 514 of the block processor. However, in the present invention, a variable length symbol interleaver that can be applied even when a plurality of lengths is provided for the symbol, so that its order may be rearranged, may also be used.

Figure 30:
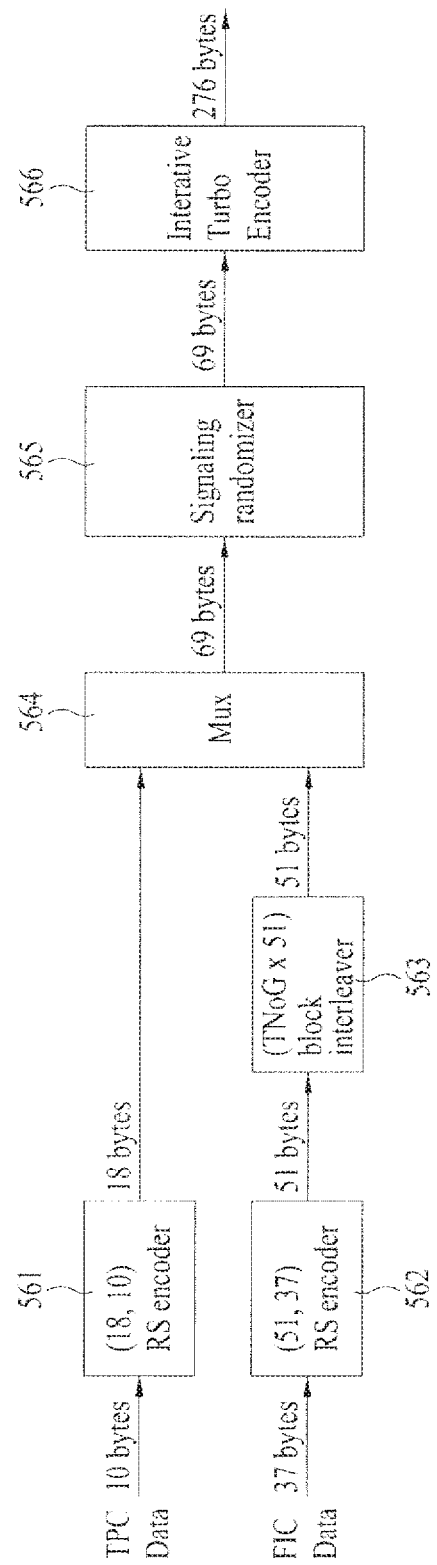
FIG. 30 illustrates a detailed block diagram of a signaling encoder according to the present invention.

FIG. 24 illustrates a symbol interleaver according to an embodiment of the present invention. Particularly, FIG. 30 illustrates an example of the symbol interleaver when B=2112 and L=4096.

Herein, B indicates a block length in symbols that are outputted for symbol interleaving from the convolution encoder 513. And, L represents a block length in symbols that are actually interleaved by the symbol interleaver 514. At this point, the block length in symbols B inputted to the symbol interleaver 514 is equivalent to 4×SOBL. More specifically, since one symbol is configured of 2 bits, the value of B may be set to be equal to 4×SOBL.

In the present invention, when performing the symbol-interleaving process, the conditions of $L=2^m$ (wherein m is an integer) and of $L \geq B$ should be satisfied. If there is a difference in value between B and L, (L−B) number of null (or dummy) symbols is added, thereby creating an interleaving pattern, as shown in P'(i) of FIG. 24.

Therefore, B becomes a block size of the actual symbols that are inputted to the symbol interleaver 514 in order to be interleaved. L becomes an interleaving unit when the interleaving process is performed by an interleaving pattern created from the symbol interleaver 514.

Equation 5 shown below describes the process of sequentially receiving B number of symbols, the order of which is to be rearranged, and obtaining an L value satisfying the conditions of $L=2^m$ (wherein m is an integer) and of $L \geq B$, thereby creating the interleaving so as to realign (or rearrange) the symbol order.

Equation 5

In relation to all places, wherein $0 \leq i \leq B-1$, $$P'(i)=\{89 \times i \times (i+1)/2\} \bmod L$$

Herein, $L \geq B$, $L=2^m$, wherein m is an integer.

As shown in P'(i) of FIG. 24 and Equation 5, the order of B number of input symbols and (L-B) number of null symbols is rearranged by using the above-mentioned Equation 6. Then, as shown in P(i) of FIG. 24, the null byte places are removed, so as to rearrange the order. Starting with the lowest value of i, the P(i) are shifted to the left in order to fill the empty entry locations. Thereafter, the symbols of the aligned interleaving pattern P(i) are outputted to the symbol-byte converter 515 in order.

Herein, the symbol-byte converter 515 converts to bytes the mobile service data symbols, having the rearranging of the symbol order completed and then outputted in accordance with the rearranged order, and thereafter outputs the converted bytes to the SCCC block-M/H block converter 516. The SCCC block-M/H block converter 516 converts the symbol-interleaved SCCC blocks to M/H blocks, which are then outputted to the group formatter 303.

If the SCCC block mode value is equal to '00', the SCCC block is mapped at a one-to-one (1:1) correspondence with each M/H block within the data group. In another example, if the SCCC block mode value is equal to '01', each SCCC block is mapped with two M/H blocks within the data group. For example, the SCCC block SCB1 is mapped with (B1, B6), the SCCC block SCB2 is mapped with (B2, B7), the SCCC block SCB3 is mapped with (B3, B8), the SCCC block SCB4 is mapped with (B4, B9), and the SCCC block SCB5 is mapped with (B5, B10). The M/H block that is outputted from the SCCC block-M/H block converter 516 is configured of mobile service data and FEC redundancy. In the present invention, the mobile service data as well as the FEC redundancy of the M/H block will be collectively considered as mobile service data.

Group Formatter

The group formatter 303 inserts data of M/H blocks outputted from the block processor 302 to the corresponding M/H blocks within the data group, which is formed in accordance with a pre-defined rule. Also, in association with the data-deinterleaving process, the group formatter 303 inserts various place holders (or known data place holders) in the corresponding region within the data group.

More specifically, apart from the encoded mobile service data outputted from the block processor 302, the group formatter 303 also inserts MPEG header place holders, non-systematic RS parity place holders, main service data place holders, which are associated with the data deinterleaving in a later process, as shown in FIG. 5. Herein, the main service data place holders are inserted because the mobile service data bytes and the main service data bytes are alternately mixed with one another in regions B to D based upon the input of the data deinterleaver, as shown in FIG. 5. For example, based upon the data outputted after data deinterleaving, the place holder for the MPEG header may be allocated at the very beginning of each packet. Also, in order to configure an intended group format, dummy bytes may also be inserted. Furthermore, the group formatter 303 inserts initialization data (i.e., trellis initialization byte) of the trellis encoding module 256 in the corresponding regions. For example, the initialization data may be inserted in the beginning of the known data sequence. The initialization data is used for initializing memories within the trellis encoding module 256, and is not transmitted to the receiving system.

Additionally, the group formatter 303 may also insert signaling information, which are encoded and outputted from the signaling encoder 304, in corresponding regions within the data group.

At this point, reference may be made to the signaling information when the group formatter 303 inserts each data type and respective place holders in the data group. The process of encoding the signaling information and inserting the encoded signaling information to the data group will be described in detail in a later process.

Figure 25:
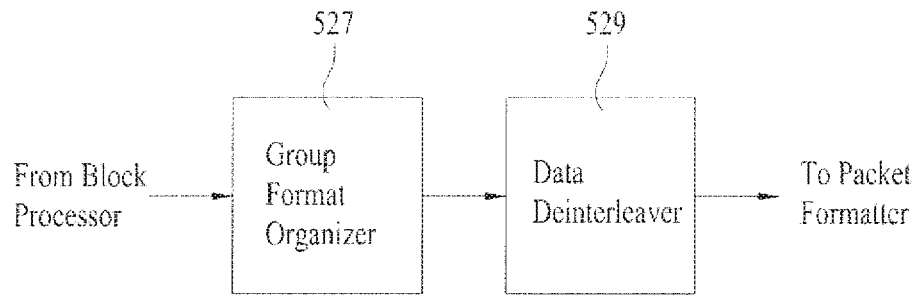
FIG. 25 illustrates a block diagram of a group formatter according to an embodiment of the present invention.

After inserting each data type and respective place holders in the data group, the group formatter 303 may deinterleave the data and respective place holders, which have been inserted in the data group, as an inverse process of the data interleaver, thereby outputting the deinterleaved data and respective place holders to the packet formatter 305. The group formatter 303 may include a group format organizer 527, and a data deinterleaver 529, as shown in FIG. 25. The group format organizer 527 inserts data and respective place holders in the corresponding regions within the data group, as described above. And, the data deinterleaver 529 deinterleaves the inserted data and respective place holders as an inverse process of the data interleaver.

The packet formatter 305 removes the main service data place holders and the RS parity place holders and replaces the MPEG header place holders with MPEG header that were allocated for the deinterleaving process from the deinterleaved data being inputted.

Also, when the group formatter 303 inserts known data place holders, the packet formatter 303 may insert actual known data in the known data place holders, or may directly output the known data place holders without any modification in order to make replacement insertion in a later process.

Thereafter, the packet formatter 305 identifies the data within the packet-formatted data group, as described above, as a 188-byte unit mobile service data packet (i.e., MPEG TS packet), which is then provided to the packet multiplexer 240.

The packet multiplexer 240 multiplexes the mobile service data packets packet-formatted and outputted from the packet formatter 306 and main service data packets outputted from the packet jitter mitigator 220. Then, the packet multiplexer 240 outputs the multiplexed data packets to the data randomizer 251 of the post-processor 250. If the packet multiplexer 240 receives 118 mobile service data packets from the packet formatter 305, 37 mobile service data packets are placed before a place for inserting VSB field synchronization. Then, the remaining 81 mobile service data packets are placed after the place for inserting VSB field synchronization. The multiplexing method may be adjusted by diverse variables of the system design. The multiplexing method and multiplexing rule of the packet multiplexer 240 will be described in more detail in a later process.

Also, since a data group including mobile service data in-between the data bytes of the main service data is multiplexed (or allocated) during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet.

Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data in the object decoder is relatively small, the packet jitter may cause considerable problem.

More specifically, due to the packet jitter, an overflow or underflow may occur in the buffer for the main service data of the receiving system (e.g., the buffer for the audio data).

Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible.

Additionally, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted. In the example of the present invention, the packet jitter mitigator 220 also performs the operation of modifying the PCR value.

The output of the packet jitter mitigator 220 is inputted to the packet multiplexer 240. As described above, the packet multiplexer 240 multiplexes the main service data packets outputted from the packet jitter mitigator 220 with the mobile service data packets outputted from the pre-processor 230 into a burst structure in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer and outputs to the RS encoder/non-systematic RS encoder 252. More specifically, all data bytes of the main service data packet are randomized by using a pseudo random byte generated from the data randomizer 251. Thereafter, the randomized data are outputted to the RS encoder/non-systematic RS encoder 252. On the other hand, if the inputted data correspond to the mobile service data packet, the data randomizer 251 performs randomizing only MPEG header byte of the mobile service data packet and outputs to the RS encoder/non-systematic RS encoder 252. The randomizing of the mobile service data included in the mobile service data packet was performed by the data randomizer 411 of the primary encoder 410 and/or the data randomizer 422 of the secondary encoder 420.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver.

The output of the data interleaver 253 is inputted to the parity replacer 254 and to the non-systematic RS encoder 255.

Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded.

At this point, the beginning portion of the known data sequence that is received corresponds to the initialization data (i.e., trellis initialization data bytes) and not to the actual known data. Herein, the initialization data has been included in the data by the group formatter within the pre-processor 230 in an earlier process. Therefore, the process of replacing the initialization data with memory values within the trellis encoding module 256 are required to be performed immediately before the inputted known data sequence is trellis-encoded.

More specifically, the initialization data are replaced with the memory value within the trellis encoding module 256, thereby being inputted to the trellis encoding module 256. At this point, the memory value replacing the initialization data are process with (or calculated by) an exclusive OR (XOR) operation with the respective memory value within the trellis encoding module 256, so as to be inputted to the corresponding memory. Therefore, the corresponding memory is initialized to '0'. Additionally, a process of using the memory value replacing the initialization data to re-calculate the RS parity, so that the re-calculated RS parity value can replace the RS parity being outputted from the data interleaver 253, is also required.

Therefore, the non-systematic RS encoder 255 receives the mobile service data packet including the initialization data from the data interleaver 253 and also receives the memory value from the trellis encoding module 256. Among the inputted mobile service data packet, the initialization data are replaced with the memory value, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data that are to be replaced, is inputted, the parity replacer 254 selects the data and RS parity that are outputted from the data interleaver 253. Then, the parity replacer 254 directly outputs the selected data to the trellis encoding module 256 without any modification.

The trellis encoding module 256 converts the byte-unit data to symbol units and performs a 12-way interleaving process so as to trellis-encode the received data. Thereafter, the processed data are outputted to the synchronization multiplexer 260.

Figure 26:
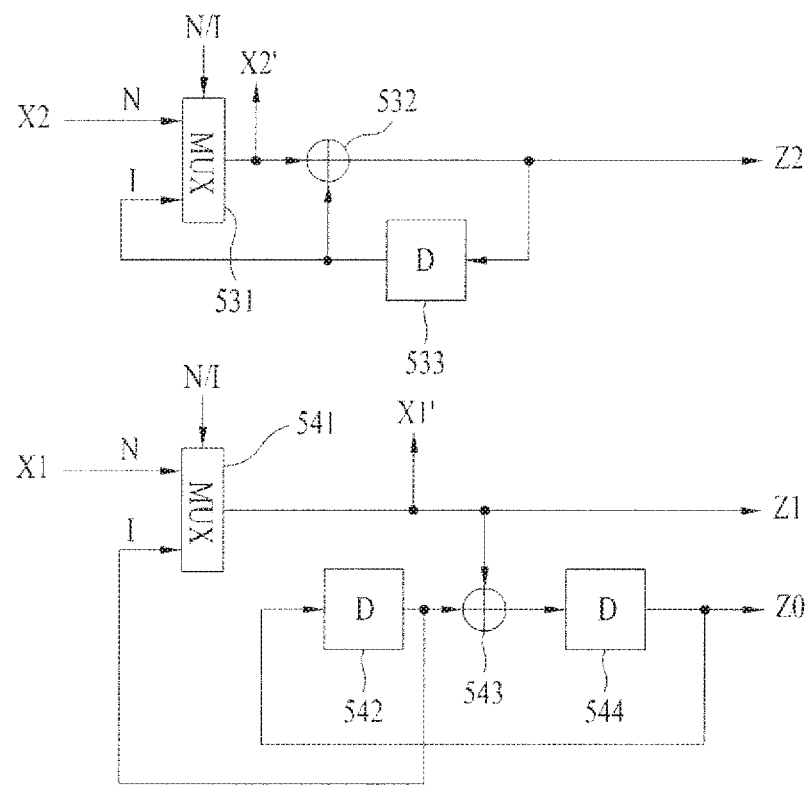
FIG. 26 illustrates a block diagram of a trellis encoder according to an embodiment of the present invention.

FIG. 26 illustrates a detailed diagram of one of 12 trellis encoders included in the trellis encoding module 256. Herein, the trellis encoder includes first and second multiplexers 531 and 541, first and second exclusive OR (XOR) gates 532 and 542, and first to third memories 533, 542, and 544.

More specifically, the first to third memories 533, 542, and 544 are initialized by the memory value instead of the initialization data from the parity replacer 254. More specifically, when the first symbol (i.e., two bits), which are converted from initialization data (i.e., each trellis initialization data byte), are inputted, the input bits of the trellis encoder will be replaced by the memory values of the trellis encoder, as shown in FIG. 26.

Since 2 symbols (i.e., 4 bits) are required for trellis initialization, the last 2 symbols (i.e., 4 bits) from the trellis initialization bytes are not used for trellis initialization and are considered as a symbol from a known data byte and processed accordingly.

When the trellis encoder of FIG. 26 is in the initialization mode, the input comes from an internal trellis status (or state) and not from the parity replacer 254. When the trellis encoder is in the normal mode, the input symbol (X2X1) provided from the parity replacer 254 will be processed. The trellis encoder provides the converted (or modified) input data for trellis initialization to the non-systematic RS encoder 255.

More specifically, when a selection signal designates a normal mode, the first multiplexer 531 selects an upper bit X2 of the input symbol. And, when a selection signal designates an initialization mode, the first multiplexer 531 selects the output of the first memory 533 and outputs the selected output data to the first XOR gate 532. The first XOR gate 532 performs XOR operation on the output of the first multiplexer 531 and the output of the first memory 533, thereby outputting the added result to the first memory 533 and, at the same time, as a most significant (or uppermost) bit Z2. The first memory 533 delays the output data of the first XOR gate 532 by 1 clock, thereby outputting the delayed data to the first multiplexer 531 and the first XOR gate 532. Meanwhile, when a selection signal designates a normal mode, the second multiplexer 541 selects a lower bit X1 of the input symbol. And, when a selection signal designates an initialization mode, the second multiplexer 541 selects the output of the second memory 542, thereby outputting the selected result to the second XOR gate 543 and, at the same time, as a lower bit Z1. The second XOR gate 543 performs XOR operation on the output of the second multiplexer 541 and the output of the second memory 542, thereby outputting the added result to the third memory 544. The third memory 544 delays the output data of the second XOR gate 543 by 1 clock, thereby outputting the delayed data to the second memory 542 and, at the same time, as a least significant (or lowermost) bit Z0. The second memory 542 delays the output data of the third memory 544 by 1 clock, thereby outputting the delayed data to the second XOR gate 543 and the second multiplexer 541.

The select signal designates an initialization mode during the first two symbols that are converted from the initialization data.

For example, when the select signal designates an initialization mode, the first XOR gate 532 performs an XOR operation on the value of the first memory 533, which is provided through the first multiplexer 531, and on a memory value that is directly provided from the first memory 533. That is, the first XOR gate 532 performs an XOR operation on 2 bits having the same value. Generally, when only one of the two bits belonging to the operand is '1', the result of the XOR gate is equal to '1'. Otherwise, the result of the XOR gate becomes equal to '0'. Therefore, when the value of the first memory 533 is processed with an XOR operation, the result is always equal to '0'. Furthermore, since the output of the first XOR gate 532, i.e., '0', is inputted to the first memory 533, the first memory 533 is initialized to '0'.

Similarly, when the select signal designates an initialization mode, the second XOR gate 543 performs an XOR operation on the value of the second memory 542, which is provided through the second multiplexer 541, and on a memory value that is directly provided from the second memory 542. Therefore, the output of the second XOR gate 543 is also always equal to '0'. Since the output of the second XOR gate 543, i.e., '0', is inputted to the third memory 544, the third memory 544 is also initialized to '0'. The output of the third memory 544 is inputted to the second memory 542 in the next clock, thereby initializing the second memory 542 to '0'. In this case also, the select signal designates the initialization mode.

More specifically, when the first symbol being converted from the initialization data byte replaces the values of the first memory 533 and the second memory 542, thereby being inputted to the trellis encoder, each of the first and third memories 533 and 544 within the trellis encoder is initialized to '00'. Following the process, when the second symbol being converted from the initialization data byte replaces the values of the first memory 533 and the second memory 542, thereby being inputted to the trellis encoder, each of the first, second, and third memories 533, 542, and 544 within the trellis encoder is initialized to '000'. As described above, 2 symbols are required to initialize the memory of the trellis encoder. At this point, while the select signal designates an initialization mode, the output bits (X2'X1') of the first and second memories 533 and 542 are inputted to the non-systematic RS encoder 255, so as to perform a new RS parity calculation process.

The synchronization multiplexer 260 inserts a field synchronization signal and a segment synchronization signal to the data outputted from the trellis encoding module 256 and, then, outputs the processed data to the pilot inserter 271 of the transmission unit 270.

Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Assignment of Known Data (or Training Signal)

Figure 27:
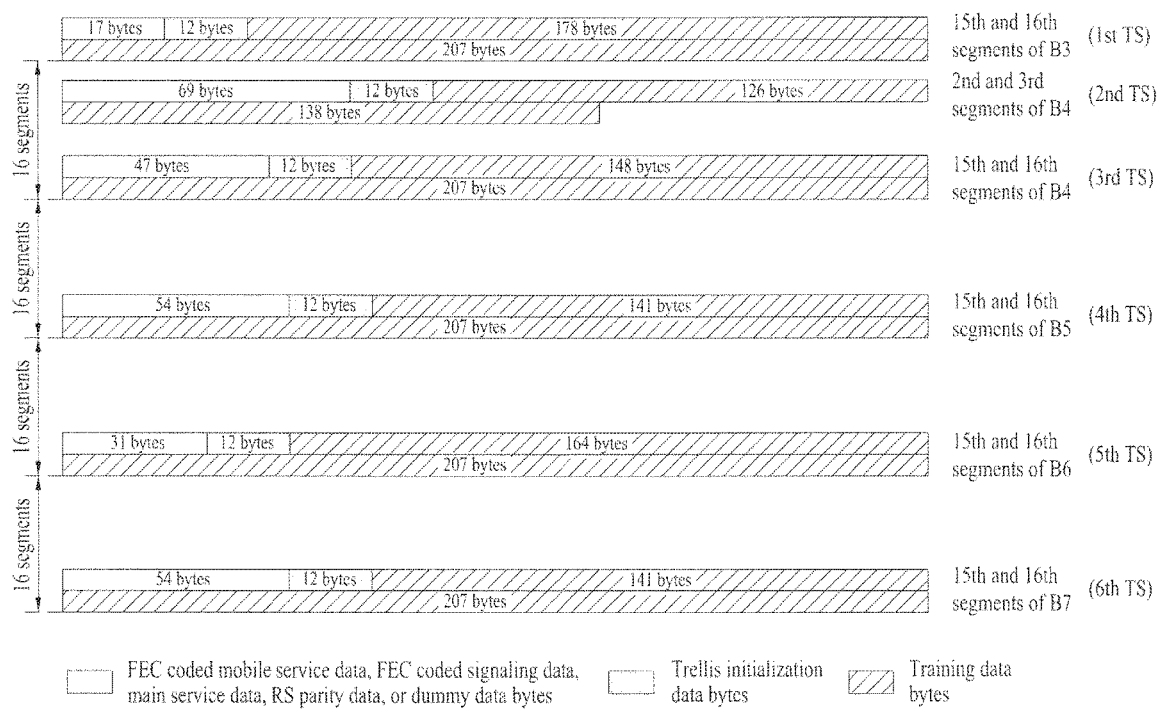
FIG. 27 illustrates an example of assignment of training sequences within a data group before trellis encoding according to the present invention.

The transmission system inserts long and regularly spaced training sequences (i.e., known data sequences) into each data group. Each data group contains 6 training sequences. The training sequences are specified before trellis-encoding. The training sequences are then trellis-encoded and these trellis-encoded sequences also are known sequences. This is because the trellis encoder memories are initialized to predetermined values at the beginning of each sequence. The form of the 6 training sequences at the byte level (before trellis-encoding) is shown in FIG. 27. FIG. 27 is an embodiment of the arrangement of the training sequences that is performed by the group formatter 303.

The $1^{st}$ training sequence is located at the last 2 segments of the $3^{rd}$ M/H block (B3). The $2^{nd}$ training sequence may be inserted at the $2^{nd}$ and $3^{rd}$ segments of the $4^{th}$ M/H block (B4). The $2^{nd}$ training sequence is next to the signaling area, as shown in FIG. 5. Then, the $3^{rd}$ training sequence, the $4^{th}$ training sequence, the $5^{th}$ training sequence, and the $6^{th}$ training sequence may be placed at the last 2 segments of the $4^{th}$, $5^{th}$, $6^{th}$ and $7^{th}$ M/H blocks (B4, B5, B6, and B7), respectively.

As shown in FIG. 27, the $1^{st}$ training sequence, the $3^{rd}$ training sequence, the $4^{th}$ training sequence, the $5^{th}$ training sequence, and the $6^{th}$ training sequence are spaced 16 segments apart from one another. Referring to FIG. 27, the dotted area indicates trellis initialization data bytes, the lined area indicates training data bytes, and the white area includes other bytes such as the FEC-coded M/H service data bytes, FEC-coded signaling data, main service data bytes, RS parity data bytes (for backwards compatibility with legacy ATSC receivers) and/or dummy data bytes.

Figure 28:
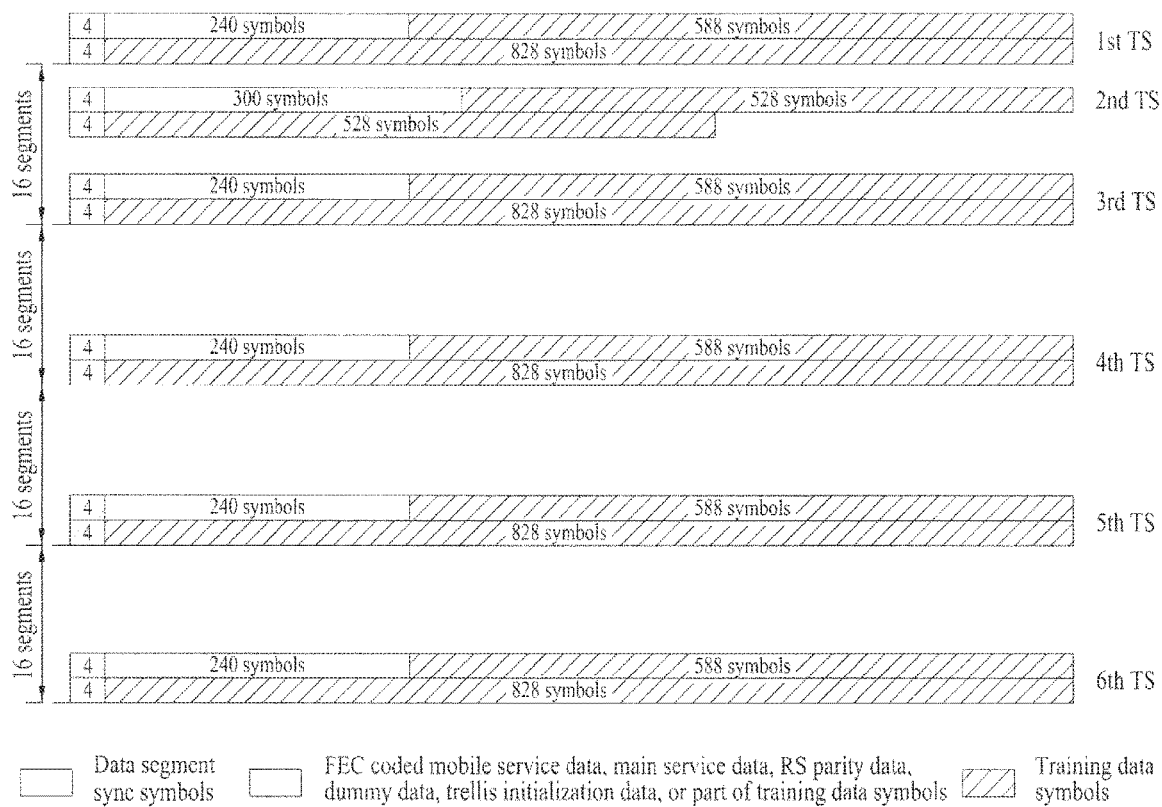
FIG. 28 illustrates an example of assignment of training sequences within a data group after trellis encoding according to the present invention.

FIG. 28 illustrates the training sequences (at the symbol level) after trellis-encoding by the trellis encoder. Referring to FIG. 28, the dotted area indicates data segment sync symbols, the lined area indicates training data symbols, and the white area includes other symbols, such as FEC-coded mobile service data symbols, FEC-coded signaling data symbols, main service data symbols, RS parity data symbols, dummy data symbols, trellis initialization data symbols, and/or the first part of the training sequence data symbols.

After the trellis-encoding process, the last 1416 (=588+ 828) symbols of the $1^{st}$ training sequence, the $3^{rd}$ training sequence, the $4^{th}$ training sequence, the $5^{th}$ training sequence, and the $6^{th}$ training sequence commonly share the same data pattern. The $2^{nd}$ training sequence has a first 528-symbol sequence and a second 528-symbol sequence that have the same data pattern.

More specifically, the 528-symbol sequence is repeated after the 4-symbol data segment synchronization signal. At the end of each training sequence, the memory contents of the twelve modified trellis encoders shall be set to zero(0).

Processing Signaling Information

The present invention assigns signaling information areas for inserting signaling information to some areas within each data group.

Figure 29:
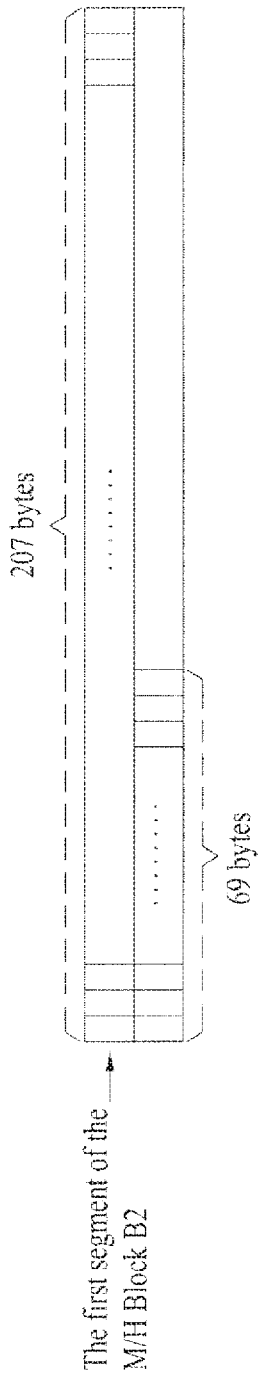
FIG. 29 illustrates an example of assigning signaling information area according to an embodiment of the present invention.

FIG. 29 illustrates an example of assigning signaling information areas for inserting signaling information starting from the $1^{st}$ segment of the $4^{th}$ M/H block (B4) to a portion of the $2^{nd}$ segment. More specifically, 276(=207+69) bytes of the $4^{th}$ M/H block (B4) in each data group are assigned as the signaling information area. In other words, the signaling information area consists of 207 bytes of the $1^{st}$ segment and the first 69 bytes of the 2nd segment of the $4^{th}$ M/H block (B4). For example, the $1^{st}$ segment of the $4^{th}$ M/H block (B4) corresponds to the $17^{th}$ or $173^{rd}$ segment of a VSB field.

For example, when the data group includes 6 known data sequences, as shown in FIG. 27 and FIG. 28, the signaling information area is located between the first known data sequence and the second known data sequence. More specifically, the first known data sequence is inserted in the last 2 segments of the $3^{rd}$ M/H block (B3), and the second known data sequence in inserted in the $2^{nd}$ and $3^{rd}$ segments of the $4^{th}$ M/H block (B4). Furthermore, the $3^{rd}$ to $6^{th}$ known data sequences are respectively inserted in the last 2 segments of each of the $4^{th}$, $5^{th}$, $6^{th}$, and $7^{th}$ M/H blocks (B4, B5, B6, and B7). The $1^{st}$ and $3^{rd}$ to $6^{th}$ known data sequences are spaced apart by 16 segments.

The signaling information that is to be inserted in the signaling information area is FEC-encoded by the signaling encoder 304, thereby inputted to the group formatter 303.

The group formatter 303 inserts the signaling information, which is FEC-encoded and outputted by the signaling encoder 304, in the signaling information area within the data group.

Herein, the signaling information may be identified by two different types of signaling channels: a transmission parameter channel (TPC) and a fast information channel (FIC).

Herein, the TPC data is transmitted through the TPC and corresponds to signaling information including transmission parameters, such as RS frame information, RS encoding information, FIC information, data group information, SCCC information, and M/H frame information and so on. However, the TPC data presented herein is merely exemplary. And, since the adding or deleting of signaling information included in the TPC may be easily adjusted and modified by one skilled in the art, the present invention will, therefore, not be limited to the examples set forth herein. Also, the TPC data includes parameters that are mostly used in a physical layer module. And, since the TPC data are transmitted without being interleaved, the TPC data may be accessed by slot unit in the receiving system.

Furthermore, the FIC data is transmitted through the FIC and is provided to enable a fast service acquisition of data receivers, and the FIC data includes cross layer information between the physical layer and the upper layer(s).

FIG. 30 illustrates a detailed block diagram of the signaling encoder 304 according to the present invention.

Referring to FIG. 34, the signaling encoder 304 includes a TPC encoder 561, an FIC encoder 562, a block interleaver 563, a multiplexer 564, a signaling randomizer 565, and an iterative turbo encoder 566.

The TPC encoder 561 receives 10-bytes of TPC data and performs (18,10)-RS encoding on the 10-bytes of TPC data, thereby adding 8 bytes of RS parity data to the 10 bytes of TPC data. The 18 bytes of RS-encoded TPC data are outputted to the multiplexer 564.

The FIC encoder 562 receives 37-bytes of FIC data and performs (51,37)-RS encoding on the 37-bytes of FIC data, thereby adding 14 bytes of RS parity data to the 37 bytes of FIC data. Thereafter, the 51 bytes of RS-encoded FIC data are inputted to the block interleaver 563, thereby being interleaved in predetermined block units. Herein, the block interleaver 563 corresponds to a variable length block interleaver. The block interleaver 563 interleaves the FIC data within each sub-frame in TNoG(column)×51(row) block units and then outputs the interleaved data to the multiplexer 564. Herein, the TNoG corresponds to the total number of data groups being assigned to a sub-frame. The block interleaver 563 is synchronized with the first set of FIC data in each sub-frame.

The block interleaver 563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565.

The signaling randomizer 565 randomizes the multiplexed data and outputs the randomized data to the iterative turbo encoder 566. The signaling randomizer 565 may use the same generator polynomial of the randomizer used for mobile service data. Also, initialization occurs in each data group.

The iterative turbo encoder 566 corresponds to an inner encoder performing iterative turbo encoding in a PCCC method on the randomized data (i.e., signaling information data). The iterative turbo encoder 566 may include 6 even component encoders and 6 odd component encoders.

FIG. 31 illustrates an example of a syntax structure of TPC data being inputted to the TPC encoder 561.

The TPC data are inserted in the signaling information area of each data group and then transmitted. The TPC data may include a sub-frame_number field, a slot_number field, a parade_id field, a starting_group_number (SGN) field, a number_of_groups (NoG) field, a parade repetition cycle (PRC) field, an RS_frame_mode field, an RS_code_mode_primary field, an RS_code_mode_secondary field, an SCCC_block_mode field, an SCCC_outer_code_mode_A field, an SCCC_outer_code_mode_B field, an SCCC_outer_code_mode_C field, an SCCC_outer_code_mode_D field, an FIC_version field, a parade_continuity_counter field, and a TNoG field.

The Sub-Frame_number field corresponds to the current Sub-Frame number within the M/H frame, which is transmitted for M/H frame synchronization. The value of the Sub-Frame_number field may range from 0 to 4.

The Slot_number field indicates the current slot number within the sub-frame, which is transmitted for M/H frame synchronization. Also, the value of the Sub-Frame_number field may range from 0 to 15.

The Parade_id field identifies the parade to which this group belongs. The value of this field may be any 7-bit value. Each parade in a M/H transmission shall have a unique Parade_id field. Communication of the Parade_id between the physical layer and the management layer may be performed by means of an Ensemble_id field formed by adding one bit to the left of the Parade_id field. If the Ensemble id field is used for the primary Ensemble delivered through this parade, the added MSB shall be equal to '0'. Otherwise, if the Ensemble_id field is used for the secondary ensemble, the added MSB shall be equal to '1'. Assignment of the Parade_id field values may occur at a convenient level of the system, usually in the management layer.

The starting_group_number (SGN) field shall be the first Slot_number for a parade to which this group belongs, as determined by Equation 1 (i.e., after the Slot numbers for all preceding parades have been calculated). The SGN and NoG shall be used according to Equation 1 to obtain the slot numbers to be allocated to a parade within the sub-frame.

The number_of_Groups (NoG) field shall be the number of groups in a sub-frame assigned to the parade to which this group belongs, minus 1, e.g., NoG=0 implies that one group is allocated (or assigned) to this parade in a sub-frame. The value of NoG may range from 0 to 7. This limits the amount of data that a parade may take from the main (legacy) service data, and consequently the maximum data that can be carried by one parade. The slot numbers assigned to the corresponding Parade can be calculated from SGN and NoG, using Equation 1. By taking each parade in sequence, the specific slots for each parade will be determined, and consequently the SGN for each succeeding parade. For example, if for a specific parade SGN=3 and NoG=3 (010b for 3-bit field of NoG), substituting i=3, 4, and 5 in Equation 1 provides slot numbers 12, 2, and 6.

The Parade_repetition_cycle (PRC) field corresponds to the cycle time over which the parade is transmitted, minus 1, specified in units of M/H frames, as described in Table 12.

TABLE 12

| PRC | Description |
| --- | --- |
| 000 | This parade shall be transmitted onceevery M/H frame. |
| 001 | This parade shall be transmitted once every 2 M/H frames. |
| 010 | This parade shall be transmitted once every 3 M/H frames. |
| 011 | This parade shall be transmitted once every 4 M/H frames. |
| 100 | This parade shall be transmitted once every 5 M/H frames. |
| 101 | This parade shall be transmitted once every 6 M/H frames. |
| 110 | This parade shall be transmitted once every 7 M/H frames. |
| 111 | Reserved |

For example, if PRC field value is equal to '001', this indicates that the parade shall be transmitted once every 2 M/H frame.

The RS_Frame_mode field shall be as defined in Table 1. The RS_Frame_mode field represents that one parade transmits one RS frame or two RS frames.

The RS_code_mode_primary field shall be the RS code mode for the primary RS frame. Herein, the RS_code_mode_primary field is defined in Table 6.

The RS_code_mode_secondary field shall be the RS code mode for the secondary RS frame. Herein, the RS_code_mode_secondary field is defined in Table 6.

The SCCC_Block_mode field represents how M/H blocks within a data group are assigned to SCCC block. The SCCC_Block_mode field shall be as defined in Table 7.

The SCCC_outer_code_mode_A field corresponds to the SCCC outer code mode for Region A within a data group. The SCCC outer code mode is defined in Table 8.

The SCCC_outer_code_mode_B field corresponds to the SCCC outer code mode for Region B within the data group.

The SCCC_outer_code_mode_C field corresponds be the SCCC outer code mode for Region C within the data group.

And, the SCCC_outer_code_mode_D field corresponds to the SCCC outer code mode for Region D within the data group.

The FIC_version field represents a version of FIC data.

The Parade_continuity_counter field counter may increase from 0 to 15 and then repeat its cycle. This counter shall increment by 1 every (PRC+1) M/H frames. For example, as shown in Table 12, PRC=011 (decimal 3) implies that Parade_continuity_counter increases every fourth M/H frame.

The TNoG field may be identical for all sub-frames in an M/H Frame.

However, the information included in the TPC data presented herein is merely exemplary. And, since the adding or deleting of information included in the TPC may be easily adjusted and modified by one skilled in the art, the present invention will, therefore, not be limited to the examples set forth herein.

Since the TPC data (excluding the Sub-Frame_number field and the Slot_number field) for each parade do not change their values during an M/H frame, the same information is repeatedly transmitted through all M/H groups belonging to the corresponding parade during an M/H frame. This allows very robust and reliable reception of the TPC data. Because the Sub-Frame_number and the Slot_number are increasing counter values, they also are robust due to the transmission of regularly expected values. Furthermore, the FIC data is provided to enable a fast service acquisition of data receivers, and the FIC information includes cross layer information between the physical layer and the upper layer(s).

FIG. 32A to FIG. 32D illustrate an example of a transmission scenario of the TPC data and the FIC data. The values of the Sub-Frame_number field, Slot_number field, Parade_id field, Parade repetition cycle field, and Parade_continuity_counter field may corresponds to the current M/H frame throughout the 5 sub-frames within a specific M/H frame. Some of TPC parameters and FIC data are signaled in advance.

The SGN, NoG and all FEC modes may have values corresponding to the current M/H frame in the first two sub-frames. The SGN, NoG and all FEC modes may have values corresponding to the frame in which the parade next appears throughout the $3^{rd}$, $4^{th}$ and $5^{th}$ sub-frames of the current M/H frame. This enables the M/H receivers to receive (or acquire) the transmission parameters in advance very reliably.

For example, when Parade_repetition_cycle='000', the values of the $3^{rd}$, $4^{th}$, and $5^{th}$ sub-frames of the current M/H frame correspond to the next M/H frame. Also, when Parade_repetition_cycle='011', the values of the $3^{rd}$, $4^{th}$, and $5^{th}$ sub-frames of the current M/H frame correspond to the $4^{th}$ M/H frame and beyond.

The FIC_version field and the FIC_data field may have values that apply to the current M/H Frame during the $1^{st}$ sub-frame and the $2^{nd}$ sub-frame, and they shall have values corresponding to the M/H frame immediately following the current M/H frame during the $3^{rd}$, $4^{th}$ and $5^{th}$ sub-frames of the current M/H frame.

Meanwhile, FIC data being transmitted through the FIC, i.e., an FIC chunk uses its fast characteristic so as to deliver mapping (or binding) information between a mobile service and an ensemble to the receiving system. More specifically, the FIC chunk corresponds to signaling data used for enabling the receiving system to swiftly find an ensemble that delivers a wanted (or desired) mobile service and to swiftly receive RS frames of the corresponding ensemble. At this point, the FIC chunk is segmented into a plurality of FIC segment payloads and a plurality of FIC segments are formed by added each FIC segment header to each FIC segment payload. Furthermore, one FIC segment is transmitted through one data group.

FIG. 33 illustrates a syntax structure of an FIC chunk that maps the relation between a mobile service and an ensemble through the FIC.

Herein, the FIC chunk consists of a 5-byte FIC chunk header and an FIC chunk payload having variable-length.

FIG. 34 illustrates a syntax structure of an FIC chunk header according to an embodiment of the present invention.

Herein, the FIC chunk header signals a non-backward compatible major protocol version change in a corresponding FIC chunk and also signals a backward compatible minor protocol version change. Furthermore, the FIC chunk header also signals the length for an extension of an FIC chunk header, the length for an extension of an ensemble loop header, and the length for an extension of a mobile service loop that can be generated by a minor protocol version change.

According to an embodiment of the present invention, a receiver (or receiving system) that can adopt the corresponding minor protocol version change may process the corresponding extension field, whereas a legacy (or conventional) receiver that cannot adopt the corresponding minor protocol version change may skip the corresponding extension field by using each of the corresponding length information. For example, in case of a receiving system that can accept the corresponding minor protocol version change, the directions given in the corresponding extension field may be known. Furthermore, the receiving system may perform operations in accordance with the directions given in the corresponding extension field.

According to an embodiment of the present invention, a minor protocol version change in the FIC chunk is performed by inserting additional fields at the respective end portion of the FIC chunk header, the ensemble loop header, and the mobile service loop included in the previous minor protocol version FIC chunk. According to an embodiment of the present invention, in any other case, or when the length of the additional fields cannot be expressed (or indicated) by each extension length within the FIC chunk header, or when a specific field within the FIC chunk payload is missing (or cannot be found), or when the number of bits being assigned to the corresponding field or the definition of the corresponding field is changed (or altered), the major protocol version of the corresponding FIC chunk is updated.

Also, the FIC chunk header signals whether the data of a corresponding FIC chink payload carry mapping information between an ensemble and a mobile service within the current M/H frame, or whether the data of a corresponding FIC chink payload carry mapping information between an ensemble and a mobile service within the next M/H frame. Furthermore, the FIC chunk header also signals the number of transport stream IDs of a mobile service through which the current FIC chunk is being transmitted and the number of ensembles being transmitted through the corresponding mobile service.

Accordingly, for this, the FIC chunk header may include an FIC_major_protocol_version field, an FIC_minor_protocol_version field, an FIC_chunk_header_extension_length field, an ensemble_loop_header_extension_length field, an M/H_service_loop_extension_length field, a current_next_indicator field, a transport_stream_id field, and a num_ensembles field.

The FIC_major_protocol_version field corresponds to a 2-bit unsigned integer field that represents the major version level of an FIC chunk syntax. A change in the major version level shall indicate a change in a non-backward-compatible level. When the FIC_major_protocol_version field is updated, legacy (or conventional) receivers, which can process the prior major protocol version of an FIC chunk protocol, shall avoid processing the FIC chunk.

The FIC_minor_protocol_version field corresponds to a 3-bit unsigned integer field that represents the minor version level of an FIC chunk syntax. When it is assumed that the major version level remains the same, a change in the minor version level shall indicate a change in a backward-compatible level. More specifically, when the FIC_minor_protocol_version field is updated, legacy (or conventional) receivers, which can process the same major version of the FIC chunk protocol, may process a portion of the FIC chunk.

The FIC_Chunk_header_extension_length field corresponds to a 3-bit unsigned integer field identifying the length of FIC chunk header extension bytes, which are generated by the minor protocol version update of the corresponding FIC chunk. Herein, the extension bytes are appended (or added) at the end of the corresponding FIC chunk header.

The ensemble_header_extension_length field corresponds to a 3-bit unsigned integer field identifying the length of the ensemble header extension bytes, which are generated by the minor protocol version update of the corresponding FIC chunk. Herein, the extension bytes are appended (or added) at the end of the corresponding ensemble loop header.

Also, the M/H_service_loop_extension_length field corresponds to a 4-bit unsigned integer field identifying the length of the ensemble header extension bytes, which are generated by the minor protocol version update of the M/H service loop. Herein, the extension bytes are appended (or added) at the end of the corresponding M/H service loop.

For example, it is assumed that the FIC chunk includes 2 ensembles (i.e., ensemble 0 and ensemble 1). More specifically, it is assumed that two mobile services are transmitted through ensemble 0, and one mobile service is transmitted through ensemble 1. At this point, when the minor protocol version of the FIC chunk is changed, and the FIC chunk header is expanded by 1 byte, the FIC_chunk_header_extension_length field is marked as '001'. In this case, a 1-byte expansion field (i.e., FIC_Chunk_header_extension_bytes field) is added at the end of the FIC chunk header. Also, the legacy receiver skips the 1-byte expansion field, which is added at the end of the FIC chunk header, without processing the corresponding expansion field.

Additionally, when the ensemble loop header within the FIC chunk is expanded by 2 bytes, the ensemble_loop_header_extension_length field is marked as '010'. In this case, a 2-byte expansion field (i.e., Ensemble_loop_header_extension_bytes field) is respectively added at the end of the ensemble 0 loop header and at the end of the ensemble 1 loop header. Also, the legacy receiver skips the 2-byte expansion fields, which are respectively added at the end of the ensemble 0 loop header and at the end of the ensemble 1 loop header, without processing the corresponding 2-byte expansion fields.

Furthermore, when the mobile service loop of the FIC chunk is expanded by 1 byte, the M/H_service_loop_extension_length field is marked as '001'. In this case, a 1-byte expansion field (i.e., M/H_service_loop_extension_bytes field) is respectively added at the end of 2 mobile service loops being transmitted through ensemble 0 loop and at the end of 1 mobile service loop being transmitted through the ensemble 1 loop. And, the legacy receiver skips the 1-byte expansion fields, which are respectively added at the end of 2 mobile service loops being transmitted through ensemble 0 loop and at the end of 1 mobile service loop being transmitted through the ensemble 1 loop, without processing the corresponding 1-byte expansion fields.

As described above, when the FIC_minor_protocol_version field is changed, a legacy (or conventional) receiver (i.e., a receiver that cannot adopt the minor protocol version change in the corresponding FIC chunk) processes the fields apart from the extension field. Thereafter, the legacy receiver uses the FIC_chunk_header_extension_length field, the ensemble_loop_header_extension_length field, and the M/H_service_loop_extension_length field, so as to skip the corresponding expansion fields without processing the corresponding fields. When using a receiving system that can adopt the corresponding minor protocol version change of the FIC chunk, each length field is used to process even the corresponding expansion field.

The current_next_indicator field corresponds to a 1-bit indicator, which, when set to '1', indicates that the corresponding FIC chunk is currently applicable. Alternatively, when the current_next_indicator field is set to '0', the current_next_indicator field indicates that the corresponding FIC chunk will be applicable for the next M/H frame. Herein, when the current_next_indicator field is set to '0', the most recent version of the FIC chunk being transmitted with the current_next_indicator field set to '1' shall be currently applicable. More specifically, when the current_next_indicator field value is set to '1', this indicates that the corresponding FIC chunk transmits the signaling data of the current M/H frame. Further, when the current_next_indicator field value is set to '0', this indicates that the corresponding FIC chunk transmits the signaling data of the next M/H frame. When reconfiguration occurs, wherein the mapping information between the ensemble within the current M/H frame and the mobile service differs from the ensemble within the next M/H frame and the mobile service, the M/H frame prior to reconfiguration is referred to as the current M/H frame, and the M/H frame following reconfiguration is referred to as the next M/H frame.

The transport_stream_id field corresponds to a 16-bit unsigned integer number field, which serves as a label for identifying the corresponding M/H broadcast. The value of the corresponding transport_stream_id field shall be equal to the value of the transport_stream_id field included in the program association table (PAT) within the MPEG-2 transport stream of a main ATSC broadcast.

The num_ensembles field corresponds to an 8-bit unsigned integer field, which indicates the number of M/H ensembles carried through the corresponding physical transmission channel.

FIG. 35 illustrates an exemplary syntax structure of an FIC chunk payload according to an embodiment of the present invention.

For each ensemble corresponding to the num_ensembles field value within the FIC chunk header of FIG. 34, the FIC chunk payload includes configuration information of each ensemble and information on mobile services being transmitted through each ensemble.

The FIC chunk payload consists of an ensemble loop and a mobile service loop below the ensemble loop. The FIC chunk payload enables the receiver to determine through which ensemble a requested (or desired) mobile service is being transmitted. (This process is performed via mapping between the ensemble_id field and the M/H_service_id field.) Thus, the receiver may receive RS frames belonging to the corresponding ensemble.

In order to do so, the ensemble loop of the FIC chunk payload may include an ensemble_id field, an ensemble_protocol_version field, an SLT_ensemble_indicator field, a GAT_ensemble_indicator field, an MH_service_signaling_channel_version field, and a num_M/H_services field, which are collectively repeated as many times as the num_ensembles field value. The mobile service loop may include an MH_service_id field, a multi_ensemble_service field, an MH_service_status field, and an SP_indicator field, which are collectively repeated as many times as the num_M/H_services field.

The ensemble_id field corresponds to an 8-bit unsigned integer field, which indicates a unique identifier of the corresponding ensemble. For example, the ensemble_id field may be assigned with values within the range '0x00' to '0x7F'. The ensemble_id field group (or associate) the mobile services with the respective ensemble. Herein, it is preferable that the value of the ensemble_id field is derived from the parade_id field carried (or transmitted) through the TPC data. If the corresponding ensemble is transmitted through a primary RS frame, the most significant bit is set to '0', and the remaining least significant bits are used as the parade_id field value of the corresponding parade. Meanwhile, if the corresponding ensemble is transmitted through a secondary RS frame, the most significant bit is set to '0', and the remaining least significant bits are used as the parade_id field value of the corresponding parade.

The ensemble_protocol_version field corresponds to a 5-bit field, which specifies a version of the corresponding ensemble structure.

The SLT_ensemble_indicator field is a 1-bit field, which indicates whether or not the SLT is being transmitted to the service signaling channel of the corresponding ensemble. For example, when the SLT_ensemble_indicator field value is equal to '1', this may indicate that the SLT is being transmitted to the service signaling channel. On the other hand, when the SLT_ensemble_indicator field value is equal to '0', this may indicate that the SLT is not being transmitted.

The GAT_ensemble_indicator field is also a 1-bit field, which indicates whether or not the GAT is being transmitted to the service signaling channel of the corresponding ensemble. For example, when the GAT_ensemble_indicator field value is equal to '1', this may indicate that the GAT is being transmitted to the service signaling channel. On the other hand, when the GAT_ensemble_indicator field value is equal to '0', this may indicate that the GAT is not being transmitted.

The MH_service_signaling_channel_version field corresponds to a 5-bit field, which indicates a version number of the service signaling channel of the corresponding ensemble.

The num_M/H_services field corresponds to an 8-bit unsigned integer field, which represents the number of mobile (i.e., M/H) services carried through the corresponding M/H ensemble.

For example, when the minor protocol version within the FIC chunk header is changed, and when an extension field is added to the ensemble loop header, the corresponding extension field is added immediately after the num_M/H_services field. According to anther embodiment of the present invention, if the num_M/H_services field is included in the mobile service loop, the corresponding extension field that is to be added in the ensemble loop header is added immediately after the M/H_service_configuration_version field.

The M/H_service_id field of the mobile service loop corresponds to a 16-bit unsigned integer number, which identifies the corresponding M/H service. The value (or number) of the M/H_service_id field shall be unique within the mobile (M/H) broadcast.

The multi_ensemble_service field is a 2-bit enumerated field, which indicates whether the corresponding mobile (M/H) service is transmitted through (or over) one ensemble, or whether the corresponding mobile (M/H) service is transmitted through (or over) multiple ensembles. Also, the value of the multi_ensemble_service field indicates whether or not the mobile service is valid (or rendered meaningfully) only for the mobile service portion being transmitted through (or over) the corresponding ensemble.

The M/H_service_status field corresponds to a 2-bit enumerated field, which identifies the status of the corresponding M/H service. For example, the most significant bit of the M/H_service_status field indicates whether the corresponding M/H service is active (when set to '1') or inactive (when set to '0'). Furthermore, the least significant bit indicates whether the corresponding M/H service is hidden (when set to '1') or not (when set to '0').

The SP_indicator field corresponds to a 1-bit field, which, when set to '1', indicates whether or not service protection is applied to at least one of the components required for providing a significant presentation of the corresponding M/H service.

For example, when the minor protocol version of the FIC chunk is change, and if an expansion field is added to the mobile service loop, the expansion field is added after the SP_indicator field.

Also, the FIC chunk payload may include an FIC_chunk_stuffing( ) field. Stuffing of the FIC_chunk_stuffing( ) field may exist in an FIC-Chunk, to keep the boundary of the FIC-Chunk to be aligned with the boundary of the last FIC-Segment among FIC segments belonging to the FIC chunk. The length of the stuffing is determined by how much space is left after parsing through the entire FIC-Chunk payload preceding the stuffing.

At this point, the transmitting system (not shown) according to the present invention divides the FIC chunk into multiple FIC segment payloads and forms a plurality of FIC segments by adding each FIC segment header to each FIC segment payload, thereby outputting the FIC segments to the receiving system in FIC segment units. The size of each FIC segment unit is 37 bytes, and each FIC segment consists of a 2-byte FIC segment header and a 35-byte FIC segment payload. More specifically, an FIC chunk, which is configured of an FIC chunk header and an FIC chunk payload, is segmented by units of 35 bytes. Also, an FIC segment is configured by adding a 2-byte FIC segment header in front of each segmented 35-byte unit.

According to an embodiment of the present invention, the length of the FIC chunk payload is variable. Herein, the length of the FIC chunk varies depending upon the number of ensembles being transmitted through the corresponding physical transmission channel and the number of mobile services included in each ensemble.

Also, the FIC chunk payload may include stuffing data. In this case, the stuffing data are used for the boundary alignment of the FIC chunk and the last FIC-Segment, among FIC segments belonging to the FIC chunk, according to the embodiment of the present invention. Accordingly, by minimizing the length of the stuffing data, unnecessary wasting of FIC segments can be reduced.

At this point, the number of stuffing data bytes being inserted in the FIC chunk can be calculated by using Equation 6 below.

The number of stuffing data bytes=35−j $$j=(5+\text{the number of signaling data bytes being inserted in the FIC chunk payload}) \bmod 35 \qquad \text{Equation 6}$$

For example, when the added total length of the 5-byte header within the FIC chunk and signaling data, which is to be inserted in the payload within the FIC chunk, is equal to 205 bytes, the payload of the FIC chunk may include 5 bytes of stuffing data because j is equal to 30 in Equation 6. Also, the length of the FIC chunk payload including the stuffing data is equal to 210 bytes. Thereafter, the FIC chunk is divided into 6 FIC segments, which are then transmitted. At this point, a segment number is sequentially assigned to each of the 6 FIC segments divided from the FIC chunk.

Furthermore, the present invention may transmit the FIC segments divided from a single FIC chunk to a single sub-frame, or may transmit the divided FIC segments to multiple sub-frames. If the FIC chunk is divided and transmitted to multiple sub-frames, signaling data, which are required even when the amount of data that are to be transmitted through the FIC chunk is larger than the amount of FIC segments being transmitted through a single sub-frame (this case corresponds to when multiple services having very low bit rates are being executed), may all be transmitted through the FIC chunk.

Herein, the FIC segment numbers represent FIC segment numbers within each FIC chunk, and not the FIC segment number within each sub-frame. Thus, the subordinate relation between the FIC chunk and the sub-frame can be eliminated, thereby reducing excessive waste of FIC segments.

Furthermore, the present invention may add a null FIC segment. Despite the repeated transmission of the FIC chunk, and when stuffing is required in the corresponding M/H frame, the null FIC segment is used for the purpose of processing the remaining FIC segments. For example, it is assumed that TNoG is equal to '3' and that the FIC chunk is divided into 2 FIC segments. Herein, when the FIC chunk is repeatedly transmitted through 5 sub-frames within a single M/H frame, only 2 FIC segments are transmitted through one of the 5 sub-frames (e.g., the sub-frame chronologically placed in the last order). In this case, one null FIC segment is assigned to the corresponding sub-frame, thereby being transmitted. More specifically, the null FIC segment is used for aligning the boundary of the FIC chunk and the boundary of the M/H frame. At this point, since the null FIC segment is not an FIC segment divided from the FIC chunk, an FIC segment number is not assigned to the null FIC segment.

In the present invention, when a single FIC chunk is divided into a plurality of FIC segments, and when the divided FIC segments are included in each data group of at least one sub-frame within the M/H frame, so as to be transmitted, the corresponding FIC segments are allocated in a reversed order starting from the last sub-frame within the corresponding M/H frame. According to an embodiment of the present invention, in case a null FIC segment exists, the null FIC segment is positioned in the sub-frame within the M/H frame, so that the corresponding null FIC segment can be transmitted as the last (or final) segment.

At this point, in order to enable the receiving system to discard the null FIC segment without having to process the corresponding null FIC segment, identification information that can identify (or distinguish) the null FIC segment is required.

According to an embodiment of the present invention, the present invention uses the FIC_segment_type field within the header of the null FIC segment as the identification information for identifying the null FIC segment. In this embodiment, the value of the FIC_segment_type field within the null FIC segment header is set to '11', so as to identify the corresponding null FIC segment. More specifically, when the FIC_segment_type field value within the null FIC segment header is set to '11' and transmitted to the receiving system, the receiving system may discard the payload of the FIC segment having the FIC_segment_type field value set to '11' without having to process the corresponding FIC segment payload. Herein, the value '11' is merely an exemplary value given to facilitate and simplify the understanding of the present invention. As long as a pre-arrangement between the receiving system and the transmitting system is established, any value that can identify the null FIC segment may be given to the FIC_segment_type field. Therefore, the present invention will not be limited only to the example set presented herein. Furthermore, the identification information that can identify the null FIC segment may also be indicated by using another field within the FIC segment header.

FIG. 36 illustrates an exemplary syntax structure of an FIC segment header according to an embodiment of the present invention.

Herein, the FIC segment header may include an FIC_segment_type field, an FIC_chunk_major_protocol_version field, a current_next_indicator field, an error_indicator field, an FIC_segment_num field, and an FIC_last_segment_num field. Each field will now be described as follows.

The FIC segment type field corresponds to a 2-bit field, which, when set to '00' indicates that the corresponding FIC segment is carrying a portion of an FIC chunk. Alternatively, when the FIC_segment_type field is set to '11', the FIC_segment_type field indicates that the corresponding FIC segment is a null FIC segment, which transmits stuffing data. Herein, the remaining values are reserved for future use.

The FIC_Chunk_major_protocol_version field corresponds to a 2-bit field, which indicates a major protocol version of the corresponding FIC chunk. At this point, the value of the FIC_Chunk_major_protocol_version field should be the same as the value of the FIC_major_protocol_version field within the corresponding FIC chunk header. Since reference may be made to the description of the FIC chunk header shown in FIG. 34, a detailed description of the major protocol version of the FIC chunk syntax will be omitted for simplicity.

The current_next_indicator field corresponds to a 1-bit indicator, which, when set to '1', shall indicate that the corresponding FIC segment is carrying a portion of the FIC chunk, which is applicable to the current M/H frame. Alternatively, when the value of the current_next_indicator field is set to '0', the current_next_indicator field shall indicate that the corresponding FIC segment is carrying a portion of the FIC chunk, which will be applicable for the next M/H frame.

The error_indicator field corresponds to a 1-bit field, which indicates whether or not an error has occurred in the corresponding FIC segment during transmission. Herein, the error_indicator field is set to '1', when an error has occurred. And, the error_indicator field is set to '0', when an error does not exist (or has not occurred). More specifically, during the process of configuring the FIC segment, when a non-recovered error exists, the error_indicator field is set to '1'. More specifically, the error_indicator field enables the receiving system to recognize the existence (or presence) of an error within the corresponding FIC segment.

The FIC_segment_num field corresponds to a 4-bit unsigned integer number field, which indicates a number of the corresponding FIC segment. For example, if the corresponding FIC segment is the first FIC segment of the FIC chunk, the value of the FIC_segment_num field shall be set to '0x0'. Also, if the corresponding FIC segment is the second FIC segment of the FIC chunk, the value of the FIC_segment_num field shall be set to '0x1'. More specifically, the FIC_segment_num field shall be incremented by one with each additional FIC segment in the FIC chunk. Herein, if the FIC chunk is divided into 4 FIC segments, the FIC_segment_num field value of the last FIC segment within the FIC chunk will be indicated as '0x3'.

The FIC_last_segment_num field corresponds to a 4-bit unsigned integer number field, which indicates the number of the last FIC segment (i.e., the FIC segment having the highest FIC_segment_num field value) within a complete FIC chunk.

In the conventional method, FIC segment numbers are sequentially assigned (or allocated) for each FIC segment within one sub-frame. Therefore, in this case, the last FIC segment number always matches with the TNoG (i.e., the last FIC segment number is always equal to the TNoG). However, when using the FIC number assignment method according to the present invention, the last FIC segment number may not always match with the TNoG. More specifically, the last FIC segment number may match with the TNoG, or the last FIC segment number may not match with the TNoG. The TNoG represents a total number of data groups that are allocated (or assigned) to a single sub-frame. For example, when the TNoG is equal to '6', and when the FIC chunk is divided into 8 FIC segments, the TNoG is equal to '6', and the last FIC segment number is '8'.

According to another embodiment of the present invention, the null FIC segment may be identified by using the value of the FIC_segment_num field within the FIC segment header. More specifically, since an FIC segment number is not assigned to the null FIC segment, the transmitting system allocates null data to the FIC_segment_num field value of the null FIC segment, and the receiving system may allow the FIC segment having null data assigned to the FIC_segment_num field value to be recognized as the null FIC segment. Herein, instead of the null data, data pre-arranged by the receiving system and the transmitting system may be assigned to the FIC_segment_num field value, instead of the null data.

As described above, the FIC chunk is divided into a plurality of FIC segments, thereby being transmitted through a single sub-frame or being transmitted through multiple sub-frames. Also, FIC segments divided from a single FIC chunk may be transmitted through a single sub-frame, or FIC segments divided from multiple single FIC chunks may be transmitted through a single sub-frame. At this point, the number assigned to each FIC segment corresponds to a number within the corresponding FIC chunk (i.e., the FIC_seq_number value), and not the number within the corresponding sub-frame. Also, the null FIC segment may be transmitted for aligning the boundary of the M/H frame and the boundary of the FIC chunk. At this point, an FIC segment number is not assigned to the null FIC segment.

As described above, one FIC chunk may be transmitted through multiple sub-frames, or multiple FIC chunks may be transmitted through a single sub-frame. However, according to the embodiment of the present invention, the FIC segments are interleaved and transmitted in sub-frame units.

Meanwhile, FIG. 37 illustrates an exemplary structure of a bit stream syntax of an SMT section which is included in the RS frame and then transmitted. Herein, the SMT section is configured in an MPEG-2 private section format for simplicity. However, the SMT section data may be configured in any possible format.

The SMT may provide access information of mobile services within an ensemble including the SMT. Also, the SMT may provide information required for the rendering of mobile services. Furthermore, the SMT may include at least one or more descriptors. Herein, other additional (or supplementary) information may be described by the descriptor.

At this point, the service signaling channel that transmits the SMT may further include another signaling table (e.g., GAT) in addition to the SMT.

Herein, according to the embodiment of the present invention, IP datagrams of the service signaling channel have the same well-known destination IP address and the same well-known destination UDP port number. Therefore, the SMT included in the service signaling data is distinguished (or identified) by a table identifier. More specifically, the table identifier may correspond to a table_id existing in the corresponding table or in a header of the corresponding table section. And, when required, the table identifier may further refer to a table_id_extension field, so as to perform the identification process. Exemplary fields that can be transmitted through the SMT section will now be described in detail.

A table_id field is an 8-bit table identifier, which may be set up as an identifier for identifying the SMT.

A section_syntax_indicator field corresponds to an indicator defining the section format of the SMT. For example, the section_syntax_indicator field shall be set to '0' to always indicate that this table is derived from the "short" form of the MPEG-2 private section table format may correspond to MPEG long-form syntax.

A private_indicator field is a 1-bit field, which indicates whether or not the SMT follows (or is in accordance with) a private section.

A section_length field is a 12-bit field, which specifies the section length of the remaining SMT data bytes immediately following the section_length field.

A table_id_extension field corresponds to a table-dependent 16-bit field. Herein, the table_id_extension field corresponds to a logical portion of the table_id field providing the scope for the remaining fields. The table_id_extension field includes a SMT_protocol_version field and an ensemble_id_field.

The SMT_protocol_version field corresponds to an 8-biit unsigned integer field. Herein, the SMT_protocol_version field indicates a protocol version for allowing the corresponding SMT to carry, in a future process, parameters that may be structure differently from those defined in the current protocol. Presently, the value of the SMT_protocol_version field shall be equal to zero(0). Non-zero values of the SMT_protocol_version field may be used by a future version of this standard to indicate structurally different tables.

The ensemble_id field corresponds to an 8-bit field. Herein, the ID values associated with the corresponding ensemble that can be assigned to the ensemble_id field may range from '0x00' and '0x3F'. It is preferable that the value of the ensemble id field is derived from the TPC data of the parade_id field. When the corresponding ensemble is transmitted through a primary RS frame, the most significant bit (MSB) is set to '0', and the remaining 7 bits are used as the parade_id field value of the corresponding parade. Meanwhile, when the corresponding ensemble is transmitted through a primary RS frame, the most significant bit (MSB) is set to '1', and the remaining 7 bits are used as the parade_id field value of the corresponding parade.

A version_number field corresponds to a 5-bit field, which specifies the version number of the SMT.

A current_next_indicator field corresponds to a 1-bit field indicating whether or not the SMT section is currently applicable.

A section_number field is an 8-bit field specifying the number of the current SMT section.

A last_section_number field corresponds to an 8-bit field that specifies the number of the last section configuring the corresponding SMT.

And, a num_MH_services field corresponds to an 8-bit field, which specifies the number of mobile services in the corresponding SMT section.

Hereinafter, a number of 'for' loop (also referred to as mobile (M/H) service loop) statements equivalent to the number of mobile services corresponding to the num_MH_services field is performed so as to provide signaling information on multiple mobile services. More specifically, signaling information of the corresponding mobile service is indicated for each mobile service that is included in the SMT section. Herein, the following field information corresponding to each mobile service may be provided as described below.

An MH_service_id field corresponds to a 16-bit unsigned integer number, which can uniquely identify the corresponding mobile service within the scope of the corresponding SMT section.

A multi_ensemble_service field corresponds to a 2-bit field, which indicates whether the corresponding mobile service is transmitted through one or more ensembles. Since the multi_ensemble_service field has the same meaning as the multi_ensemble_service field included in the FIC chunk, detailed description of the same will be omitted for simplicity.

An MH_service_status field corresponds to a 2-bit field, which can identify the status of the corresponding mobile service. Herein, the MSB indicates whether the corresponding mobile service is active ('1') or whether the corresponding mobile service is inactive ('0'). Also, the LSB indicates whether the corresponding mobile service is hidden ('1') or not hidden ('0').

An SP_indicator field corresponds to a 1-bit field, which specifies service protection status of the corresponding mobile service. If the SP_indicator field is set to '1', then service protection is applied to at least one of the components needed to provide a meaningful presentation of the corresponding service.

A short_MH_service_name_length field corresponds to a 3-bit field, which indicates the length of a short service name described in a short service name field in byte-length units.

The short_MH_service_name field indicates the short name of the corresponding mobile service.

An MH_service_category field is a 6-bit field, which identifies the type category of the corresponding mobile service.

A num_components field corresponds to a 5-bit field, which specifies the number of IP stream components in the corresponding mobile service.

An IP_version_flag field corresponds to a 1-bit indicator, which when set to '0' indicates that a source_IP_address field, an MH_service_destination_IP_address field, and a component_destination_IP_address field correspond to IPv4 addresses. The value of '1' for the IP_version_flag field is reserved for any possible future indication that the source_IP_address field, the MH_service_destination_IP_address field, and the component_destination_IP_address field correspond to IPv6 addresses. However, the usage of IPv6 addressing is currently undefined.

A source_IP_address flag corresponds to a 1-bit Boolean flag, which indicates, when set, that a source IP address value for the corresponding service exists (or is present) so as to indicate a source specific multicast.

An MH_service_destination_IP_address flag corresponds to a 1-bit, which indicates, when set, that the corresponding IP stream component is transmitted through an IP datagram having a destination IP address different from that of the MH_service_destination_IP_address field. Therefore, when the MH_service_destination_IP_address flag is set, the receiving system may use the component_destination_IP_address as the destination_IP_address in order to access the corresponding IP stream component. Furthermore, the receiving system ignores (or disregards) the MH_service_destination_IP_address field within the mobile service loop.

The source_IP_address field corresponds to a 32-bit field or a 128-bit field. When the source_IP_address flag is set to '1', the source_IP_address field is required to be interpreted (or analyzed). However, when the source_IP_address flag is set to '0', the source_IP_address field is not required to be interpreted (or analyzed). When the source_IP_address flagis set to '1', and when the IP_version_flag field is set to '0', the corresponding field indicates that the source_IP_address field indicates a 32-bit IPv4 address specifying the corresponding mobile service source. Alternatively, if the IP_version_flag field is set to '1', the source_IP_address field indicates a 32-bit IPv6 address specifying the corresponding mobile service source.

The MH_service_destination_IP_address field corresponds to a 32-bit field or a 128-bit field. When the MH_service_destination_IP_address flag field is set to '1', the MH_service_destination_IP_address flag is required to be interpreted (or analyzed). However, when the MH_service_destination_IP_address flag is set to '0', the MH_service_destination_IP_address flag is not required to be interpreted (or analyzed). Herein, if the MH_service_destination_IP_address flag is set to '1', and if the IP_version_flag field is set to '0', the MH_service_destination_IP_address field indicates a 32-bit destination IPv4 address for the corresponding mobile service. Aternatively, if the MH_service_destination_IP_address flag is set to '1', and if the IP_version_flag field is set to '1', the MH_service_destination_IP_address field indicates a 64-bit destination IPv6 address for the corresponding mobile service. In case the corresponding MH_service_destination_IP_address field cannot be interpreted, the component_destination_IP_address field within a component loop shall be interpreted. And, in this case, the receiving system shall use the component_destination_IP_address in order to access the IP stream component.

Meanwhile, the SMT according to the embodiment of the present invention provides information on multiple components using the 'for' loop statement.

Hereinafter, a number of 'for' loop (also referred to as component loop) statements equivalent to the number of components corresponding to the num_component field value is performed so as to provide access information on multiple components. More specifically, access information of each component included in the corresponding mobile service is provided. In this case, the following field information on each component may be provided as described below.

A component source_IP_address flag field is a 1-bit field (or a 1-boit Boolean flag), which indicates, when set to '1', that the component_source_IP_address field is present for this component.

More specifically, a mobile service may include diverse types of components, for example, a mobile service may include an audio component, or a mobile service may include a video component, or a mobile service may include a FLUTE component.

At this point, when the component_source_IP_address_flag field is set to '1', this signifies that the component_source_IP_address field exists, and this field indicates a source_IP_address of an IP datagram carrying the corresponding component.

For example, when the component_source_IP_address_flag field of the FLUTE component is set to '1', the component source_IP_address field indicates the source_IP_address of the IP datagram carrying the FLUTE component.

According to an embodiment of the present invention, in case a service_source_IP_address field within a mobile service loop and a component_source_IP_address within a component loop both exist, yet if the field values are different from one another, the source_IP_address of the IP datagram of the corresponding component is acquired from the component_source_IP_address field. More specifically, the service_source_IP_address field within the mobile service loop is disregarded.

According to another embodiment of the present invention, in case the service_source_IP_address field exists and the component_source_IP_address field does not exist, the source_IP_address of the IP datagram of the corresponding component is acquired from the service_source_IP_address field. And, in the opposite case, i.e., in case the service_source_IP_address field does not exists and the component_source_IP_address field exists, the source IP address of the IP datagram of the corresponding component is acquired from the component_source_IP_address field.

As described above, in the present invention, the component_source_IP_address field exists when the component_source_IP_address flag field value is equal to '1'. And, according to an embodiment of the present invention, when the component_source_IP_address field exists, the source IP address of the IP datagram of the corresponding component is identical to the component_source_IP_address field value. And, according to another embodiment of the present invention, in case the component_source_IP_address field does not exist, the source IP address of the IP datagram of the corresponding component is identical to the service_source_IP_address field value.

And, according to another embodiment of the present invention, in case the service_source_IP_address field and the component_source_IP_address field do not exist, the source IP address is not used when acquiring the IP datagram of the corresponding component.

An essential_component indicator field is a 1-bit field, which indicates that the corresponding component is an essential component for the mobile service, when the essential_component_indicator field value is set to '1'. Otherwise, the essential_component_indicator field indicates that the corresponding component is an optional component. For example, in case of a basic layer audio stream and video stream, the essential_component_indicator field value is set to '1'. And, in case of the enhanced layer video stream, the essential_component_indicator field value is set to '0'.

A component_destination_IP_address_flag field corresponds to a 1-bit Boolean flag. When the component_destination_IP_address_flag field is set to '1', this indicates that a component_destination_IP_address exists for the corresponding component.

A port_num_count field corresponds to a 6-bit field, which indicates a UDP port number associated with the corresponding UDP/IP stream component. Herein, the destination UDP Port number value is increased by 1 starting from a destination_UDP_port_num field value. The destination_UDP_port_num field corresponds to a 16-bit field, which indicates a destination UDP port number for the corresponding IP stream component.

A component_source_IP_address field corresponds to a 32-bit or 128-bit field, which exists when the value of the component_source_IP_address_flag field is equal to '1'. At this point, in case the IP_version_flag field is set to '0', the component_source_IP_address field indicates a 32-bit source IPv4 address for the corresponding IP stream component. Also, in case the IP_version_flag field is set to '1', the component_source_IP_address field indicates a 128-bit source IPv6 address for the corresponding IP stream component.

According to an embodiment of the present invention, in case the component_source_IP_address field exists, the source IP address of an IP datagram of the corresponding component is acquired from the component_source_IP_address field.

A component_destination_IP_address field corresponds to a 32-bit field or a 128-bit field. When the IP_version_flag field is set to '0', the component_destination_IP_address field indicates a 32-bit destination IPv4 address for the corresponding IP stream component.

Furthermore, when the IP_version_flag field is set to '1', the component_destination_IP_address field indicates a 128-bit destination IPv6 address for the corresponding IP stream component. When this field is present, the destination address of the IP datagrams carrying the corresponding component of the M/H service shall match the address in the component_destination_IP_address field. Alternatively, when this field is not present, the destination address of the IP datagrams carrying the corresponding component shall match the address in the M/H_service_destination_IP_address field. The conditional use of the 128 bit-long address version of this field is to facilitate possible future usage of the IPv6, although the usage of the IPv6 is currently undefined.

A num_component_level_descriptors field corresponds to a 4-bit field, indicating a number of descriptors providing additional information on the component level.

A number of component_level_descriptor( ) corresponding to the value of the num_component_level_descriptors field is included in the component loop, so as to provide additional (or supplemental) information on the corresponding component.

A num_MH_service_level_descriptors field corresponds to a 4-bit field indicating a number of descriptors providing additional information of the corresponding mobile service level.

A number of service_level_descriptor( ) corresponding to the value of the num_MH_service_level_descriptors field is included in the mobile service loop, so as to provide additional (or supplemental) information on the mobile service.

A num_ensemble_level_descriptors field corresponds to a 4-bit field, which indicates a number of descriptors providing additional information on ensemble levels.

Furthermore, a number of ensemble_level_descriptor( ) corresponding to the value of the num_ensemble_level_descriptors field is included in the ensemble loop, so as to provide additional (or supplemental) information on the ensemble.

FIG. 38 illustrates an embodiment of a bit stream syntax structure of a component_level_descriptors( ) The component_descriptor( ) is used as one of the component level descriptor component_level_descriptors( ) of the NST and describes additional signaling information of the corresponding component.

The following is a description of each field of the component_descriptor( ).

In FIG. 38, a descriptor_tag field (8-bit) is a descriptor identifier and it can be set as an identifier that identifies the component_descriptor( ).

A descriptor_length field (8-bit) describes the remaining length of the descriptor starting after the descriptor_length field and to the end of this descriptor, in bytes.

A component_type field (7-bit) shall identify the encoding format of the component. The value may be any of the values assigned by IRNA for the payload_type of an RTP/AVP stream, or it may be any of the values assigned by ATSC, or it may be a "dynamic value" in the range 96-127. For components consisting of media carried via RTP, the value of this field shall match the value in the payload_type field in the RTP header of the IP stream carrying this component. Note that additional values of the component_type field in the range of 43-71 can be defined in future versions of this standard.

A component_encryption_flag (1-bit) informs whether the corresponding component is encrypted or not.

A Num_STKM_streams field (8-bit) indicates the number STKM streams if component_encryption_flag has been encrypted. (The num_STKM_streams field (8-bit) is an8-bit unsigned integer field that shall identify the number of STKM streams associated with this component.

A STKM_stream_id field (8-bit) is repeated as much as the field value of Num_STKM_streams and indicates a value that identifies a SKIM stream that can acquire a key required for decryption.

A component_data (component type) element provides the encoding parameters and/or other parameters necessary for rendering this component. The structure of the component_data is determined by the value of component_type field.

For example, if the component_type field value is 35 then component_data (component_type) field provides component data for H.264/AVC video stream.

In another example, if the component_type field value is 38 then component_data (component_type) field provides data for FLUTE file delivery.

One mobile service can be included in multiple FLUTE sessions. Thus, one mobile service may be configured with plurality of FLUTE sessions. Each FLUTE session may be signaled using component_data( ).

Meanwhile, in the present invention, the mobile service, which has been described above, will be referred to as a normal service. And, in addition to the normal service, the present invention may also transmit an enhancement service. The enhancement service refers to a service having a more enhanced (or improved) as compared to the normal service. For example, the enhancement service may correspond to a Main Profile supporting service, a 3D service, a Scalable Video Coding (SVC) supporting service, and so on. In the present invention, the normal service will be referred to as a first ($1^{st}$) mobile service, and the enhancement service will be referred to as a second ($2^{nd}$) mobile service, for simplicity.

For example, if the mobile service data are coded by an H.264 method and transmitted, the compression method, such as the compression ratio, resolution, and so on, may vary depending upon the profile. In the present invention, a profile for the normal service will be referred to as a baseline profile, and a profile for the enhancement service will be referred to as a main profile. The H.264 corresponds to a next generation MPEG-4 standard technology, which is generally referred to as AVC (advanced Video Coding) and may also be referred to as MPEG-4 Part 10 or MPEG-4 AVC. In another example, when the mobile service data are coded by a SVC method and transmitted, a mobile service of a base layer for a basic picture quality corresponds to the normal service, and a mobile service of an enhancement layer for a high picture quality corresponds to the enhancement service. Similarly, when 3D broadcasting is supported, a mobile service for 2D corresponds to the normal service, and a mobile service for 3D corresponds to the enhancement service. The description of the normal service and the enhancement service provided above are merely examples given to facilitate the understanding of the present invention. And, therefore, the definition and distinction of the normal service and the enhancement service may be varied by the system designer. And, therefore, the present invention will not be limited only to the examples presented herein.

The present invention relates to signaling information identifying enhancement services (hereinafter referred to as enhanced service identification information) and to allowing the receiver to support enhancement services by using the signaling information.

According to an embodiment of the present invention, the enhancement service identification information is signaled to an FIC chunk.

According to another embodiment of the present invention, the enhancement service identification information is signaled to an SMT.

According to yet another embodiment of the present invention, the enhancement service identification information is signaled to an SLT.

According to yet another embodiment of the present invention, the enhancement service identification information is signaled to at least any one of an FIC chunk, an SMT, and an SLT.

The enhancement service identification information may be signaled to at least any one of an FIC chunk, an SMT, and an SLT in a field format and may also be signaled in a descriptor format.

According to an embodiment of the present invention, the enhancement service identification information may include at least of enhancement service (ES) indicator information (also referred to as an ES indicator field) indicating whether or not a service corresponds to the enhancement service and enhancement service (ES) type information (also referred to as an ES type field) indicating an enhancement service type. More specifically, the enhancement service identification information may include only the ES indicator information, or the enhancement service identification information may include only the ES type information, or the enhancement service identification information may include both the ES indicator information and the ES type information.

The ES indicator information indicates whether the corresponding service corresponds to a normal service or an enhancement service.

The ES type information indicates the type of the enhancement service, and, according to an embodiment of the present invention, the ES type information indicates whether the enhancement service corresponds to a main profile service, an SVC service, or a 3D service.

Hereinafter, the example of signaling the enhancement service identification information to an FIC chunk will be described in detail.

FIG. 39 illustrates a syntax structure of an FIC chunk payload according to another exemplary embodiment of the present invention. With the exception for an ES indicator field and an ES type field being further included, the FIC chunk payload of FIG. 39 is identical to the FIC chunk payload of FIG. 35. Therefore, reference may be made to FIG. 35 for the fields that are not described in FIG. 39.

According to the embodiment of the present invention, an ES indicator field and an ES type field are included in a mobile service loop. At this point, the 3-bit reserved field, which is included in the mobile service loop of the FIC chunk payload of FIG. 35, may either be deleted or may be preserved. In the embodiment of the present invention, the 3-bit reserved field is deleted, as shown in FIG. 39. More specifically, by using the 3-bit reserved field as a 1-bit ES indicator field and a 2-bit ES type field, the backward compatibility with the conventional FIC chunk may be maintained (or preserved).

According to the embodiment of the present invention, in FIG. 39, the ES indicator field may be assigned (or allocated) with 1 bit, and the ES indicator field may indicate whether the corresponding service corresponds to a normal service or an enhancement service.

According to the embodiment of the present invention, the ES type field is assigned with 2 bits, and the ES type field indicates whether the enhancement service corresponds to a main profile service, a SVC service, or a 3D service.

According to another embodiment of the present invention, the enhancement service identification information may be signaled by using an M/H_service_loop_extension_length field and its extension field (M/H_service_loop_extension_bytes field) of the FIC chunk header.

Therefore, base upon the enhancement service identification information, which is signaled to the header of the FIC chunk or to the payload of the FIC chunk, the receiver may be aware of whether or not an enhancement service is included in the corresponding ensemble, and may also be aware of the enhancement service type, and so on.

As described above, by signaling information differentiating (or identifying) an enhancement service within the FIC chunk, it may be advantageous in that whether or not a specific service uses an enhancement service may be known in advance, even when an auto scan process is performed at an FIC level. At this point, according to an embodiment of the present invention, a receiver that does not support (or provide) enhancement services may delete the information related to the enhancement service from a channel list, so as to prevent the user from viewing the corresponding information.

Figures 40, 41:
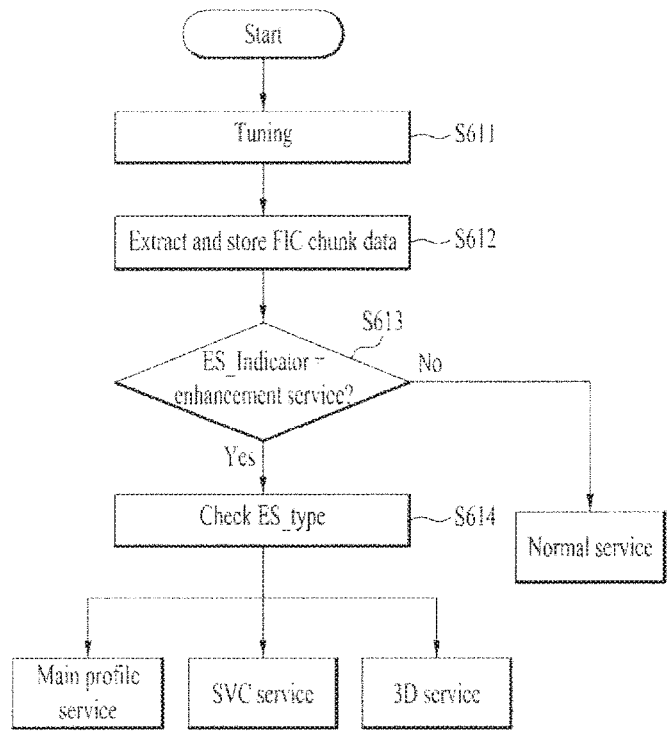
FIG. 40 illustrates a flow chart showing a method of a broadcast receiver for identifying and supporting an enhancement service according to an exemplary embodiment of the present invention.
FIG. 41 illustrates a bit stream syntax structure of an enhancement service descriptor according to an exemplary embodiment of the present invention.

FIG. 40 illustrates a flow chart of a receiver for parsing an FIC chunk so as to identify an enhancement service and for supporting the identified enhancement service.

More specifically, the receiver tunes to a channel set up in the system or a channel selected by the user, so as to receive a mobile broadcast signal (S611), and, then, the receiver gathers (or collects) FIC segments included in the data groups of the received mobile broadcast signal, thereby recovering the FIC chunk. Since the method for recovering the FIC chunk has already been described above, a detailed description of the same will be omitted for simplicity. Subsequently, the receiver extracts FIC information, which in included in the recovered FIC chunk, and stores the extracted FIC information in the memory (S612). According to the embodiment of the present invention, the FIC information includes enhancement service identification information. According to the embodiment of the present invention, the enhancement service identification information includes at least one of an ES indicator field and an ES type field.

At this point, the receiver verifies the ES indicator field value (S613), and, when the verified value indicates the normal service, the receiver performs a processing operation for a normal service including audio/video. If the ES indicator field value indicates the enhancement service, the receiver verifies the ES type field value (S614). Thereafter, if the ES type field value indicates a main profile service, the receiver performs a processing operation for the main profile service, if the ES type field value indicates a SVC service, the receiver performs a processing operation for the SVC service, and, if the ES type field value indicates a 3D service, the receiver performs a processing operation for the 3D service.

Hereinafter, an example of signaling enhancement service identification information to an SMT will be described in detail.

The enhancement service identification information may be included in the SMT in a field format or may be included in the SMT descriptor format. If the enhancement service identification information is included in the descriptor format, this descriptor will then be referred to as an enhancement service descriptor. According to the embodiment of the present invention, the enhancement service descriptor is included in a service level descriptor.

FIG. 41 illustrates a bit stream syntax structure of an enhancement service descriptor according to an exemplary embodiment of the present invention.

In FIG. 41, a descriptor tag field (8 bits) corresponds to a descriptor identifier, wherein an identifier identifying the corresponding descriptor as an enhancement service descriptor is allocated thereto.

A descriptor_length field (8 bits) indicates the length of the remaining descriptor in byte units starting from the descriptor_length field to the end of this descriptor.

According to the embodiment of the present invention, the ES type field is assigned with 4 bits and indicates whether the enhancement service corresponds to a main profile service, an SVC service, or a 3D service. The ES type field may also be assigned with 2 bits instead of 4 bits.

According to the embodiment of the present invention, if the enhancement service descriptor shown in FIG. 41 is included in the SMT as a service level descriptor, the enhancement service descriptor may use an MH_service_category field within a mobile service loop of the SMT, so as to indicate that the corresponding service is an enhancement service. According to the embodiment of the present invention, in case the corresponding service is an enhancement service, a value of 0x0A is allocated to the MH_service_category field. In this case, when the MH_service_category field is equal to 0x0A, a receiver supporting (or providing) enhancement services may parse the enhancement service descriptor, so as to acquire the type information of the corresponding enhancement service.

Meanwhile, in the present invention, an ES type field may also be included in the mobile service loop of the SMT in a field format.

FIG. 42 illustrates a syntax structure of an SMT according to another exemplary embodiment of the present invention. With the exception for an ES type field being further included, the SMT of FIG. 42 is identical to the SMT of FIG. 37. Therefore, reference may be made to FIG. 37 for the fields that are not described in FIG. 42.

In FIG. 42, by using the 2-bit reserved area field of FIG. 37 as a 2-bit ES type field, the backward compatibility with the conventional SMT may be maintained (or preserved). More specifically, according to the embodiment of the present invention, the ES type field of FIG. 42 is assigned (or allocated), and the ES type field indicates whether the enhancement service corresponds to a main profile service, an SVC service, or a 3D service. At this point, according to the embodiment of the present invention, a value of 0x0A is assigned (or allocated) to the MH_service_category field, so that the MH_service_category field can indicate that the corresponding service is an enhancement service.

As described above, according to the embodiment of the present invention, the present invention may use at least one of an MH_service_category field, an ES type field, and an ES descriptor of the SMT, so as to signal the enhancement service identification information.

Additionally, the present invention may also newly extend the SMT in order to signal the enhancement service identification information. In this case, according to the present invention, the SMT_protocol_version field value is changed, while the 2-bit reserved area field is preserved (or maintained) without variation, and an ES type field is newly added. Herein, according to the embodiment of the present invention, the ES type field is assigned with 8 bits and indicates whether the enhancement service corresponds to a main profile service, an SVC service, or a 3D service. At this point, also, according to the embodiment of the present invention, by assigning the MH_service_category field with the value of 0x0A, this may indicate that the corresponding service is an enhancement service. According to the embodiment of the present invention, when the ES type field indicates a 3D service, a 3D descriptor including information for the 3D service may be further included as a service level descriptor.

Meanwhile, the present invention may signal enhancement service identification information to the SLT. According to the embodiment of the present invention, the method for signaling the enhancement service identification information to the SMT is applied to the method for signaling the enhancement service identification information to the SLT. Additionally, according to the embodiment of the present invention, even when newly extending the SLT in order to signal the enhancement service identification information, the SLT_protocol_version field value is changed, and the same signaling method described in the SMT is applied herein. According to the embodiment of the present invention, in the SLT, a value of 0x0A is assigned to the MH_service_category field, so as to indicate that the corresponding service is an enhancement service. Moreover, according to the embodiment of the present invention, the enhancement service identification information is signaled by using one of an MH_service_category field, an ES type field, and an ES descriptor of the SLT. By signaling the enhancement service identification information to the SLT, the enhancement service may be identified even when performing auto scan at an SLT level. At this point, also, according to an embodiment of the present invention, a receiver that does not support (or provide) enhancement services may delete the information related to the enhancement service from a channel list, so as to prevent the user from viewing the corresponding information.

As described above, in the present invention, by correcting the signaling information of a management layer, such as the FIC chunk, SMT, and SLT, and signaling the enhancement service identification information, the receiver may support (or provide) the enhancement service.

Figure 43:
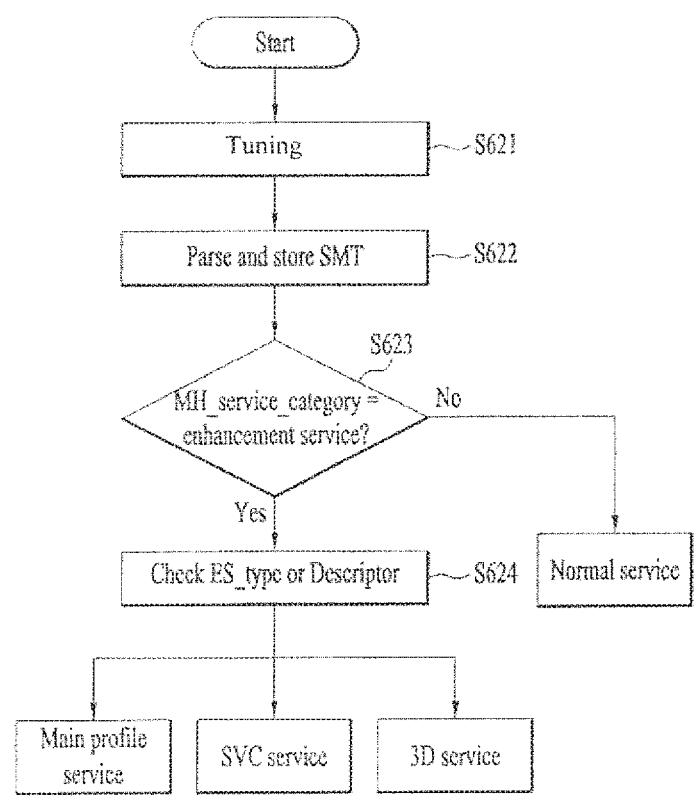
FIG. 43 illustrates a flow chart showing a method of a broadcast receiver for identifying and supporting an enhancement service according to another exemplary embodiment of the present invention.

FIG. 43 illustrates a flow chart of a receiver for parsing an SMT so as to identify an enhancement service and for supporting the identified enhancement service.

More specifically, the receiver tunes to a channel set up in the system or a channel selected by the user, so as to receive a mobile broadcast signal (S621), and, then, the receiver gathers (or collects) mobile service data included in the data groups of the received mobile signal, thereby building an RS frame. At this point, an ensemble belonging to the RS frame includes an SMT. Then, by parsing the SMT from the ensemble, the receiver stores the information included in the SMT in the memory (S622). According to the embodiment of the present invention, the SMT include service identification information. According to the embodiment of the present invention, the enhancement service identification information includes an MH_service_category field and also includes one of an ES type field and an enhancement service descriptor. Herein, the enhancement service descriptor is included in the SMT as a service level descriptor and includes ES type information.

Therefore, the receiver verifies the ES MH_service_category field value (S623), and, when the verified value indicates the normal service, the receiver performs a processing operation for a normal service including audio/video. If the MH_service_category field value indicates the enhancement service, the receiver verifies the ES type field value (S624). Thereafter, if the ES type field value indicates a main profile service, the receiver performs a processing operation for the main profile service, if the ES type field value indicates a SVC service, the receiver performs a processing operation for the SVC service, and, if the ES type field value indicates a 3D service, the receiver performs a processing operation for the 3D service. If the SLT includes enhancement service identification information, the flow chart of FIG. 43 may also be applied to the SLT.

Meanwhile, according to the embodiment of the present invention, the present invention provides Social Networking Service (hereinafter referred to as SNS) by using a mobile broadcasting network. Most particularly, the present invention is intended to service (or provide) SNS messages, among diverse SNS, by using a mobile broadcasting network. In the present invention, the mobile broadcasting network refers to a broadcasting network for transmitting mobile broadcast signals. In the description of the present invention, an MH broadcasting network transmitting MH broadcasting will hereinafter be described according to the embodiment of the present invention.

Generally, a social network refers to a network established based upon a man-to-man (or person-to-person) inter-connection, and SNS refers to a service aiding (or helping) the establishment of such inter-connected relation. Examples of SNS may include twitter, Facebook, me2 day, Cyworld, and so on. The types of SNS described above are merely examples given to facilitate the understanding of the present invention. And, since the SNS types may vary diversely, the present invention will not be limited only to the examples presented herein. More specifically, all types of services that enable users to establish a human (or social) network may be applied to the present invention. Additionally, in the present invention, an SNS message may correspond to a text message, voice message, video message, and so on, which is registered by the SNS subscriber. In the description of the present invention, the text message will be given as an example of the SNS message. Furthermore, the SNS subscriber may correspond to an individual user or may correspond to an organization (or group) having a particular object, such as a broadcasting company (or broadcasting station), a program producer (or production company), and so on.

Figure 44:
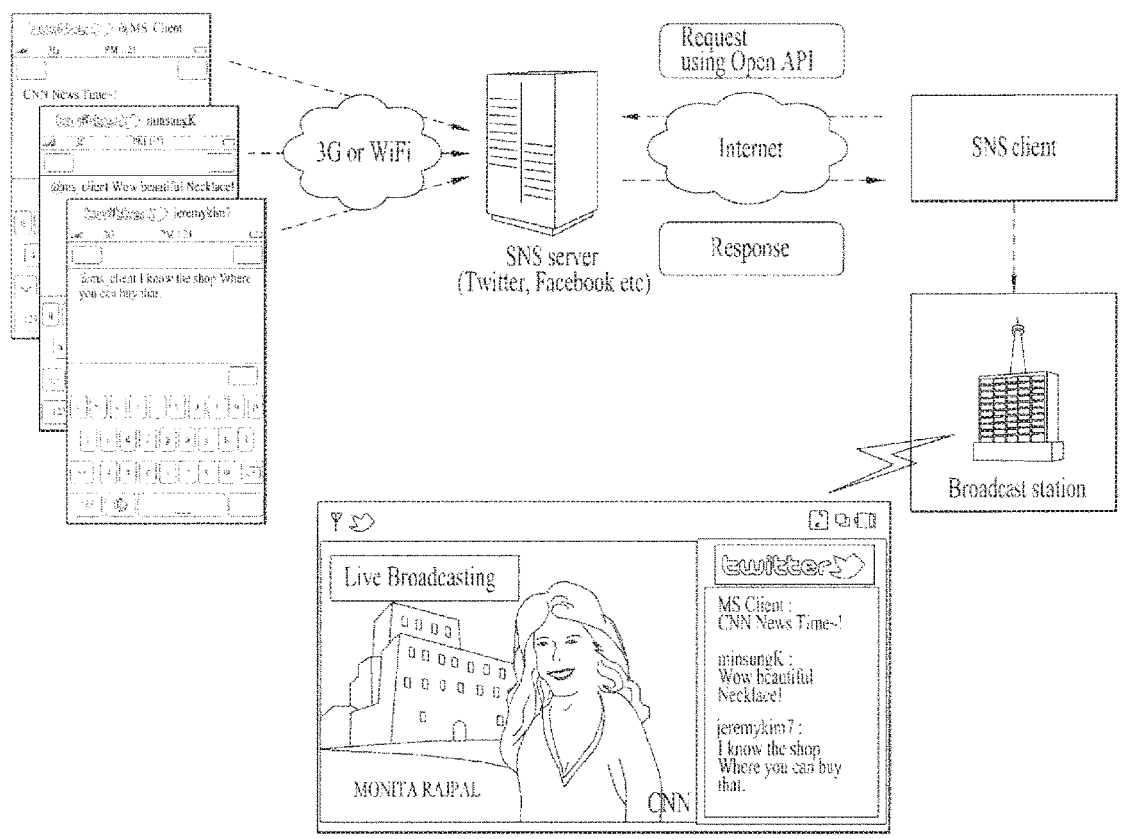
FIG. 44 illustrates a general diagram showing an overall system for supporting an SNS service through a mobile broadcast network according to the present invention.

FIG. 44 illustrates a general diagram showing an overall system for servicing an SNS service through a mobile broadcast network according to the present invention.

More specifically, when an SNS subscriber discloses (or posts) an SNS message on an SNS website via wired internet or wireless internet, such as 3G (Generation) or WiFi, the SNS message is stored in a storage unit (not shown) of the SNS server. The SNS server refers to a server that can provide SNS. An SNS client transmits the SNS message, which is stored in the SNS server, to a mobile broadcasting station. At this point, the SNS client is connected to the SNS server through the internet. According to the embodiment of the present invention, the SNS client may request for an SNS message to the SNS server by using an open API (Application Programming Interface) at constant time intervals (or time periods), and, as a response to such request, the SNS client may receive the SNS message from the SNS server and may then transmit the received SNS message to the mobile broadcasting station. According to another embodiment of the present invention, an SNS message may be provided to the SNS client each time a new message is registered to the SNS server or at a constant time interval.

At this point, the SNS client may be provided with all SNS messages stored in the SNS server, or the SNS client may be provided with SNS messages that only satisfy pre-arranged conditions. Additionally, the SNS client may also be provided only with SNS messages that are related to a specific channel or a specific program, and the SNS client may also be provided only with SNS messages best-fitting particular objects. As another example, when transmitting an SNS message from the mobile broadcasting station through a mobile broadcasting network, the SNS message may be filtered in accordance with a predetermined condition and may then be transmitted.

For example, only SNS messages posted by viewers viewing a corresponding channel (or corresponding broadcast program) through hash tags or list following may be transmitted. Herein, a hash tag (#) is included in an SNS message so as to form a link on a specific word having the corresponding tag attached thereto, thereby enabling the user to immediately move to a search page by a single click and to display the searched result. More specifically, by adding a tail tag to an SNS message, SNS messages may be grouped by the respective hash tags. For example, SNS messages may be grouped as SNS messages related (or associated) to Sports, SNS messages related to Economics, SNS messages related to Politics, and so on.

The mobile broadcasting station may use the mobile broadcasting network transmitting mobile broadcast signals, so as to transmit SNS messages provided by the SNS client to each broadcast receiver. The mobile broadcasting station may transmit only the broadcast signals for mobile broadcasting, or the mobile broadcasting station may transmit both the broadcast signals for mobile broadcasting as well as the broadcast signals for fixed broadcasting. According to the embodiment of the present invention, as described above, the mobile broadcasting station transmits both main service data for fixed broadcasting and mobile service data for mobile broadcasting.

Each broadcast receiver processes a received SNS message and displays the processed SNS message on a display unit. At this point, according to the embodiment of the present invention, the SNS message is displayed on a portion of a display screen on which a broadcast program is currently being displayed. FIG. 44 shows an example of an SNS message being displayed on a right-side portion of the broadcast program screen. The display unit may be realized as a CRT (Cathod Ray Tube), a LCD (Liquid Crystal Display), a TFT-LCD (Thin film Transistor Liquid Crystal Display), a PDP (Plasma Display Panel), a Flexible Display, a HMD (Head Mounted Display), and so on. Meanwhile, the display unit may also be configured as a PIP (Picture In Picture) screen. In this case, the mobile broadcast program being received through the mobile broadcasting network is displayed on the main screen, while the SNS message may be displayed on a subscreen. Evidently, it will be apparent to anyone skilled in the art that the display may also be realized vice versa.

The broadcast receiver may correspond to a mobile specific broadcast receiver, such as a mobile phone or a car-embedded (or car-mounted) broadcast receiver, or the broadcast receiver may also correspond to a broadcast receiver supporting both fixed broadcasting and mobile broadcasting, such as digital televisions provided in regular households.

FIG. 45 illustrates a bit stream syntax structure of an SNS message according to an exemplary embodiment of the present invention.

In the SNS message of FIG. 45, a CreationTime field (4×8 bits) indicates an SNS message creation time.

A MessageID field (64 bits) indicates an identifier identifying the SNS message.

A UserDetailPresentFlag field (1 bit) indicates whether or not personal information of the SNS subscriber exists.

An UploadImageExistFlag field (1 bit) indicates whether or not an upload image exists.

A MessageTextExtensionFlag field (1 bit) indicates whether or not an extended SNS message of a text format exists.

A MessageTextLength field (8 bits) indicates the length of the text format SNS message.

A MessageText( ) field indicates an actual SNS message. More specifically, an actual SNS message is transmitted through the MessageText( ) field.

If the UploadImageExistFlag field indicates that an upload image exists, the upload image is transmitted by using an UploadImageLength field (24 bits) and an UploadImageData( ) field.

If the MessageTextExtensionFlag field indicates that an extended SNS message exists, the extended SNS message is transmitted by using a MessageTextExtensionLength field (16 bits) and a MessageTextExtension( ) field.

A UserNameLength field (4 bits) indicates a length for the name of the corresponding SNS subscriber.

A UserNickNameLength field (4 bits) indicates a length for a nickname of the corresponding SNS subscriber.

A UserName( ) field indicates the name of the corresponding SNS subscriber.

A UserNickName( ) field indicates a nickname of the corresponding SNS subscriber.

If the UserDetailPresentFlag field indicates the presence (or existence) of personal information of the SNS subscriber, the personal information of the corresponding SNS subscriber is transmitted by using the following fields.

More specifically, a UserID field (64 bits) indicates an identifier of the corresponding SNS subscriber.

A UserLocation field (3×8 bits) indicates the current location of the corresponding SNS subscriber.

A UserDescriptionLength field (8 bits) indicates a length for additional information of the corresponding SNS subscriber.

A UserDescription( ) field describes additional information of the corresponding SNS subscriber.

A UserProfileImageURLLength field (8 bit) indicates a length for a URL having a profile image of the corresponding SNS subscriber.

A UserProfileImageURL( ) field indicates a URL having a profile image of the corresponding SNS subscriber.

A UserProfileImageLength field (24 bits) indicates a length for a profile image of the corresponding SNS subscriber.

A UserProfileImageData( ) field indicates a profile image of the corresponding SNS subscriber. For example, the profile image may correspond to a picture, and so on.

A UserURLLength field (8 bits) indicates a length for a URL of a personal homepage (or website) of the corresponding SNS subscriber.

A UserURL( ) field indicates a URL of a personal homepage (or website) of the corresponding SNS subscriber.

An IsProtected field (1 bit) indicates whether or not personal information protection has been designated for the protection of the user's privacy.

A UtcOffset field (15 bits) indicates a current offset between a GPS and a UTC.

A TimeZoneLength field (8 bits) and a TimeZone( ) field are used to indicate a time zone respective to a mobile broadcast station transmitting SNS messages.

A LanguageCode field (3×8 bits) indicates the language that is currently being used.

Meanwhile, in the present invention, a method for servicing an SNS message through a mobile broadcasting network may be divided into 2 different methods. One method corresponds to providing an SNS message subsidiary to the mobile broadcasting service, and another method corresponds to providing an SNS message independent from the mobile broadcasting service.

In the present invention, the mobile service and the mobile broadcasting service are used as the same meaning. Additionally, the SNS may also be categorized as the above-described enhancement service. In this case, according to the embodiment of the present invention, as shown in FIG. 39 to FIG. 43, enhancement identification information included in at least one of the payload and header of the FIC chunk and the SMT is applied to the SNS.

First Embodiment

A method of providing an SNS message subsidiary to a mobile broadcasting service according to a first embodiment of the present invention will hereinafter be described in detail.

According to the embodiment of the present invention, the mobile broadcasting station of the present invention transmits an SNS message at a component level. More specifically, the SNS is treated (or considered) as a component configuring one mobile broadcasting service.

Table 13 shown below shows an example of transmitting the SNS at a component level. For example, a component being included in a mobile broadcasting service entitled Fox Sports corresponds to an audio component, a video component, and an SNS component.

TABLE 13

| Service | Component |
| --- | --- |
| Fox_Sports | Audio Component |
|  | Video Component |
|  | SNS Component |
| Fox_Animation | Audio Component |
|  | Video Component |
|  | SNS Component |

For example, an SNS message that is disclosed (or posted) by accessing an account of a specific broadcast program may be included and transmitted as a component of a mobile broadcasting service corresponding to the broadcast program.

As another example, among the SNS messages disclosed (or posted) by general users, an SNS message including the broadcast program as a hash tag may be included and transmitted as a component of the mobile broadcasting service. In this case, the corresponding SNS message is subsidiary (or subordinate) to the mobile broadcasting service and is, therefore, displayed on a portion of the display screen on which the mobile broadcasting service is being displayed.

According to the embodiment of the present invention, the SNS message may be included and transmitted in a component level descriptor of the SMT. According to another embodiment of the present invention, the SNS message may be transmitted in an IP datagram format and may provide access information enabling the IP datagram to be accessed through a component loop of the SMT.

Herein, only one type of SNS may exist, or multiple types of SNS may exist. For example, only SNS messages disclosed in one type of SNS website, such as Twitter, may be transmitted, or SNS messages disclosed in 2 or more SNS websites, such as Twitter and Facebook, may be transmitted.

Additionally, according to the embodiment of the present invention, when transmitted an SNS message at a component level, a new value is assigned to a component_type field of component_descriptor( ) which is provided as component_level_descriptors( ) so that the corresponding descriptor can indicate a descriptor transmitting SNS messages.

At this point, regardless of the SNS type, only one component type may be defined with respect to all SNS, or a component type may be defined for each SNS type. More specifically, in the former case, only one value may be assigned as the component_type field value with respect to all SNS regardless of the SNS type, and, in the latter case, a component_type field value is assigned for each SNS type. For example, when Twitter and Facebook are given as the SNS, in the former case, the component_type field values respective to Twitter and Facebook are the same, and, in the latter case, the component_type field value respective to Twitter is different from the component_type field value respective to Facebook.

FIG. 46 illustrates an exemplary bit stream syntax structure of component_data( ) within component_descriptor( ) according to an exemplary embodiment of the present invention, when only one component type is defined for the SNS.

According to the embodiment of the present invention, in FIG. 46, a content_type_flag_field is assigned with 1 bit, and this field indicates whether or not an SNS message is included in the corresponding component_descriptor( ) and transmitted accordingly.

According to the embodiment of the present invention, in case the SNS message is included and transmitted in the corresponding component_descriptor( ) "1" is assigned as the content_type_flag_field value. The opposite case may also be applied, and this will be apparent to anyone skilled in the art.

According to the embodiment of the present invention, an SNS_type field is assigned with 6 bits, and this field indicates the type of the corresponding SNS. For example, this field indicates whether the corresponding SNS corresponds to Twitter, Facebook, me2 day, and so on.

An update_duration field indicates a cycle (or duration) according to which the SNS client sends a Quary to the SNS server in order to request the SNS server for an SNS message, and this field may be omitted. More specifically, in case the SNS server automatically provides the SNS client with an SNS message in accordance with a predetermined condition, without receiving any request from the SNS client, the update_duration field is not used.

At this point, if the content_type_flag_field value is equal to 1, a 'for' loop (also referred to as an SNS message loop) is performed as many times as the number of SNS messages corresponding to the num_SNS_message field value, thereby providing a number of actual SNS messages corresponding to the number of SNS messages. More specifically, the num_SNS_message field indicates a number of SNS messages being included and transmitted in the corresponding component_descriptor( ). At this point, according to the embodiment of the present invention, the fields included in the SNS message loop are identical to the fields of FIG. 45. Accordingly, reference may be made to FIG. 45 for the detailed description of each field included in the SNS message loop, and, therefore, detailed description of the same will be omitted for simplicity.

FIG. 47 illustrates an exemplary bit stream syntax structure of component_data( ) within component_descriptor( ) according to an exemplary embodiment of the present invention, when a component type is defined for each SNS type.

In FIG. 47, since the component type is defined for each SNS type, the SNS type may be known from the component_type field value included in the component_descriptor( ).

Therefore, in FIG. 47, the SNS_type field is omitted. Additionally, the update_duration field may also be omitted.

At this point, also, if the content_type_flag_field value is equal to 1, a 'for' loop (also referred to as an SNS message loop) is performed as many times as the number of SNS messages corresponding to the num_SNS_message field value, thereby providing a number of actual SNS messages corresponding to the number of SNS messages. According to the embodiment of the present invention, the fields included in the SNS message loop of FIG. 47 are also identical to the fields of FIG. 45. Accordingly, reference may be made to FIG. 45 for the detailed description of each field included in the SNS message loop of FIG. 47, and, therefore, detailed description of the same will be omitted for simplicity.

Meanwhile, in the present invention, the SNS message may be transmitted in an IP datagram format. More specifically, a UDP header and an IP header are added to the SNS message, so as to configure an IP packet. In the description of the present invention, such IP packet will be referred to as an IP datagram. At this point, according to the embodiment of the present invention, a destination (also referred to as a target) IP address for accessing an IP datagram including the SNS message and a UDP port number are included in the SMT and transmitted accordingly.

According to the embodiment of the present invention, the destination IP address for accessing an IP datagram of the SNS message is signaled to a component_destination_IP_address field within a component loop of the SMT, and the destination UDP port number is signaled to a component_destination_UDP_port_num field.

More specifically, an SNS message is included in a payload located after an UDP/IP header of an IP packet, which is identified by the component_destination_UDP_port_num field and the component_destination_IP_address field.

FIG. 48 illustrates an exemplary bit stream syntax structure of an SNS message being transmitted in an IP datagram format according to an exemplary embodiment of the present invention. According to the embodiment of the present invention, in FIG. 48, with the exception for the num_SNS_message field, the remaining fields shown in FIG. 48 are identical to those of FIG. 45. Therefore, reference may be made to FIG. 45 for the detailed description of each field of the SNS message, which is included in the payload of the IP packet, and detailed description of the same will be omitted for simplicity.

Additionally, when transmitting the SNS in the format of an IP datagram, additional information of the corresponding SNS message is signaled by using the component_descriptor( ) which is being provided as the component_level_descriptors( ).

At this point, also, regardless of the SNS type, a single component type may be defined with respect to all SNS, or a component type may be defined for each SNS.

FIG. 49 illustrates an exemplary bit stream syntax structure of component_data( ) within component_descriptor( ) according to another exemplary embodiment of the present invention, when only one component type is defined for the SNS.

In FIG. 49, the content_type_flag_field value is set to 0. More specifically, this indicates that an SNS message is not included and transmitted in the corresponding component_descriptor( ) In other words, this indicates that the SNS message is transmitted in an IP datagram format, and that the SMT provides access information for accessing the IP datagram.

According to the embodiment of the present invention, an SNS_type field is assigned with 6 bits, and this field indicates the type of the corresponding SNS. For example, this field indicates whether the corresponding SNS corresponds to Twitter, Facebook, me2 day, and so on.

An update_duration field indicates a cycle (or duration) according to which the SNS client sends a Quary to the SNS server in order to request the SNS server for an SNS message, and this field may be omitted.

Additionally, according to the embodiment of the present invention, even when the component type for the SNS is defined for each SNS, the signaling information, shown in FIG. 49, is transmitted to the component_data( ) of the corresponding component_descriptor( ).

Meanwhile, according to yet another embodiment of the present invention, an SNS message that is subsidiary to the mobile broadcasting service may be transmitted at a service level.

FIG. 50 illustrates a table showing an example of an SNS message being included in a service level descriptor of the SMT and being transmitted at a service level. In the description of the present invention, the service level descriptor transmitting the SNS message will be referred to as an MH_SNS_Message_descriptor( ). At this point, a service category field value within the SMT is not changed. In FIG. 50, when Fox Sports is given as an example, the service category field value within the SMT indicates that the corresponding service is TV, and, herein, MH_SNS_Message_descriptor( ) is transmitted as the service level descriptor. Additionally, a component for the TV is configured of an audio component and a video component, as in the related art.

FIG. 51 illustrates a bit stream syntax structure of MS_SNS_Message_descriptor( ) according to an exemplary embodiment of the present invention.

In FIG. 51, being a descriptor identifier, a descriptor_tag field (8 bits) is configured as an identifier identifying the MH_SNS_Message_descriptor( ).

A descriptor_length field (8 bits) indicates the remaining length of the descriptor starting from the descriptor_length field to the end of this descriptor in byte units.

An SNS type field (6 bits) indicates the type of the corresponding SNS. For example, this field indicates whether the corresponding SNS corresponds to Twitter, Facebook, me2 day, and so on.

An update_duration field indicates a cycle (or duration) according to which the SNS client sends a Quary to the SNS server in order to request the SNS server for an SNS message, and this field may be omitted.

A num_SNS_message field indicates a number of SNS messages being included and transmitted in the MH_SNS_Message_descriptor( ).

Subsequently, a 'for' loop (also referred to as an SNS message loop) is performed as many times as the number of SNS messages corresponding to the num_SNS_message field value, so as to transmit a number of actual SNS messages corresponding to the number of SNS messages. At this point, according to the embodiment of the present invention, the fields being included in the SNS message loop are identical to the fields of FIG. 45. Therefore, reference may be made to FIG. 45 for the detailed description of each field included in the SNS message loop, and, herein, detailed description of the same will be omitted for simplicity.

Second Embodiment

A method of servicing (or providing) an SNS message independent from a mobile broadcasting service according to a second embodiment of the present invention will hereinafter be described in detail.

According to the embodiment of the present invention, in order to do so, the present invention treats (or considers) the SNS as a single independent service. Additionally, in order to indicate that the corresponding service is an SNS, a value is newly assigned to the service category field within the SMT.

Furthermore, in order to provide an independent SNS to the mobile broadcast service, MH_SNS_associated_descriptor( ) is transmitted as a service level descriptor of a mobile service loop corresponding to the mobile broadcast service within the SMT. According to the embodiment of the present invention, the MH_SNS_associated_descriptor( ) includes a service identifier for identifying the SNS as a service.

FIG. 52 illustrates a table for transmitting an SNS message independent from a mobile broadcast service through a mobile broadcast network according to an exemplary embodiment of the present invention. Herein, FIG. 52 shows an example of the SNS being processed (or treated) as a single service and a service category field value being newly assigned for the SNS in order to do so. Additionally, FIG. 52 shown an example of MH_SNS_associated_descriptor( ) being included as a service level descriptor of the mobile service loop corresponding to each mobile broadcast service. More specifically, SNS related to Fox is being transmitted as a single service.

At this point, as shown in FIG. 46 or FIG. 47, an SNS message may be included in the component_descriptor( ) so as to be transmitted at a component level. According to another embodiment of the present invention, as shown in FIG. 48, the SNS message may also be transmitted in an IP datagram format. At this point, according to the embodiment of the present invention, access information for accessing the IP datagram may be included and transmitted in the SMT. The access information for accessing the IP datagram includes a destination IP address and a destination UDP port number, and the destination IP address is signaled to at least one of a service_destination_IP_address field and a component_destination_IP_address field within the SMT, and the destination UDP port number is signaled to at least one of a service_destination_UDP_port_num field and a component_destination_UDP_port_num field within the SMT.

According to yet another embodiment of the present invention, as shown in FIG. 51, the SNS message may be included in the MH_SNS_Message_descriptor( ) so as to be transmitted at a service level.

FIG. 53 illustrates a bit stream syntax structure of MS_SNS_associated_descriptor( ) according to an exemplary embodiment of the present invention.

In FIG. 53, a descriptor_tag field (8 bits) corresponds to a descriptor identifier, wherein an identifier for identifying MH_SNS_associated_descriptor( ) is set up.

A descriptor_length field (8 bits) indicates the remaining length of the descriptor starting from the descriptor_length field to the end of this descriptor in byte units.

A num_SNS_associated_services field indicates a number of SNSs being included in the corresponding MH_SNS_associated_descriptor( ) For example, even if the SNSs correspond to the same SNS type, if the SNSs are transmitted to different groups, the number of groups may be assigned as the num_SNS_associated_services field value.

Thereafter, a 'for' loop (also referred to as an SNS associated message loop) is performed as many times as the number of SNS services corresponding to the num_SNS_associated_services field value. The SNS associated message loop includes an SNS_associated_service field, and the SNS_associated_service field indicates an service identifier for uniquely identifying the corresponding SNS as a single service. The SNS_associated_service field value has the same value as the MH_service_id field within the corresponding mobile service loop. Therefore, by using the SNS_associated_service field, it may be known to which service identifier the corresponding SNS is being provided.

In the present invention, SNS messages disclosed (or posted) on a single SNS website may be grouped, so as to be transmitted to each SNS service. This may be performed by the SNS client or may be performed by a mobile broadcasting station. For example, with respect to a single broadcast channel, the mobile broadcasting station may independently transmit an SNS service including SNS messages associated to Sports, an SNS service including SNS messages associated to Economics, an SNS service including SNS messages associated to Politics, and so on. In this case, each SNS service may be given a name by a short_MH_service_name field of the SMT. More specifically, by using hash tags, the SNS messages may be grouped as SNS messages associated to Sports, SNS messages associated to Economics, SNS messages associated to Politics, and so on.

FIG. 54 illustrates a table showing an example of SNS messages being grouped into 3 SNS services and then transmitted. More specifically, FIG. 54 shows an example of SNS messages being grouped to an SNS service associated to Sports of Fox Channel (Fox_SNS_sports), an SNS service associated to Economics of Fox Channel (Fox_SNS_economics), and an SNS service associated to Politics of Fox Channel (Fox_SNS_politics). In FIG. 54, a MH_SNS_associated_descriptor( ) including an identifier of Fox_SNS_sports is transmitted as a service level descriptor of a mobile service loop of the mobile broadcast service corresponding to Fox_sports, and a MH_SNS_associated_descriptor( ) including identifiers of Fox_SNS_economics and Fox_SNS_ politics is transmitted as a service level descriptor of a mobile service loop of the mobile broadcast service corresponding to Fox_society.

Figure 55:
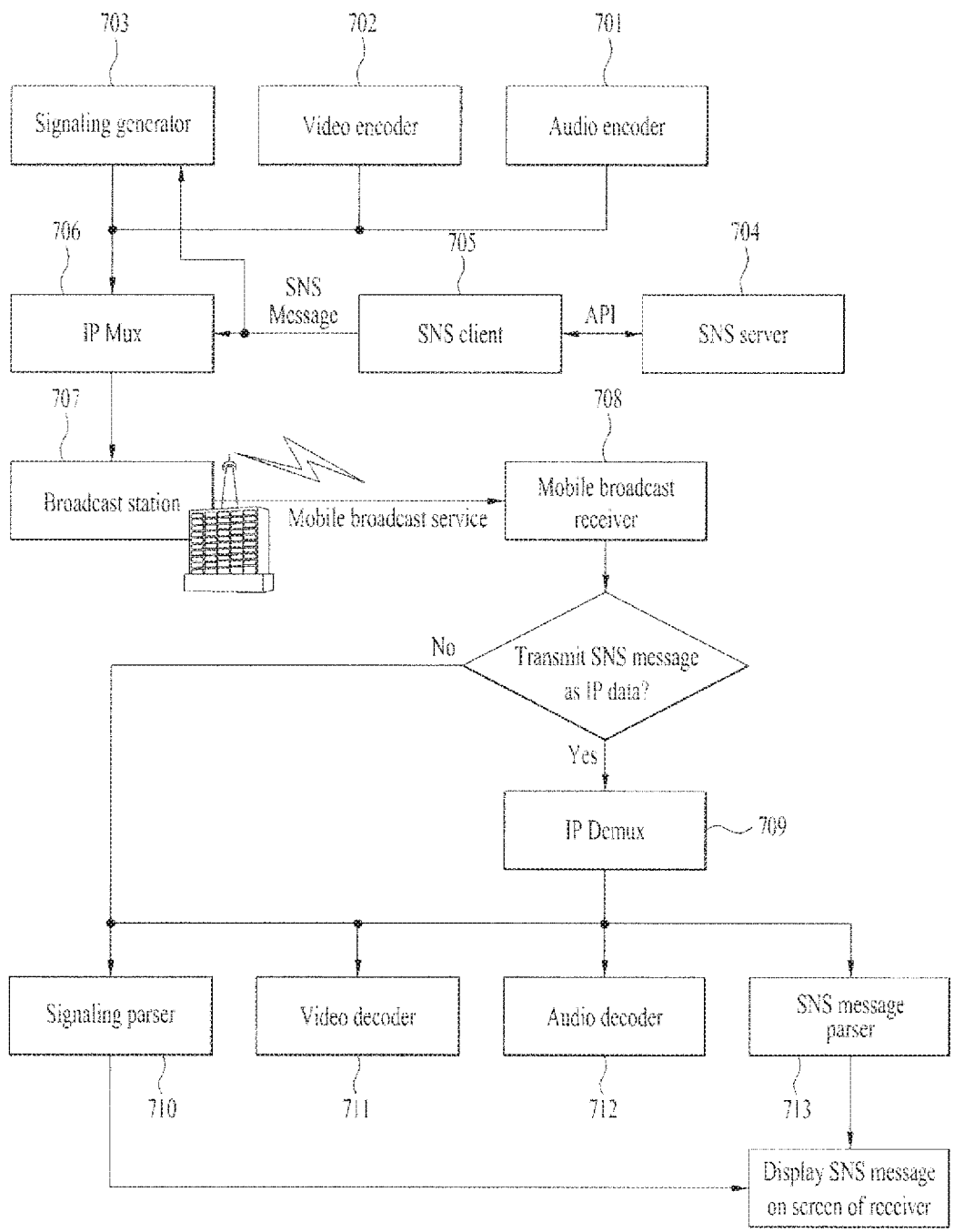
FIG. 55 illustrates an overall flow chart for servicing an SNS message on a mobile broadcast screen according to the present invention.

FIG. 55 illustrates an overall flow chart of the present invention, which provides an SNS message by using a mobile broadcasting network.

More specifically, an audio encoder (701), a video encoder (702), a signaling generator (703) correspond to block diagrams for a mobile broadcast service. The audio encoder (701) encodes an audio component, which configures the mobile broadcast service, in accordance with a predetermined encoding algorithm and then outputs the encoded audio component to an IP MUX (706), the video encoder (702) encodes a video component, which configures the mobile broadcast service, in accordance with a predetermined encoding algorithm and then outputs the encoded video component to the IP MUX (706). The signaling generator (703) generates at least one or more signaling tables, among SMT, CIT, SLT, GAT, and RRT, and then outputs the generated signaling table(s) to the IP MUX (706).

Meanwhile, an SNS client (705) uses an open API to bring out (or acquire) an SNS message stored in an SNS server (704) and then outputs the acquired SNS message to the signaling generator (703) and/or the IP MUX (706). The signaling generator (703) generates an SMT by applying a transmission method of an SNS message, a type of the SNS message, and so on. Being subsidiary (or subordinate) to the mobile broadcast service including an audio component and a video component, the SNS message may be included and transmitted in a component level descriptor or service level descriptor of the SMT, or the SNS message may be transmitted in the form of an IP datagram. Additionally, being independent from the mobile broadcast service including an audio component and a video component, the SNS message may be included and transmitted in a component level descriptor or service level descriptor of the SMT, or the SNS message may be transmitted in the form of an IP datagram.

The audio component, video component, signaling table, and so on, are provided to the IP MUX (706) in the form of IP datagrams, so as to be multiplexed, and, then, the multiplexed IP datagrams may be transmitted (or outputted) to a broadcast receiver (708) from the mobile broadcasting station (707) through a mobile broadcasting network. Alternatively, the IP MUX (706) may also create each IP datagram and multiplex the created IP datagrams, thereby transmitting (or outputting) the multiplexed IP datagrams to a broadcast receiver (708) from the mobile broadcasting station (707) through a mobile broadcasting network. At this point, if the SNS message is transmitted in the form of an IP datagram, the SNS message is multiplexed by the IP MUX (706). The IP MUX (706) may be included in the mobile broadcasting station (707) or may be separately configured. According to the exemplary embodiment of the present invention, in the present invention, an IP datagram including the SNS message is included and transmitted in at least one of the RS frames.

The broadcast receiver (708) processes the broadcast signal being received through the mobile broadcasting network and, then, the broadcast receiver (708) provides a mobile broadcast service and an SNS message to the user through a display unit.

According to the embodiment of the present invention, in FIG. 55, an IP DEMUX (709), a signaling parser (710), a video decoder (711), an audio decoder (712), and an SNS message parser (713) are included in the broadcast receiver.

More specifically, the broadcast receiver (708) parses the SMT, which is included in the RS frame, so as to be received, and then verifies whether the SNS message is included and received in a service level descriptor or a component level descriptor of the SMT or whether the SNS message is received in the form of an IP datagram. This may be known by verifying a content_type_flag_field within the SMT. If the SNS message is included and received in a service level descriptor or component level descriptor of the SMT, the signaling parser (710) may parse the corresponding descriptor within the SMT, so as to acquire the SNS message. Meanwhile, if the SNS message is received in the form of an IP datagram, an IP datagram transmitting the video component, an IP datagram transmitting the audio component, an IP datagram transmitting the SNS message, and so on, are demultiplexed by the IP DEMUX (709), so as to be respectively transmitted to each of the video decoder (711), the audio decoder (712), and the SNS message parser (713).

The SNS message parser (713) extracts an IP address and UDP port number of an IP datagram transmitting the SNS message from the SMT, and, then, the SNS message parser (713) acquires an SNS message from an IP datagram, which is identified by the extracted IP address and UDP port number. More specifically, if an SNS message is included and received in an IP datagram, an SNS IP socket may be opened, so as to receive an IP datagram including an SNS message, thereby acquiring the SNS message.

The SNS message that is acquired by the signaling parser (710) or the SNS message parser (713) is displayed on a display unit. At this point, according to the embodiment of the present invention, the SNS message is displayed on a portion of the display screen of the mobile broadcast that is currently being broadcasted. FIG. 44 shows an example of an SNS message being displayed on a right-side portion of the broadcast screen. Herein, according to the embodiment of the present invention, SNS messages are displayed by an order in which the SNS messages are stored in the SNS server. In the present invention, if the SNS message is subordinate (or subsidiary) to the mobile broadcast service, the SNS message may be displayed on a portion of the display screen, on which the mobile broadcast service is being provided, in an overlapped form. Additionally, if the SNS message independent from the mobile broadcast service, the SNS message may be displayed on a display screen (e.g., PIP screen) separate from the display screen on which the mobile broadcast service is being provided. According to the embodiment of the present invention, the display unit may be realized as a touchscreen. Herein, a touchscreen refers to a screen that is capable of determining a specific location within a screen, when a text shown on the screen or a specific location of the screen is touched by the user's hand or by another object, without using any other separate input device, and performing a specific processing operation by using a stored software.

Additionally, when an SNS message is received through a mobile broadcasting network, the present invention may notify the user of the presence of the SNS message through a menu screen, an icon, and so on. For example, when it is assumed that an SNS message posted (or disclosed) on Twitter is being received, the present invention may display a Twitter icon (e.g., an icon depicting a bird) representing Twitter on an upper left side portion of the display unit. At this point, when the user clicks on the Twitter icon, the corresponding SNS message is displayed on the right side of the display screen, as shown in FIG. 44. The displayed location of the SNS message shown in FIG. 44 is merely exemplary, and, therefore, the displayed location of the SNS message may be set to any one of an upper portion, a lower portion, a left side portion, and a right side portion of the display screen in accordance with the intention of the system designer. Each time the Twitter icon is being clicked on, the present invention may turn the display of the SNS message provided from the SNS service (i.e., Twitter server) On/Off. Herein, the On/Off mode of the SNS message may be realized by a toggle motion of a specific key.

Furthermore, if SNS messages posted (or disclosed) on two or more SNS websites are being received, the present invention may select an SNS message from at least one SNS website by using a menu screen including an icon or an SNS website list. If multiple SNS websites are selected, the respective SNS messages may be simultaneously displayed, or a display order may be selected, so that the SNS messages can be displayed by the selected display order. Moreover, even when SNS messages posted (or disclosed) on a single SNS website are grouped into multiple groups and then received, an SNS messages from at least one of the groups may be selected by using a menu screen including an SNS group list.

Receiving System

Figure 56:
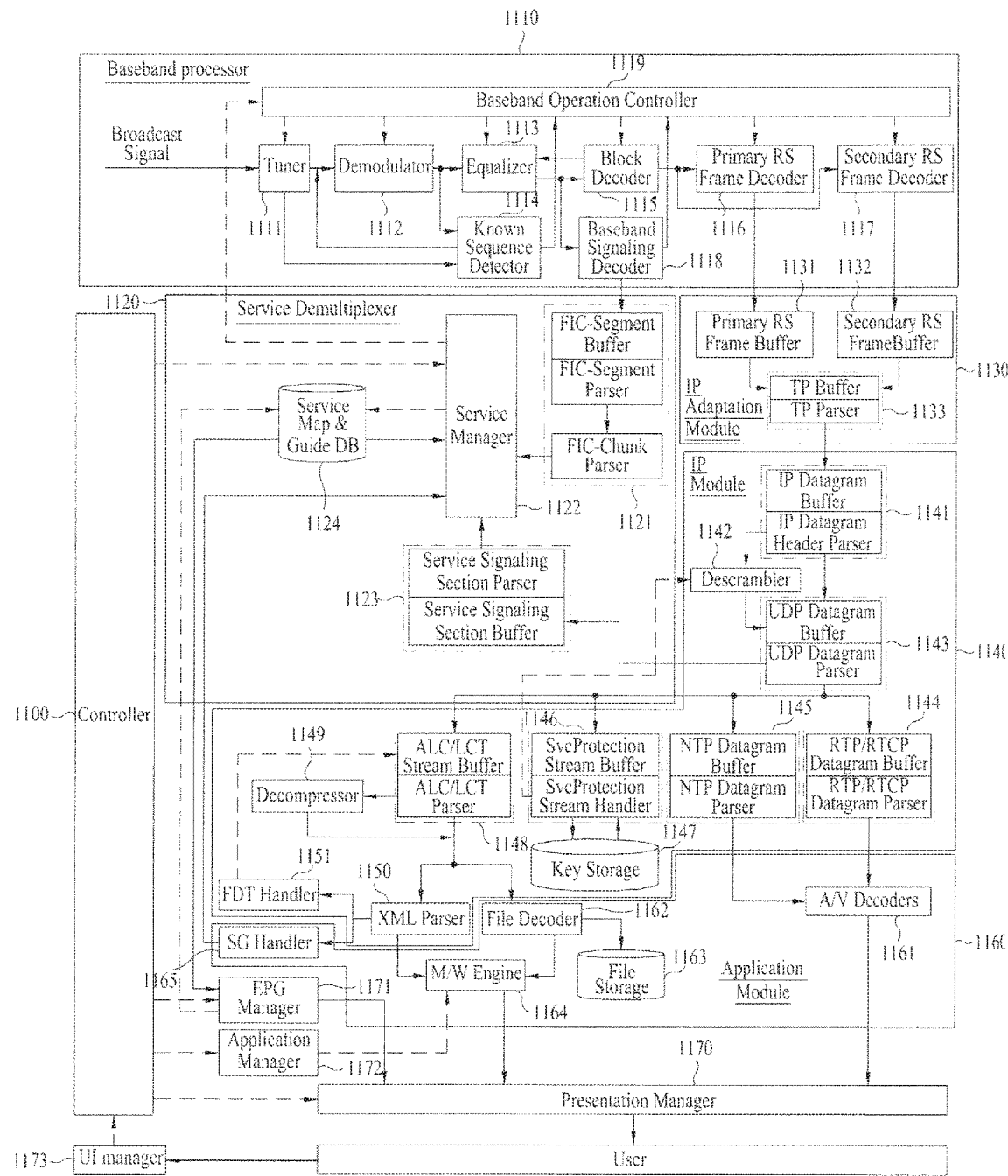
FIG. 56 illustrates a block diagram of a receiving system according to an embodiment of the present invention.

FIG. 56 illustrates a block diagram showing a general structure of a receiving system according to an embodiment of the present invention. Referring to FIG. 56, the arrow shown in dotted line indicates a data path, and the arrow shown in slid line indicates a control signal path.

The receiving system according to the present invention may include a controller 1100, a tuner 1111, a demodulator 1112, an equalizer 1113, a known sequence detector (or known data detector) 1114, a block decoder 1115, a primary Reed-Solomon (RS) frame decoder 1116, a secondary RS frame decoder 1117, a signaling decoder 1118, and a baseband operation controller 1119. The receiving system according to the present invention may further include an FIC handler 1121, a service manager 1122, a service signaling handler 1123, and a first storage unit 1124. The receiving system according to the present invention may further include a primary RS frame buffer 1131, a secondary RS frame buffer 1132, and a transport packet (TS) handler 1133. The receiving system according to the present invention may further include an Internet Protocol (IP) datagram handler 1141, a descrambler 1142, an User Datagram Protocol (UDP) datagram handler 1143, a Real-time Transport Protocol/Real-time Transport Control Protocol (RTP/RTCP) datagram handler 1144, a Network Time Protocol (NTP) datagram handler 1145, a service protection stream handler 1146, a second storage unit 1147, an Asynchronous Layered Coding/Layered Coding Transport (ALC/LCT) stream handler 1148, an Extensible Mark-up Language (XML) parser 1150, and a Field Device Tool (FDT) handler 1151. The receiving system according to the present invention may further include an Audio/Video (A/V) decoder 1161, a file decoder 1162, a third storage unit 1163, a middle ware (M/W) engine 1164, and a Service Guide (SG) handler 1165. The receiving system according to the present invention may further include an Electronic Program Guide (EPG) manager 1171, an application manager 1172, and an User Interface (UI) manager 1173.

Herein, for simplicity of the description of the present invention, the tuner 1111, the demodulator 1112, the equalizer 1113, the known sequence detector (or known data detector) 1114, the block decoder 1115, the primary RS frame decoder 1116, the secondary RS frame decoder 1117, the signaling decoder 1118, and the baseband operation controller 1119 will be collectively referred to as a baseband processor 1110. The FIC handler 1121, the service manager 1122, the service signaling handler 1123, and the first storage unit 1124 will be collectively referred to as a service multiplexer 1120. The primary RS frame buffer 1131, the secondary RS frame buffer 1132, and the TS handler 1133 will be collectively referred to as an IP adaptation module 1130. The IP datagram handler 1141, the descrambler 1142, the UDP datagram handler 1143, the RTP/RTCP datagram handler 1144, the NTP datagram handler 1145, the service protection stream handler 1146, the second storage unit 1147, the ALC/LCT stream handler 1148, the XML parser 1150, and the FDT handler 1151 will be collectively referred to as a common IP module 1140. The A/V decoder 1161, the file decoder 1162, the third storage unit 1163, the M/W engine 1164, and the SG handler 1165 will be collectively referred to as an application module 1160. The baseband processor 1110 according to the present invention may further include a main service data processing unit (not shown) for main service data. Also, the receiving system may further include a power controller (not shown) controlling the power supply of the baseband processor 1110. By performing carrier wave synchronization recovery, frame synchronization recovery, and channel equalization using known data transmitted from the transmitting system, the baseband processor 1110 may enhance the receiving performance. Also, by having the baseband processor 1110 turn on the power only in the slot(s) where a data group of a parade including the requested mobile service is assigned, the power consumption rate of the receiving system may be reduced.

Meanwhile, in the transmitting system, the transmitting may insert signaling information (or TPC information) including a transmission parameter in at least one of a signaling information region, a field synchronization region, a known data region, and a mobile service data region, and may transmit the processed data. Accordingly, the baseband processor 1110 may extract the transmission parameter from at least one of the signaling information region, the field synchronization region, the known data region, and the mobile service data region.

The transmission parameter may include M/H frame information, sub frame information, slot information, parade-related information (e.g., parade ID, parade repetition cycle period, etc.), data group information within the subframe, RS frame mode information, RS code mode information, SCCC block information, SCCC outer code mode information, FIC version information, and so on.

The baseband processor 1110 uses the extracted transmission parameter to perform block decoding, RS frame decoding, and so on. For example, the baseband processor 1110 refers to the SCCC-related information (e.g., SCCC block information, SCCC outer code mode) within the transmission parameter, so as to perform block decoding of each region within the data group, and also refers to RS-relation information (e.g., RS code mode), so as to perform RS frame decoding of each region within the data group.

The terms used in FIG. 56 are general terms that are currently being broadly used. However, according to the advent of new technology, terms deemed to be most appropriate by the applicant are also arbitrarily used in the present invention. The definition of such terms will be described clearly and in detail during the description of the corresponding portion of the present invention. Therefore, the terms used in the present invention should be understood by the significance lying within the terms and not merely by the term itself.

The baseband operation controller 1119 configured as shown in FIG. 56 controls the operation of each block included in the baseband processor 1110.

By tuning the receiving system to the frequency of a specific physical channel (or physical transmission channel (PTC)), the tuner 1111 performs a role enabling the receiving system to receive main service data, which correspond to broadcast signals for fixed broadcast receiving systems, and mobile service data, which correspond to broadcast signals for mobile broadcast receiving systems. At this point, the frequency of the tuned specific channel is down-converted to an intermediate frequency (IF), thereby being outputted to the demodulator 1112 and the known sequence detector 1114. The passband digital IF signal being outputted from the tuner 1111 may only include only the main service data or only the mobile service data or both the main service data and the mobile service data.

The demodulator 1112 performs self-gain control, carrier wave recovery, and timing recovery on the passband digital IF signal being inputted from the tuner 1111, so as to create a baseband signal. Then, the demodulator 1112 outputs the read baseband signal to the equalizer 1113 and the know sequence detector 1114. When performing carrier wave recovery and timing recovery, the demodulator 1112 may use the known data symbol sequence received from the known sequence detector 1114), so as to enhance the demodulating performance.

The equalizer 1113 compensates the channel distortion included in the demodulated signal, thereby outputting the processed signal to the block decoder 1115. The equalizer 1113 may enhance the equalizing performance by using the known data symbol sequence received from the known sequence detector 1114. Also, the equalizer 1113 may receive feedback on the decoding result of the block decoder 1113, thereby enhancing the equalizing performance.

The known sequence detector 1114 detects the position of the known data being inputted by the transmitting system from the input/output data of the demodulator 1112, i.e., data prior to being processed with the demodulation process or data being partially processed with the demodulation process. Then, along with the detected position information, the known sequence detector 1114 outputs the known data sequence generated from the detected position to the demodulator 1112, the equalizer 1113, the signaling decoder 1118, and the baseband operation controller 1119. Additionally, the known sequence detector 1114 provides to the block decoder 1115 with information enabling the block decoder 1115 to differentiate mobile service data processed with additional encoding by the transmitting system from main service data that are not processed with any additional encoding.

Furthermore, although the connection is not shown in FIG. 56, the information detected by the known sequence detector 1114 may be used in the overall receiving system and may also be used in the RS frame decoder 1116, 1117.

If the data channel-equalized by the equalizer 1113 and inputted to the block decoder 1115 correspond to data processed with both block-encoding of serial concatenated convolution code (SCCC) method and trellis-encoding by the transmitting system (i.e., data within the RS frame, signaling data), the block decoder 1115 may perform trellis-decoding and block-decoding as inverse processes of the transmitting system. On the other hand, if the data channel-equalized by the equalizer 1113 and inputted to the block decoder 1115 correspond to data processed only with trellis-encoding and not block-encoding by the transmitting system (i.e., main service data), the block decoder 1115 may perform only trellis-decoding.

The data demodulated by the demodulator 1112 or the data channel-equalized by the equalizer 1113 are inputted to the signaling decoder 1118. Also, the known data (or sequence) position information detected by the known sequence detector 1114 is also inputted to the signaling decoder 1118.

The signaling decoder 1118 extracts the signaling information (e.g., TPC data, FIC data) inserted and transmitted by the transmitting system from the inputted data and decodes the extracted signaling information. Thereafter, the signaling decoder 1118 provides the decoded signaling information to a block requiring such information.

More specifically, the signaling decoder 1118 extracts the signaling information (e.g., TPC data and FIC data) inserted and transmitted by the transmitting system from the equalized data and decodes the extracted signaling information, thereby providing the decoded signaling information to the baseband operation controller 1119, the known sequence detector 1114, and the power controller. It is assumed that the TPC data and FIC data decoded by the signaling decoder 1118 correspond to data processed with both block-encoding and trellis-encoding by the transmitting system.

According to an embodiment of the present invention, the signaling decoder 1118 performs signaling decoding as an inverse process of the signaling encoder of a transmitting end, so as to extract the TPC data and FIC data. For example, the signaling decoder 1118 performs regressive turbo decoding using a parallel concatenated convolution code (PCCC) method on the data of the signaling information region among the inputted data. Then, the signaling decoder 1118 performs derandomizing on the turbo-decoded signaling data, thereby separating the FIC data and TPC data from the derandomized signaling data. Also, the signaling decoder 1118 performs RS-decoding on the separated TPC data as an inverse process of the transmitting system, thereby outputting the RS-decoded TPC data to the baseband operation controller 1119, the known sequence detector 1114, and the power controller.

Herein, the TPC data may include RS frame information, SCCC information, M/H frame information, and so on. The RS frame information may include RS frame mode information and RS code mode information. The SCCC information may include SCCC block mode information and SCCC outer code mode information. The M/H frame information may include M/H frame index information. Also, the TPC data may include subframe count information, slot count information, parade_id information, SGN information, NOG information, and so on.

Furthermore, the signaling decoder 1118 performs deinterleaving on the separated FIC data in subframe units and then performs RS-decoding on the deinterleaved FIC data as an inverse process of the transmitting system, thereby outputting the RS-decoded data to the FIC handler 1121. The transmission unit of the FIC data being deinterleaved and RS-decoded by the signaling decoder 1118 and being outputted to the FIC handler 1121 corresponds to FIC segments.

At this point, the signaling information region within the data group may be known by using known data (or sequence) information outputted from the known sequence detector 1114. More specifically, a first known data sequence (or training sequence) is inserted in the last 2 segments of M/H block B3 within the data group. And, a second known data sequence is inserted between the second and third segments of M/H block B4. At this point, since the second known data sequence is inserted after the signaling information region and received, the signaling decoder 1118 extracts signaling information of the signaling information region from the data being outputted from the demodulator 1112 or the channel equalizer 1113, thereby decoding the extracted signaling information.

The power controller receives M/H frame-associated information from the signaling decoder 1118 so as to control the power of the baseband processor 1110. The power controller receives power control information from the baseband operation controller 1119, thereby being capable of controlling the power of the tuner and the demodulator.

According to an embodiment of the present invention, the power controller turns on the power of a slot having the data group of a parade including the mobile service wanted by the user assigned thereto, so as to receive data, and the power controller turns power off all of the other slots.

Demodulator and Known Sequence Detector

At this point, the transmitting system may receive a data frame (or VSB frame) including a data group which known data sequence (or training sequence) is periodically inserted therein, as shown in FIG. 5. Herein, the data group is divided into regions A to D, as shown in FIG. 5. More specifically, in the example of the present invention, each region A, B, C, and D are further divided into M/H blocks B4 to B7, M/H blocks B3 and B8, M/H blocks B2 and B9, M/H blocks B1 and B10, respectively.

Referring to FIG. 27 and FIG. 28, known data sequence having the same pattern are included in each known data section that is being periodically inserted. Herein, the length of the known data sequence having identical data patterns may be either equal to or different from the length of the entire (or total) known data sequence of the corresponding known data section (or block). If the two lengths are different from one another, the length of the entire known data sequence should be longer than the length of the known data sequence having identical data patterns. In this case, the same known data sequences are included in the entire known data sequence.

As described above, when the known data are periodically inserted in-between the mobile service data, the channel equalizer of the receiving system may use the known data as training sequences, which may be used as accurate discriminant values. According to another embodiment of the present invention, the channel equalizer estimates a channel impulse response. Herein, the known data may be used in the process. According to yet another embodiment of the present invention, the channel equalizer may use the known data for updating filter coefficients (i.e., equalization coefficients).

Meanwhile, when known data sequence having the same pattern is periodically inserted, each known data sequence may be used as a guard interval in a channel equalizer according to the present invention. Herein, the guard interval prevents interference that occurs between blocks due to a multiple path channel. This is because the known data sequence located behind a mobile service data section (i.e., data block) may be considered as being copied in front of the mobile service data section.

The above-described structure is referred to as a cyclic prefix. This structure provides circular convolution in a time domain between a data block transmitted from the transmitting system and a channel impulse response. Accordingly, this facilitates the channel equalizer of the receiving system to perform channel equalization in a frequency domain by using a fast fourier transform (FFT) and an inverse fast fourier transform (IFFT).

More specifically, when viewed in the frequency domain, the data block received by the receiving system is expressed as a multiplication of the data block and the channel impulse response. Therefore, when performing the channel equalization, by multiplying the inverse of the channel in the frequency domain, the channel equalization may be performed more easily.

The known sequence detector 1114 detects the position of the known data being periodically inserted and transmitted as described above. At the same time, the known sequence detector 1114 may also estimate initial frequency offset during the process of detecting known data. In this case, the demodulator 1112 may estimate with more accuracy carrier frequency offset from the information on the known data position information and initial frequency offset estimation value, thereby compensating the estimated carrier frequency offset.

Meanwhile, when known data is transmitted, as shown in FIG. 5, the known sequence detector 1114 detects a position of second known data region by using known data of the second known data region that the same pattern is repeated twice.

At this point, since the known sequence detector 1114 is well-informed of the data group structure, when the position of the second known data region is detected, the known sequence detector 1114 can estimate positions of the first, third, fourth, fifth, and sixth known data regions of a corresponding data group by counting symbols or segments based upon the second known data region position. If the corresponding data group is a data group including field synchronization segment, the known sequence detector 1114 can estimate the position of the field synchronization segment of the corresponding data group, which is positioned chronologically before the second known data region, by counting symbols or segments based upon the second known data region position.

Also, the known sequence detector 1114 may estimate the known data position information and the field synchronization position information from the parade including mobile service selected by a user based on the M/H frame-associated information outputted from the signaling decoder 1118. At least one of the estimated known data poison information and field synchronization information is provided to the demodulator 1112, the channel equalizer 1113, the signaling decoder 1118, and the baseband operation controller 1119.

Also, the known sequence detector 1114 may estimate initial frequency offset by using known data inserted in the second known data region (i.e., ACQ known data region). In this case, the demodulator 1112 may estimate with more accuracy carrier frequency offset from the information on the known data position information and initial frequency offset estimation value, thereby compensating the estimated carrier frequency offset.

The FIC handler 1121 receives FIC data from the signaling decoder 1118, so as to extract signaling information for service acquisition (i.e., mapping information between an ensemble and a mobile service). In order to do so, the FIC handler 1121 may include an FIC segment buffer, an FIC segment parser, and an FIC chunk parser.

The FIC segment buffer buffers FIC segment groups being inputted in M/H frame units from the signaling decoder 1118, thereby outputting the buffered FIC segment groups to the FIC segment parser. Thereafter, the FIC segment parser extracts the header of each FIC segment stored in the FIC segment buffer so as to analyze the extracted headers. Then, based upon the analyzed result, the FIC segment parser outputs the payload of the respective FIC segments to the FIC chunk parser. The FIC chunk parser uses the analyzed result outputted from the FIC segment parser so as to recover the FIC chunk data structure from the FIC segment payloads, thereby analyzing the received FIC chunk data structure. Subsequently, the FIC chunk parser extracts the signaling information for service acquisition. The signaling information acquired from the FIC chunk parser is outputted to the service manager 1122.

Meanwhile, the service signaling handler 1123 is configured of a service signaling buffer and a service signaling parser, and the service signaling handler 1123 buffers table sections of a service signaling channel being transmitted from the UDP datagram handler 1143, thereby analyzing and processing the buffered table sections. The signaling information processed by the service signaling handler 1123 is also outputted to the service manager 1122.

More specifically, the service signaling channel transmits at least one of an SMT, a GAT, an RRT, a CIT, and an SLT. At this point, according to an embodiment of the present invention, access information of the IP datagram transmitting the service signaling channel corresponds to a well-known destination IP address and a well-known destination UDP port number. Accordingly, each of the IP datagram handler 1141 and the UDP datagram handler 1143 is respectively given a well-known destination IP address and a well-known destination UDP port number, so as to extract an IP stream transmitting the service signaling channel, i.e., the service signaling data, thereby outputting the extracted data to the service signaling handler 1123. The service signaling handler 1123 recovers the SMT from the service signaling data and outputs the recovered SMT to the service manager 1122. Furthermore, the service signaling handler 1123 may further recover at least one of the GAT, the RRT, the CIT, and the SLT from the service signaling data and may output the further recovered table to the service manager 1122. According to the embodiment of the present invention, if an SNS message is provided through a mobile broadcasting network, the IP DEMUX (709) of FIG. 55 corresponds to the IP datagram handler (1141) and the UDP datagram handler (1143), and the SNS message parser (713) of FIG. 55 is included in the service signaling handler (1123). Additionally, according to the embodiment of the present invention, the signaling parser (710) is included in the signaling handler (1123). Reference may be made to FIG. 44 to FIG. 55 for the detailed description of the process of servicing SNS.

The service manager 1122 uses the signaling information collected (or gathered) from the FIC handler 1121 and the service signaling handler 1123 so as to configure a service map, and the service manager 1122 uses the service guide (SG) collected from the service guide (SG) handler 1165 so as to configure a program guide. Then, the service manager 1122 refers to the configured service map and program guide to control the baseband operation controller 1119 so that the user can receive the mobile service he (or she) wishes. Also, depending upon the user's input, the service manager 1122 may perform controlling operations enabling the program guide to be displayed on at least one portion of the display screen.

Additionally, the service manager (1122) detects enhancement service identification information from at least any one of an FIC chunk, an SMT, and an SLT. Reference may be made to FIG. 39 to FIG. 43 for detailed description of the enhancement service identification information. More specifically, after verifying the enhancement service identification information included in at least any one of an FIC chunk, an SMT, and an SLT, when the information indicates a normal service, an operation for processing a normal service including audio/video is performed. Meanwhile, when the information indicates an enhancement service, an operation for processing any one of a main profile service, an SVC service, a 3D service, and SNS is performed in accordance with the ES type field value.

The first storage unit 1124 stores the service map and service guide drawn up by the service manager 1122. Also, based upon the requests from the service manager 1122 and the EPG manager 1171, the first storage unit 1124 extracts the required data, which are then transferred to the service manager 1122 and/or the EPG manager 1171.

The baseband operation controller 1119 receives the known data place information and TPC data, thereby transferring M/H frame time information, information indicating whether or not a data group exists in a selected parade, place information of known data within a corresponding data group, power control information, and so on to each block within the baseband processor 1110.

Meanwhile, according to the present invention, the transmitting system uses RS frames by encoding units. Herein, the RS frame may be divided into a primary RS frame and a secondary RS frame. However, according to the embodiment of the present invention, the primary RS frame and the secondary RS frame will be divided based upon the level of importance of the corresponding data.

The primary RS frame decoder 1116 receives the data outputted from the block decoder 1115. At this point, according to the embodiment of the present invention, the primary RS frame decoder 1116 receives only the mobile service data that have been Reed-Solomon (RS)-encoded and/or cyclic redundancy check (CRC)-encoded from the block decoder 1115. Herein, the primary RS frame decoder 1116 receives only the mobile service data and not the main service data. The primary RS frame decoder 1116 performs inverse processes of the primary encoder (410) included in the digital broadcast transmitting system, thereby correcting errors existing within the primary RS frame. More specifically, the primary RS frame decoder 1116 forms a primary RS frame by grouping a plurality of data groups and, then, correct errors in primary RS frame units. In other words, the primary RS frame decoder 1116 decodes primary RS frames, which are being transmitted for actual broadcast services. A payload of the primary RS frame decoded by the primary RS frame decoder 1116 is derandomized and then is output to the primary RS frame buffer 1131. The primary RS frame buffer 1131 buffers the primary RS frame payload, and then configures an M/H TP in each row unit. The M/H TPs of the primary RS frame outputs to the TP handler 1133.

Additionally, the secondary RS frame decoder 1117 receives the data outputted from the block decoder 1115. At this point, according to the embodiment of the present invention, the secondary RS frame decoder 1117 receives only the mobile service data that have been RS-encoded and/or CRC-encoded from the block decoder 1115. Herein, the secondary RS frame decoder 1117 receives only the mobile service data and not the main service data. The secondary RS frame decoder 1117 performs inverse processes of the secondary encoder (420) included in the digital broadcast transmitting system, thereby correcting errors existing within the secondary RS frame. More specifically, the secondary RS frame decoder 1117 forms a secondary RS frame by grouping a plurality of data groups and, then, correct errors in secondary RS frame units. In other words, the secondary RS frame decoder 1117 decodes secondary RS frames, which are being transmitted for mobile audio service data, mobile video service data, guide data, and so on. A payload of the secondary RS frame decoded by the secondary RS frame decoder 1117 is derandomized and then is output to the secondary RS frame buffer 1132. The secondary RS frame buffer 1132 buffers the secondary RS frame payload, and then configures an M/H TP in each row unit. The M/H TPs of the secondary RS frame outputs to the TP handler 1133.

The TP handler 1133 consists of a TP buffer and a TP parser. The TP handler 1133 buffers the M/H TPs inputted from the primary RS frame buffer 1131 and the secondary RS frame buffer 1132, and then extracts and analyzes each header of the buffered M/H TPs, thereby recovering IP datagram from each payload of the corresponding M/H TPs. The recovered IP datagram is outputted to the IP datagram handler 1141.

The IP datagram handler 1141 consists of an IP datagram buffer and an IP datagram parser. The IP datagram handler 1141 buffers the IP datagram delivered from the TP handler 1133, and then extracts and analyzes a header of the buffered IP datagram, thereby recovering UDP datagram from a payload of the corresponding IP datagram. The recovered UDP datagram is outputted to the UDP datagram handler 1143.

If the UDP datagram is scrambled, the scrambled UDP datagram is descrambled by the descrambler 1142, and the descrambled UDP datagram is outputted to the UDP datagram handler 1143. For example, when the UDP datagram among the received IP datagram is scrambled, the descrambler 1142 descrambles the UDP datagram by inputting an encryption key and so on from the service protection stream handler 1146, and outputs the descrambled UDP datagram to the UDP datagram handler 1143.

The UDP datagram handler 1143 consists of an UDP datagram buffer and an UDP datagram parser. The UDP datagram handler 1143 buffers the UDP datagram delivered from the IP datagram handler 1141 or the descrambler 1142, and then extracts and analyzes a header of the buffered UDP datagram, thereby recovering data transmitted through a payload of the corresponding UDP datagram. If the recovered data is an RTP/RTCP datagram, the recovered data is outputted to the RTP/RTCP datagram handler 1144. If the recovered data is also an NTP datagram, the recovered data is outputted to the NTP datagram handler 1145. Furthermore, if the recovered data is a service protection stream, the recovered data is outputted to the service protection stream handler 1146. And, if the recovered data is an ALC/LCT stream, the recovered data is outputted to the ALC/LCT steam handler 1148.

The RTP/RTCP datagram handler 1144 consists of an RTP/RTCP datagram buffer and an RTP/RTCP datagram parser. The RTP/RTCP datagram handler 1144 buffers the data of RTP/RTCP structure outputted from the UDP datagram handler 1143, and then extracts A/V stream from the buffered data, thereby outputting the extracted A/V stream to the A/V decoder 1161. The A/V decoder 1161 decodes the audio and video streams outputted from the RTP/RTCP datagram handler 1144 using audio and video decoding algorithms, respectively. The decoded audio and video data is outputted to the presentation manager 1170. Herein, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm can be used as the audio decoding algorithm and at least one of an MPEG 2 video decoding algorithm, an MPEG 4 video decoding algorithm, an H.264 decoding algorithm, an SVC decoding algorithm, and a VC-1 decoding algorithm can be used as the audio decoding algorithm.

The NTP datagram handler 1145 consists of an NTP datagram buffer and an NTP datagram parser. The NTP datagram handler 1145 buffers data having an NTP structure, the data being outputted from the UDP datagram handler 1143. Then, the NTP datagram handler 1145 extracts an NTP stream from the buffered data. Thereafter, the extracted NTP stream is outputted to the A/V decoder 1161 so as to be decoded.

The service protection stream handler 1146 may further include a service protection stream buffer. Herein, the service protection stream handler 1146 buffers data designated (or required) for service protection, the data being outputted from the UDP datagram handler 1143. Subsequently, the service protection stream handler 1146 extracts information required for descrambling from the extracted data. The information required for descrambling includes a key value, such as SKIM and LKTM. The information for descrambling is stored in the second storage unit 1147, and, when required, the information for descrambling is outputted to the descrambler 1142.

The ALC/LCT stream handler 1148 consists of an ALC/LCT stream buffer and an ALC/LCT stream parser. And, the ALC/LCT stream handler 1148 buffers data having an ALC/LCT structure, the data being outputted from the UDP datagram handler 1143. Then, the ALC/LCT stream handler 1148 analyzes a header and a header expansion of an ALC/LCT session from the buffered data. Based upon the analysis result of the header and header expansion of the ALC/LCT session, when the data being transmitted to the ALC/LCT session correspond to an XML structure, the corresponding data are outputted to an XML parser 1150. Alternatively, when the data being transmitted to the ALC/LCT session correspond to a file structure, the corresponding data are outputted to a file decoder 1162.

At this point, when the data that are being transmitted to the ALC/LCT session are compressed, the compressed data are decompressed by a decompressor 1149, thereby being outputted to the XML parser 1150 or the file decoder 1162.

The XML parser 1150 analyses the XML data being transmitted through the ALC/LCT session. Then, when the analyzed data correspond to data designated to a file-based service, the XML parser 1150 outputs the corresponding data to the FDT handler 1151. On the other hand, if the analyzed data correspond to data designated to a service guide, the XML parser 1150 outputs the corresponding data to the SG handler 1165.

The FDT handler 1151 analyzes and processes a file description table of a FLUTE protocol, which is transmitted in an XML structure through the ALC/LCT session.

The SG handler 1165 collects and analyzes the data designated for a service guide, the data being transmitted in an XML structure, thereby outputting the analyzed data to the service manager 1122.

The file decoder 1162 decodes the data having a file structure and being transmitted through the ALC/LCT session, thereby outputting the decoded data to the middleware engine 1164 or storing the decoded data in a third storage unit 1163.

Herein, the middleware engine 1164 translates the file structure data (i.e., the application) and executes the translated application. Thereafter, the application may be outputted to an output device, such as a display screen or speakers, through the application presentation manager 1170. According to an embodiment of the present invention, the middleware engine 1164 corresponds to a JAVA-based middleware engine.

Based upon a user-input, the EPG manager 1171 receives EPG data either through the service manager 1122 or through the SG handler 1165, so as to convert the received EPG data to a display format, thereby outputting the converted data to the presentation manager 1170.

The application manager 1172 performs overall management associated with the processing of application data, which are being transmitted in object formats, file formats, and so on.

Furthermore, based upon a user-command inputted through the UI manager 1173, the controller 1100 controls at least one of the service manager 1122, the EPG manager 1171, the application manager 1172, and the presentation manager 1170, so as to enable the user-requested function to be executed.

The UI manager 1173 transfers the user-input to the controller 1100 through the UI.

Finally, the presentation manager 1170 provides at least one of the audio and video data being outputted from the A/V decoder 1161 and the EPG data being outputted from the EPG manager 1171 to the user through the speaker and/or display screen.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

MODE FOR INVENTION

As described above, the present invention is described with respect to the best mode for carrying out the present invention.

INDUSTRIAL APPLICABILITY

As described above, the present invention may be fully (or entirely) or partially applied to broadcast and communication fields an embodiment of a transmitting system, a receiving system and method of processing a broadcast signal according to the present invention.

What is claimed is:

1. A method of processing broadcast data in a receiving system, the method comprising:
    receiving a broadcast signal including broadcast service data, signaling data for a service, and service information for a service acquisition;
    demodulating the received broadcast signal;
    decoding the service information in the demodulated broadcast signal, wherein the service information includes a first service identifier for identifying the service, first indication information for indicating whether the service is hidden, and protection indication information for indicating whether one or more components needed for presentation of this service are protected; and
    decoding the broadcast service data and the signaling data in the demodulated broadcast signal and outputting data packets that include the decoded broadcast service data and the decoded signaling data,
    wherein each of the data packets has a packet header and a packet payload,
    wherein the packet header includes stuff indication information for indicating whether stuffing data are included in a corresponding data packet, and
    wherein the signaling data include a second service identifier for identifying the service, second indication information for indicating whether the service is active or inactive, a destination IP (Internet Protocol) address and a destination UDP (User Datagram Protocol) port number for at least one component of the service.

2. The method of claim 1, wherein the broadcast signal further includes known data and wherein the method further comprises equalizing the demodulated broadcast signal by performing channel estimation based on the known data.

3. The method of claim 1, further comprising:
    deinterleaving the service information in the demodulated broadcast signal and outputting the deinterleaved service information for the decoding.

4. A receiving system for processing broadcast data, the receiving system comprising:
    a tuner to receive a broadcast signal including broadcast service data, signaling data for a service, and service information for a service acquisition;
    a demodulator to demodulate the received broadcast signal;
    a first decoder to decode the service information in the demodulated broadcast signal, wherein the service information includes a first service identifier for identifying the service, first indication information for indicating whether the service is hidden, and protection indication information for indicating whether one or more components needed for presentation of this service are protected; and
    a second decoder to decode the broadcast service data and the signaling data in the demodulated broadcast signal and output data packets that include the decoded broadcast service data and the decoded signaling data,
    wherein each of the data packets has a packet header and a packet payload,
    wherein the packet header includes stuff indication information for indicating whether stuffing data are included in a corresponding data packet, and
    wherein the signaling data include a second service identifier for identifying the service, second indication information for indicating whether the service is active or inactive, a destination IP (Internet Protocol) address and a destination UDP (User Datagram Protocol) port number for at least one component of the service.

5. The receiving system of claim 4, wherein the broadcast signal further includes known data and wherein the receiving system further comprises an equalizer to equalize the demodulated broadcast signal by performing channel estimation based on the known data.

6. The receiving system of claim 4, wherein the first decoder further deinterleaves the service information in the demodulated broadcast signal and outputs the deinterleaved service information for the decoding.

* * * * *